United States Patent
Yap et al.

(10) Patent No.: US 10,910,793 B2
(45) Date of Patent: Feb. 2, 2021

(54) LOW MODULATION-VOLTAGE CRYOGENIC DIODE STRUCTURE

(71) Applicant: HRL Laboratories, LLC, Malibu, CA (US)

(72) Inventors: Daniel Yap, Newbury Park, CA (US); Rongming Chu, Agoura Hills, CA (US); Andrew Pan, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 16/659,526

(22) Filed: Oct. 21, 2019

(65) Prior Publication Data

US 2020/0203931 A1 Jun. 25, 2020

Related U.S. Application Data

(60) Provisional application No. 62/784,217, filed on Dec. 21, 2018.

(51) Int. Cl.
*H01S 5/30* (2006.01)
*H01S 5/187* (2006.01)
*H01S 5/34* (2006.01)

(52) U.S. Cl.
CPC .......... *H01S 5/309* (2013.01); *H01S 5/187* (2013.01); *H01S 5/34* (2013.01)

(58) Field of Classification Search
CPC . H01S 5/309; H01S 5/187; H01S 5/34; H01L 29/122; H01L 2251/5346
See application file for complete search history.

(56) References Cited

U.S. PATENT DOCUMENTS

| 7,868,335 | B1 | 1/2011 | Li |
| 2008/0078989 | A1 | 4/2008 | Croke |
| 2008/0315180 | A1* | 12/2008 | Kim ................... H01L 33/06 257/13 |
| 2011/0188525 | A1 | 8/2011 | Claudon |
| 2013/0156052 | A1 | 6/2013 | Diehl |

FOREIGN PATENT DOCUMENTS

KR 1020070018340 2/2007

OTHER PUBLICATIONS

Y. H. Wang, et al., "GaAs/AlGaAs multiple quantum well GRIN-SCH vertical cavity surface emitting laser diodes," IEEE Photonics Technology Letters, v.2, n. 7, p. 456-458, Jul. 1990.

(Continued)

*Primary Examiner* — Armando Rodriguez
(74) *Attorney, Agent, or Firm* — Ladas & Parry

(57) ABSTRACT

A laser or light emitter for operation at a cryogenic temperature includes a single quantum well layer, an n-type barrier layer directly on a first surface of the single quantum well layer, and a p-type barrier layer directly on a second surface of the single quantum well layer opposite the first surface of the single quantum well layer. The single quantum well layer is between the p-type barrier layer and the n-type barrier layer and the compositions of the n-type barrier layer and the p-type barrier layer are graded.

53 Claims, 60 Drawing Sheets

(56) References Cited

OTHER PUBLICATIONS

Y. A. Akulova, et al., "Low-temperature optimized vertical-cavity lasers with submilliamp threshold currents over the 77-370 K temperature range," IEEE Photonics Technology Letters, v.9, n. 3, p. 277-279, Mar. 1997.
D. L. Huffaker and D. G. Deppe, "Intracavity contacts for low-threshold oxide-confined vertical-cavity surface-emitting lasers," IEEE Photonics Technology Letters, v.11, n. 8, p. 934-936, Aug. 1999.
Z. Zou, D. L. Huffaker and D. G. Deppe, "Ultralow-threshold cryogenic vertical-cavity surface-emitting laser," IEEE Photonics Technology Letters, v.12, n. 1, p. 1-3, Jan. 2000.
B. Zhao, et al., "Sub-100 µA current operation of strained InGaAs quantum well lasers at low temperatures," Applied Physics Letters, v.65, pp. 1805-1807 (1994).
K. Yashiki, et al, "1.1-µm-range tunnel junction VCSELs with 27-GHz relaxation oscillation frequency," 2007 Optical Fiber Communications Conference, paper OMK.1, pp. 1-3.
W. Ch. Ng, Y. Liu and K. Hess, "Resonant-wavelength control and optical-confinement analysis for graded SCH VCSELs using a self-consistent effective-index method," Journal of Lightwave Technology, v.21, n. 2, p. 555-560, Feb. 2003.
B. Goncher, et al., "Cryogenic operation of AlGaAs—GaAs vertical-cavity surface-emitting lasers at temperatures from 200 K to 6 K," IEEE Photonics Technology Letters, v.8, n. 3, p. 316-318, Mar. 1996.
Y. A. Akulova, et al., "Intracavity-contacted vertical-cavity lasers with submilliamp threshold currents over 77-300 K temperature range," 1996 International Semiconductor Laser Conference, paper Th3.1. pp. 179-180.
K. Yang, et al., "Efficient double intracavity-contacted vertical-cavity surface-emitting lasers with very low threshold and low power dissipation designed for cryogenic applications," IEEE Photonics Technology Letters, v.12, n. 2, p. 113-115, Feb. 2000.
R. Yu, et al, "Ultrahigh speed performance of a quantum well laser at cryogenic temperatures," Applied Physics Letters, v.65, n. 5, pp. 528-530, Aug. 1, 1994.
T. G. Andersson, et al., "Variation of the critical layer thickness with in content in strained $IN_xGa_{1-x}As$—GaAs quantum wells grown by molecular beam epitaxy," Applied Physics Letters, v.51, n. 10, p. 752-754, Sep. 1987.
J. Nagle, et al., "Threshold current of single quantum well lasers: The role of the confining layers," Applied Physics Letters, v.49, n. 20, p. 1325-1327, Nov. 1986.
M. Romer, et al., "Electron-spin relaxation in bulk GaAs for doping densities close to the metal-to-insulator transition," Physical Review B, v.81, pp. 1-6 (2010).
L. Luo, et al, "Compact modeling of the temperature dependence of parasitic resistances in SiGe HBTs down to 30K," IEEE Transactions on Electron Devices, v.56, n. 10, pp. 2169-2177, Oct. 2009.
A. Akturk, et al., "Device modeling at cryogenic temperatures: effects of incomplete ionization," IEEE Transactions on Electron Devices, v.54, n. 11, pp. 2984-2990, Nov. 2007.
International Search Report and Written Opinion in the international application No. PCT/US2019/057290, dated Mar. 25, 2020.

\* cited by examiner

VCSEL Diode Structure

| | Material Composition | Doping, cm$^{-3}$ | Layer Thickness | |
|---|---|---|---|---|
| Lateral Conducting Layer | n$^+$-GaAs:Si | 1.00E+19 | 600Å | 26 |
| TJ | n$^+$-Ga$_{0.8}$In$_{0.2}$As:Si | 5.00E+19 | 150Å | 30 |
| TJ | p$^+$-GaAs:Be/C | 2.00E+20 | 100Å | 28 |
| Doped Spacer Layer | p$^-$-GaAs:Be/C | 1.00E+19 | 550Å | 42 |
| Graded Barrier Layer | p$^-$-Ga$_{1-x}$In$_x$As to GaAs (x= 0.05 to 0.00):Be/C | 5.00E+18 | 40Å | 40b |
| Graded Barrier Layer | p$^-$-Ga$_{1-x}$In$_x$As to GaAs (x= 0.10 to 0.05):Be/C | 2.00E+18 | 40Å | 40a |
| QW | undoped-Ga$_{0.7}$In$_{0.3}$As | 1.00E+16 | 50Å | 38 |
| Graded Barrier Layer | n-GaAs to Ga$_{1-x}$In$_x$As (x= 0.05 to 0.20):Si | 2.00E+18 | 70Å | 36a |
| Graded Barrier Layer | n-GaAs to Ga$_{1-x}$In$_x$As (x= 0.00 to 0.05):Si | 5.00E+18 | 30Å | 36b |
| Lateral Conducting Layer | n$^+$-GaAs:Si | 1.00E+19 | 1400Å | 34 |
| Quarter-wave DBR | GaAs / Al$_{0.9}$Ga$_{0.1}$As | 2.00E+17 | | 32 |

FIG. 11

P- side barrier graded

(h)

LOW MODULATION-VOLTAGE CRYOGENIC DIODE STRUCTURE

CROSS REFERENCE TO RELATED APPLICATIONS

This application is related to and claims the benefit of U.S. Provisional Patent Application No. 62/784,217, filed on Dec. 21, 2018, which is incorporated herein by reference as though set forth in full.

STATEMENT REGARDING FEDERAL FUNDING

None.

TECHNICAL FIELD

This disclosure relates to a laser or a light-emitter, and in particular to operation of a laser or a light-emitter at cryogenic temperatures.

BACKGROUND

Focal-plane array (FPA) photo detectors and imagers that are operated at cryogenic temperatures are in the prior art and have been used in sensing and imaging systems. As the density and number of elements of such FPAs increases, and also as the desired image-output rate increases, it is expected that there will be a need to provide optical outputs from the FPAs. For example, an array of cryogenic vertical cavity surface-emitting lasers (VCSELs) may address this task. Electronics that operate at cryogenic temperatures and even at liquid helium temperatures and below have also been developed in the prior art. These electronic circuits exchange information with other circuits that operate at much higher temperatures, such as at room temperature. However, the electrical cables typically used for transmitting such information are paths for unwanted heat leakage into the cryogenic environment.

FIG. 1 shows the cross-sectional material structure of a prior art VCSEL, which is described in Reference [1], below, which is incorporated herein by reference. This prior art device has a metal contact to the top surface of the structure, which is grown on a GaAs substrate. Another metal contact is made to the bottom side of the substrate, with a hole formed through that substrate-contact to enable laser light to be emitted through the substrate. This prior art laser structure has multiple GaAs quantum wells with each quantum well sandwiched between $Al_{0.3}Ga_{0.7}As$ barrier layers. The multiple quantum well and barrier structure (MQW) is then further embedded in a graded index (GRIN) separate confinement heterostructure (SCH) inner-cladding region. The composition of the $Al_xGa_{1-x}As$ material in the SCH region is graded in a non-linear pattern from x=0.25 near the quantum wells to x=0.5 away from the quantum wells, as illustrated in FIG. 1. For this prior art VCSEL, the thickness of each quantum well is 15 nm, the thickness of each barrier layer is 10 nm, the thickness of the SCH region on each side of the multiple quantum-well/barrier structure is 200 nm and the thickness of the $Al_{0.5}Ga_{0.5}As$ outer-cladding layers bounding the SCH region is 120 nm. The optical refractive index of the $Al_{0.5}Ga_{0.5}As$ and $Al_xGa_{1-x}As$ materials are lower than the refractive index of the quantum well and barrier materials. Thus, the $Al_{0.5}Ga_{0.5}As$ and the graded $Al_xGa_{1-x}As$ layers function as optical cladding regions. A distributed Bragg reflector (DBR) structure, doped N-type, is located between the SCH region and the GaAs substrate. Another DBR structure, doped P-type, is located above the SCH region. A metal contact is made to the top of this SCH region and also serves to enhance the reflection of light from the top portion of the laser. For this prior art VCSEL, the electrical current flows through both DBR structures. However, when such VCSELs are operated at cryogenic temperatures, the energy barriers at the heterojunction interfaces in the DBR structures become large compared to the thermal energy kT (with k being the Boltzmann's constant and T being the absolute temperature), and transport of the electrical carriers is impeded. Although those hetero-interfaces in the DBR structure can be graded in their material composition to make the interfaces less abrupt, higher voltages are still needed to produce a desired current flow through the VCSEL. For example, see FIG. 8A. For this prior art device, lateral confinement of the current flow is accomplished by ion implanting those regions that are laterally outside of the core region.

FIG. 2 shows the cross-sectional structure of another prior art VCSEL that avoids having the electrical current pass through the DBR regions. This prior art VCSEL makes its electrical contacts to a P-doped GaAs layer and an N-doped GaAs layer both of which are located between a first DBR region and a second DBR region, as described in Reference [2], below, which is incorporated herein by reference. Thus, the electrical contacts to this prior art VCSEL are made to layers located inside the optical cavity defined by the two DBR regions. Compared to the devices that pass the current through the DBR mirrors, the drive voltage at cryogenic temperatures can be lower for the devices with intra-cavity contacts. For example, see FIG. 8B. The device of FIG. 2 has a single $In_{0.2}Ga_{0.8}As$ strained quantum well (80 Å thick) sandwiched between GaAs barriers (each 100 Å thick) that are further sandwiched between $Al_{0.2}Ga_{0.8}As$ cladding layers. The P-side of the device also has an $Al_xGa_{1-x}As$ oxidation layer located between the cladding and the P-doped GaAs layer. The combination of the P-doped and the N-doped GaAs contact layers, the $Al_xGa_{1-x}As$ oxidation layer, the two $Al_{0.2}Ga_{0.8}As$ cladding layers, the two GaAs barrier layers and the $In_{0.2}Ga_{0.8}As$ quantum well are all located within the optical cavity defined by the two DBR mirrors. The threshold current at 77 degrees Kelvin (77K) for this prior art VCSEL is as low as 60 µA.

FIG. 3 shows the cross-sectional structure of a prior art VCSEL that achieved very low threshold current when operated at cryogenic temperature (77K) and also at room temperature, as described in References [3] and [4], below, which are incorporated herein by reference. The design of the DBR mirrors in the laser is adjusted to align the wavelength of the light emitted at the operating temperature with the reflectance peak of the DBR. This laser has a single strained quantum well using $In_{0.2}Ga_{0.8}As$ material that is sandwiched between a pair of GaAs barriers that are further located within a graded-index, separate-confinement-heterostructure (GRIN-SCH) inner-cladding region comprising a pair of regions having graded composition. For this device, the linear composition grade of the GRIN-SCH region on the N-side of the quantum well goes from GaAs to $Al_{0.9}Ga_{0.1}As$. The N-side then has an $Al_{0.9}Ga_{0.1}As$ outer-cladding layer followed by an abrupt step in composition to an N-doped GaAs layer to which one of the electrical contacts is made. The linear composition grade of the GRIN-SCH region on the P-side of the quantum well goes from GaAs to $Al_{0.6}Ga_{0.4}As$. The P-side then has an $Al_{0.6}Ga_{0.4}As$ outer cladding layer followed by an abrupt step in composition to a P-doped AlAs oxidation layer, another abrupt step in composition to a P-doped $Al_{0.2}Ga_{0.8}As$ layer and then another abrupt step in composition to a P-doped GaAs layer to which the other electrical contact is made. The P-doped $Al_{0.2}Ga_{0.8}As$ layer, which has a quarter-wavelength thickness, and the P-doped GaAs layer, which also has a quarter-wavelength thickness, form the first two layers of the DBR on the P-side of the device.

Prior art edge-emitting lasers, like the prior art VCSELs, have lower threshold currents at cryogenic temperatures than at room temperature. For example, FIG. 4 shows the threshold current of several prior art single-quantum-well (SQW) edge-emitting lasers measured at different operating temperatures. These lasers have a core region comprising an n-doped $Al_{0.5}Ga_{0.5}As$ lower outer-cladding layer, a 200 nm thick undoped graded $Al_xGa_{1-x}As$ (x=0.5-0.2) lower SCH inner-cladding layer, a 4 nm thick undoped GaAs barrier layer, a 8 nm thick undoped $In_{0.3}Ga_{0.7}As$ quantum well, another 4 nm thick undoped GaAs barrier layer, a 200 nm thick graded undoped $Al_xGa_{1-x}As$ (x=0.2-0.5) upper SCH inner-cladding layer and a p-doped $Al_{0.5}Ga_{0.5}As$ upper outer-cladding layer, as described in Reference [5], below, which is incorporated herein by reference. The three lasers whose characteristics are shown in FIG. 4 differ in the values of the high-reflectivity coating applied to their end-faces. The edge-emitting lasers with higher reflectivity end-faces have lower threshold current whose value continues to be lower and lower as the temperature is reduced.

FIG. 5 shows the cross-sectional structure of a prior art VCSEL that has a second N-type intra-cavity electrical contact instead of a P-type electrical contact, as described in Reference [6], below, which is incorporated herein by reference. The active layer of this laser has three $In_{0.3}Ga_{0.7}As$ quantum wells between GaAs barriers located at a PN junction. This laser has an $N^+P^+$ tunnel junction and a P-doped spacer located on the P-side of the multiple quantum wells. An N-type GaAs conductor is located between the tunnel junction and the top DBR mirror of this device. The tunnel junction, which is located in the core region of the device, also provides lateral in-plane confinement of the electrical current flow from the N-type electrode at the P-side of the device and laterally outside the core region toward the quantum wells in the core region. Additional current confinement is provided by ion implantation of the area outside the core region to make that implanted area non-conductive. The prior art VCSEL of FIG. 5 is operational at room temperature.

The prior art lasers generally operate at high drive currents which is not desirable, because of the impact of heating on the cryogenic environment. The prior art VCSELs have degraded performance at low cryogenic temperatures in terms of the input voltage swing that is needed to accomplish a desired swing in the input current and thus the optical output power at a high modulation frequency. At low cryogenic temperatures, transport of carriers from the contacts to the quantum wells, where they recombine to produce the emitted light, becomes a critical issue. Transport of carriers through the DBR regions of the prior art VCSELs has been addressed; however, transport of carriers through the SCH regions and through the barrier layers of a VCSEL or other laser at cryogenic temperatures has not been addressed in the prior art.

A VCSEL structure that has a SCH region located in a single-wavelength cavity spacer between the two DBR mirrors of the VCSEL has been analyzed previously, as described in Reference [7], below, which is incorporated herein by reference. FIG. 6A illustrates the basic cross section of such a prior art laser structure, which along its lateral (in-plane) axis has a core region located at its center that is surrounded on both lateral sides by "lateral cladding" regions. The device analyzed has an oxidation-defined core and vertical-cladding regions, similar to the devices described above relative to FIGS. 2 and 3. FIG. 6B plots the optical-field profile along the longitudinal axis (i.e., along the direction of the vertical laser cavity) in the SCH region of this prior art device. The peak of the optical field coincides with the location of the quantum wells, which are at the center of the SCH region. The plotted results show that the optical field at the quantum well is strongest, and thus the optical confinement is best, for Model A which has an SCH region with an ungraded composition, the same material composition extending from the edge of the quantum well to the outer edge of the SCH region. Model B, which has a linear grade in the material composition from the edge of the quantum well to the outer edge of the SCH region, has the weakest optical field at the quantum well and is the least desirable.

FIG. 7 shows the optical confinement that would be obtained for other variations of the SCH region and the barrier layers immediately adjacent to the single quantum well. These results show that the optical confinement is greater when the width of the ungraded barrier on both sides of the quantum well is larger (i.e., when $\alpha \ll 1$). Also, the optical confinement is better when the SCH region has a non-linear exponential grading profile (model C) than when the SCH region has a linear grading profile (model D). Also, for a linear grade of the barrier composition, the optical confinement would be better when that grade is shallower ($\ll 1$) rather than steeper.

REFERENCES

The following references are incorporated herein by reference as though set forth in full.

[1] Y. H. Wang, et al., "GaAs/AlGaAs multiple quantum well GRIN-SCH vertical cavity surface emitting laser diodes," IEEE Photonics Technology Letters, v. 2, n. 7, p. 456-458, July 1990.

[2] Y. A. Akulova, et al., "Low-temperature optimized vertical-cavity lasers with submilliamp threshold currents over the 77-370 K temperature range," IEEE Photonics Technology Letters, v. 9, n. 3, p. 277-279, March 1997.

[3] D. L. Huffaker and D. G. Deppe, "Intracavity contacts for low-threshold oxide-confined vertical-cavity surface-emitting lasers," IEEE Photonics Technology Letters, v. 11, n. 8, p. 934-936, August 1999.

[4] Z. Zou, D. L. Huffaker and D. G. Deppe, "Ultralow-threshold cryogenic vertical-cavity surface-emitting laser," IEEE Photonics Technology Letters, v. 12, n. 1, p. 1-3, January 2000.

[5] B. Zhao, et al., "Sub-100 µA current operation of strained InGaAs quantum well lasers at low temperatures," Applied Physics Letters, v. 65, p. 1805 (1994).

[6] K. Yashiki, et al, "1.1-µm-range tunnel junction VCSELs with 27-GHz relaxation oscillation frequency," 2007 Optical Fiber Communications Conference, paper OMK.1.

[7] W. Ch. Ng, Y. Liu and K. Hess, "Resonant-wavelength control and optical-confinement analysis for graded SCH VCSELs using a self-consistent effective-index method," Journal of Lightwave Technology, v. 21, n. 2, p. 555-560, February 2003.

[8] B. Goncher, et al., "Cryogenic operation of AlGaAs—GaAs vertical-cavity surface-emitting lasers at temperatures from 200 K to 6 K," IEEE Photonics Technology Letters, v. 8, n. 3, p. 316-318, March 1996.
[9] Y. A. Akulova, et al., "Intracavity-contacted vertical-cavity lasers with submilliamp threshold currents over 77-300 K temperature range," 1996 International Semiconductor Laser Conference, paper Th3.1.
[10] K. Yang, et al., "Efficient double intracavity-contacted vertical-cavity surface-emitting lasers with very low threshold and low power dissipation designed for cryogenic applications," IEEE Photonics Technology Letters, v. 12, n. 2, p. 113-115, February 2000.
[11] R. Yu, et al, "Ultrahigh speed performance of a quantum well laser at cryogenic temperatures," Applied Physics Letters, v. 65, n. 5, pp. 528-530, 1 Aug. 1994.
[12] T. G. Andersson, et al., "Variation of the critical layer thickness with In content in strained $In_xGa_{1-x}As$—GaAs quantum wells grown by molecular beam epitaxy," Applied Physics Letters, v. 51, n. 10, p. 752-754, September 1987.
[13] J. Nagle, et al., "Threshold current of single quantum well lasers: The role of the confining layers," Applied Physics Letters, v. 49, n. 20, p. 1325-1327, November 1986.
[14] M. Romer, et al., "Electron-spin relaxation in bulk GaAs for doping densities close to the metal-to-insulator transition," Physical Review B, v. 81, p. 075216 (2010).
[15] L. Luo, et al, "Compact modeling of the temperature dependence of parasitic resistances in SiGe HBTs down to 30K," IEEE Transactions on Electron Devices, v. 56, n. 10, pp. 2169-2177, October 2009.
[16] A. Akturk, et al., "Device modeling at cryogenic temperatures: effects of incomplete ionization," IEEE Transactions on Electron Devices, v. 54, n. 11, pp. 2984-2990, November 2007.

What is needed is a cryogenic diode structure that enables lasers operated at low cryogenic temperatures (e.g. 30K) to have greater conversion efficiency from modulated-electrical input power to modulated-optical output power, and that enables reducing both the input modulation-current swing and the input modulation-voltage swing needed to achieve a given output optical-intensity swing at a high modulation frequency. The embodiments of the present disclosure answer these and other needs.

SUMMARY

In a first embodiment disclosed herein, a laser or light emitter comprises a single quantum well layer, an n-type barrier layer directly on a first surface of the single quantum well layer, and a p-type barrier layer directly on a second surface of the single quantum well layer opposite the first surface of the single quantum well layer, wherein the single quantum well layer is between the p-type barrier layer and the n-type barrier layer, and wherein the n-type barrier layer has a graded composition.

In another embodiment disclosed herein, a method of providing a laser or light emitter comprises providing a single quantum well layer, providing an n-type barrier layer directly on a first surface of the single quantum well layer, and providing a p-type barrier layer directly on a second surface of the single quantum well layer opposite the first surface of the single quantum well layer, wherein the single quantum well layer is between the p-type barrier layer and the n-type barrier layer, and wherein the n-type barrier layer has a graded composition.

In yet another embodiment disclosed herein, a method of providing a laser or light emitter comprises providing a substrate, forming a distributed Bragg reflecting mirror on the substrate, forming an n-type lateral-current conducting layer on the distributed Bragg reflecting mirror, forming an n-type graded composition barrier layer on the n-type GaAs lateral-current conducting layer, forming a single quantum well layer on the n-type graded composition barrier layer, and forming a p-type barrier layer on the single quantum well layer.

In still yet another embodiment disclosed herein, a laser or light emitter comprises a single quantum well layer, an n-type barrier layer directly on a first surface of the single quantum well layer, and a p-type barrier layer directly on a second surface of the single quantum well layer opposite the first surface of the single quantum well layer, wherein the single quantum well layer is between the p-type barrier layer and the n-type barrier layer, wherein the p-type barrier layer has a graded composition, and wherein the p-type barrier layer has a first surface directly abutting the second surface of the single quantum well layer.

These and other features and advantages will become further apparent from the detailed description and accompanying FIGs. that follow. In the FIGs. and description, numerals indicate the various features, like numerals referring to like features throughout both the drawings and the description.

BRIEF DESCRIPTION OF THE DRAWINGS

FIG. 8A VCSEL with current conduction through its DBR mirrors, FIG. 8B VCSEL with intra-cavity electrical contacts, and FIG. 8C VCSEL with intra-cavity contacts and a GRIN-SCH configuration.

FIG. 11 shows an example of the detailed material structure in a portion of the core region of a VCSEL in accordance with the present disclosure.

DETAILED DESCRIPTION

Figure 1:
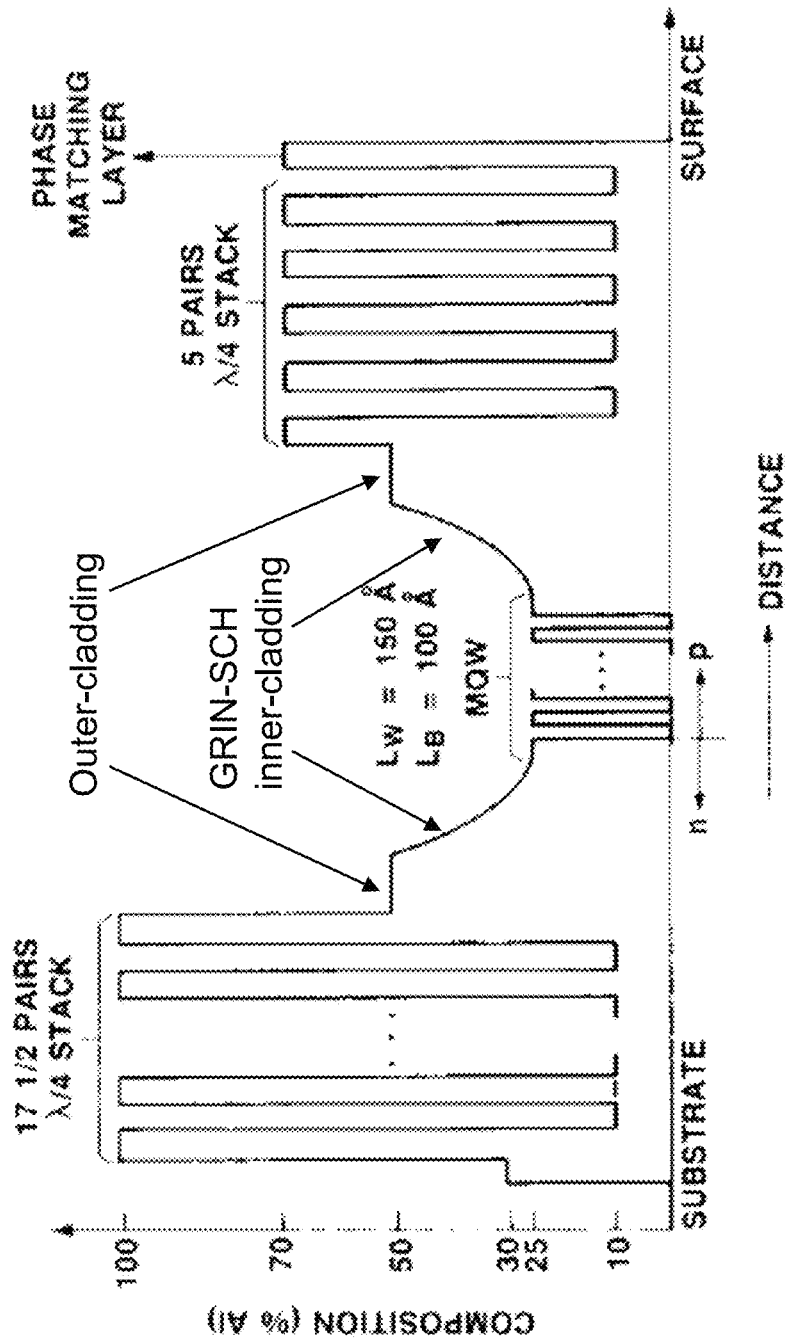
FIG. 1 shows the material structure of a prior art VCSEL that has multiple quantum-well light emitters located in a GRIN-SCH configuration with non-linear composition grade.
Figure 2:
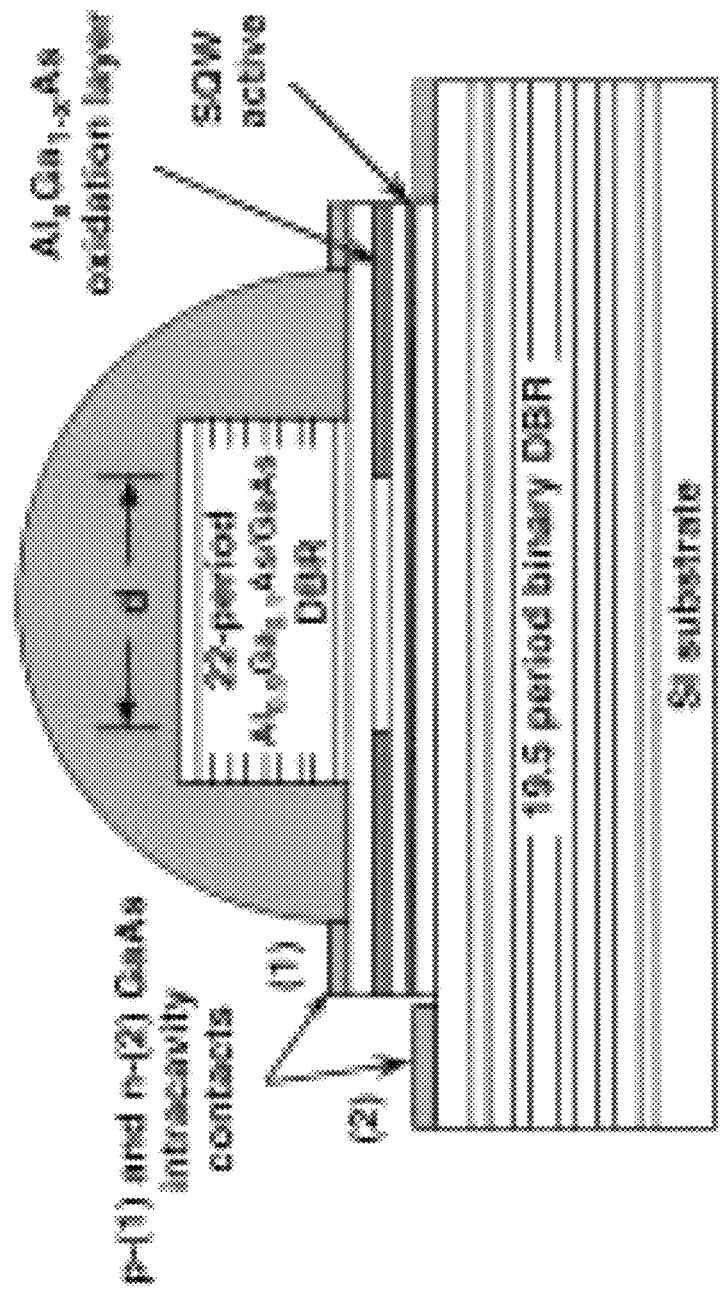
FIG. 2 shows a prior art VCSEL that has electrical contacts located within the optical cavity defined by its DBR mirrors.
Figure 3:
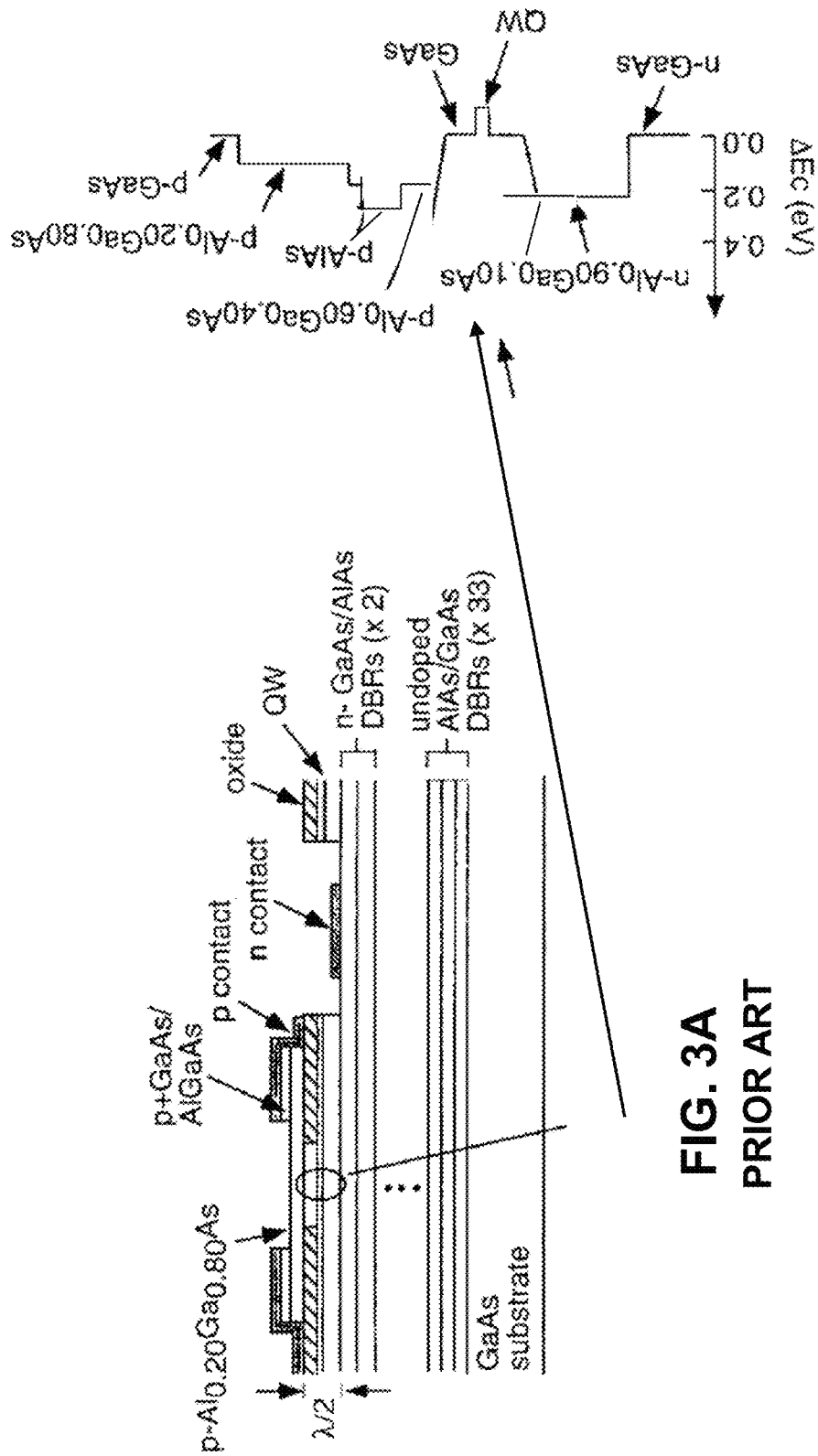
FIG. 3A shows a prior art VCSEL structure with a set of intra-cavity electrical contacts.
FIG. 3B shows the corresponding energy bands.
Figure 4:
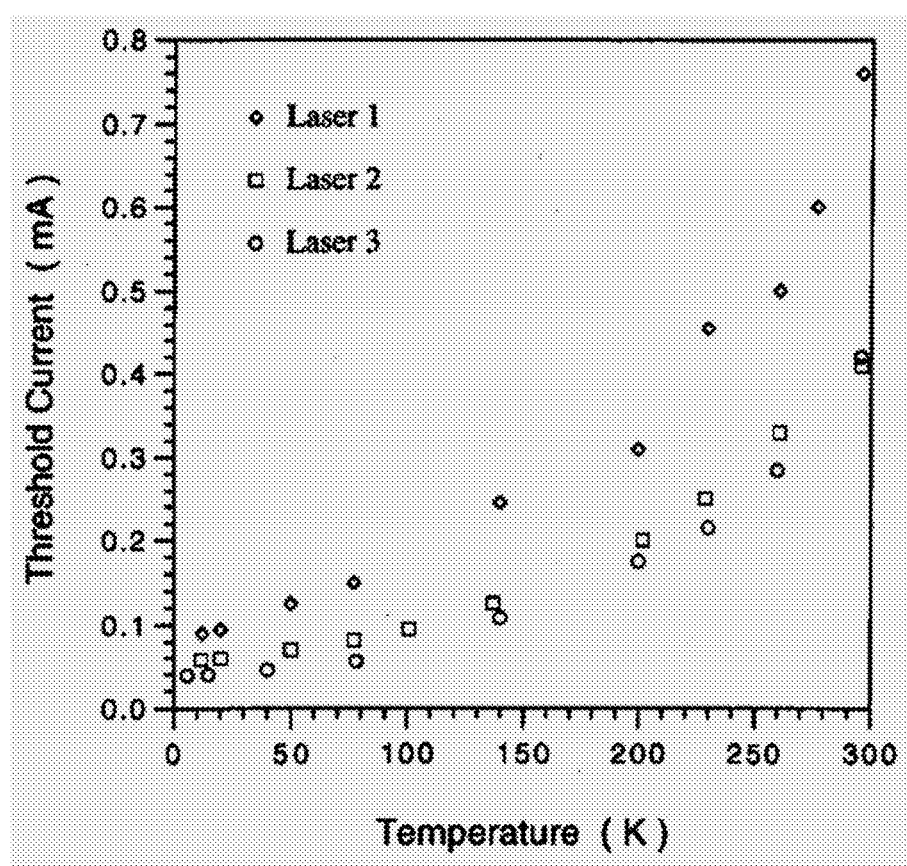
FIG. 4 shows the temperature dependence of the threshold current for a prior art single quantum well edge-emitting laser.
Figure 5:
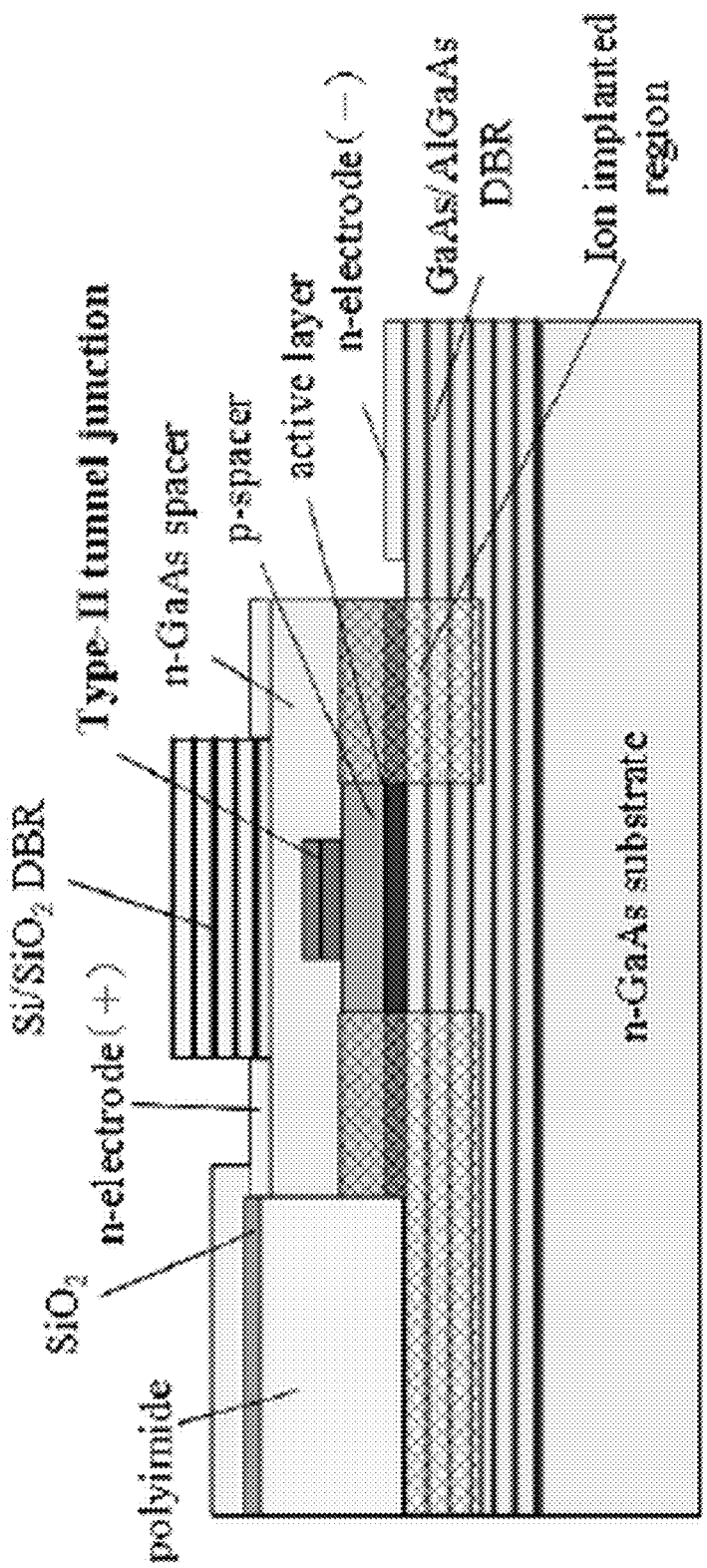
FIG. 5 shows a prior art VCSEL that has two N-type electrical contacts and a NP tunnel junction in addition to the PN junction of its quantum-well active region.
Figure 6A:
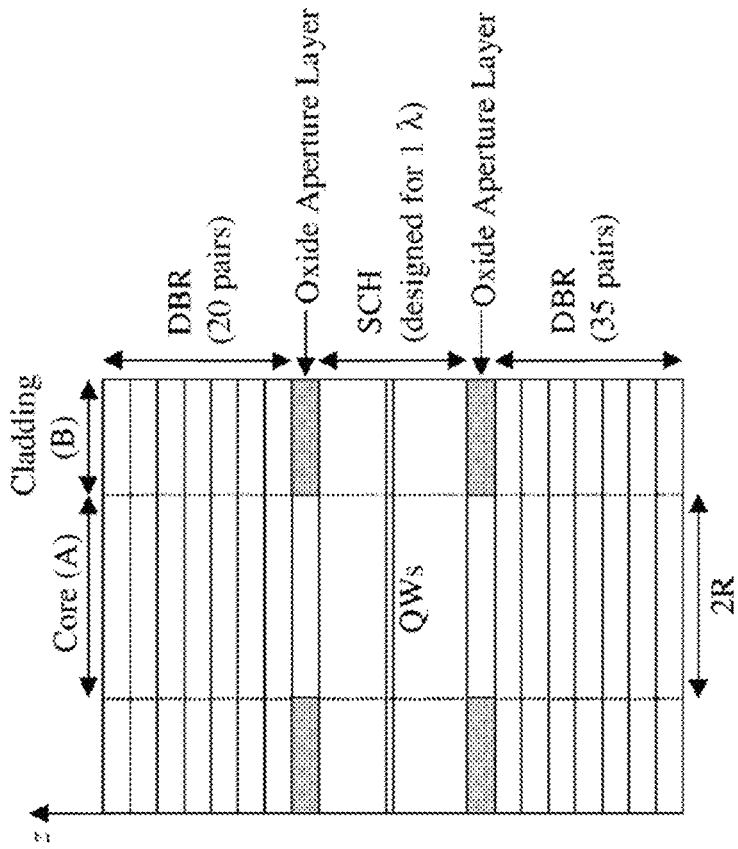
FIG. 6A shows a prior art a VCSEL structure that has the quantum well located within a separate-confinement-heterostructure (SCH) region and FIG. 6B shows a plot of optical field intensity distribution in the SCH region.
Figure 6B:
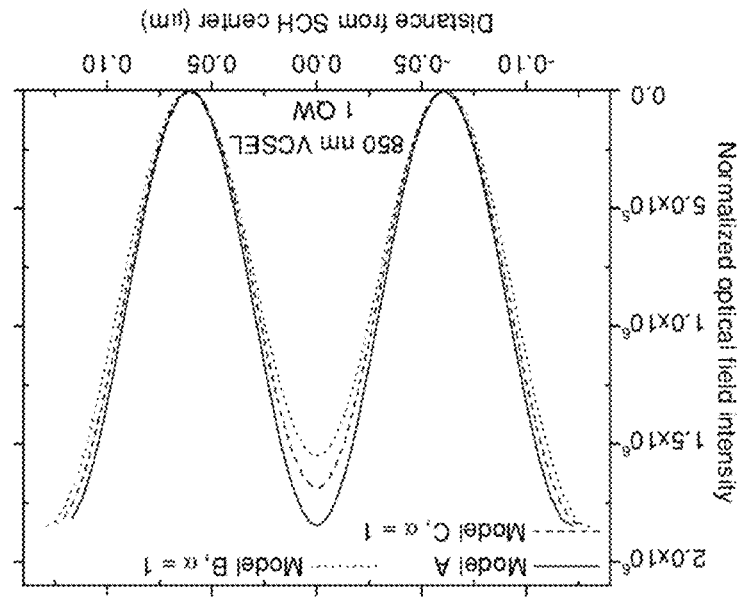
Figures 7A, 7B, 7C:
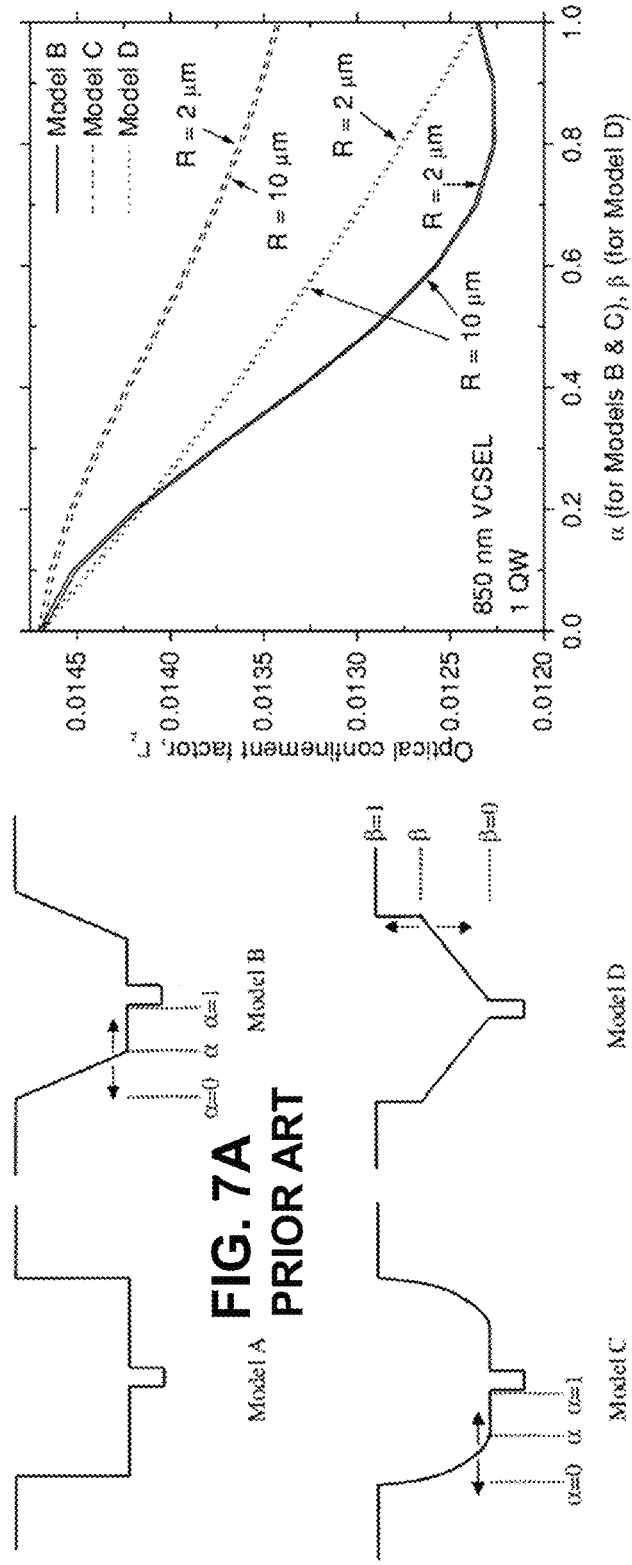
FIGS. 7A, 7B and 7C show the dependence of the optical confinement obtained for various profiles of the SCH region and widths of the quantum-well barrier for the VCSEL structure of FIG. 6A.

In the following description, numerous specific details are set forth to clearly describe various specific embodiments disclosed herein. One skilled in the art, however, will understand that the presently claimed invention may be practiced without all of the specific details discussed below. In other instances, well known features have not been described so as to not obscure the invention.

The present disclosure describes a diode structure for a laser or light-emitter. The diode enables modulation of generated output light with small voltage swings that may be less than 0.5V, and preferably smaller than 0.1V when the diode is operated: 1) at cryogenic temperatures of 77K and lower; 2) at temperatures below 30K; and 3) at liquid helium cooled temperatures of about or at 4K. This diode structure can be incorporated into a vertical cavity surface-emitting laser (VCSEL), an edge-emitting waveguide laser, a ring-cavity laser or a disk-cavity laser, or into a light-emitting diode (LED).

In the following paragraph the reference numbers are to the diode structure reference numbers in FIGS. 10B and 11; however, the description is generally also applicable to the diode structure shown in FIG. 20B, and the corresponding reference numbers in FIG. 20B. The corresponding reference numbers in FIG. 20B are further described later, but for clarity here, only the reference numbers for the diode structure of FIG. 10B are referenced. An example of a corresponding reference number is quantum well 138 in FIG. 20B, which corresponds to quantum well 38 in FIG. 10B.

In the diode structure of the present disclosure, the electrical carriers, which are electrons and holes, are preferably conducted from metal contacts of the laser or LED through paths that avoid requiring the carriers to traverse energy barriers. These paths also preferably provide electric fields to enhance the current flow through carrier-depleted regions that are present in the path between the contacts and a quantum well in which the electron and hole carriers recombine to generate the emitted light.

The diode structure preferably has a single strained quantum well 38 sandwiched between two electronic-energy barrier layers 36, 40 that provide quantum confinement for the electrons and holes in the quantum well. One of the barrier layers 40 can be doped P-type, and the other barrier layer 36 can be doped N-type. The P-type barrier layer serves to inject holes into the quantum well, and the N-type barrier layer serves to inject electrons into the quantum well.

The diode structure of the present disclosure has barrier layers 36, 40 sandwiching the quantum well 38 that are graded and that are relatively thin, for example ≤30 nm thick. The composition of the grading profiles of the present disclosure are designed to maximize the flow of carriers into the quantum well at very low operating temperatures of 30 degrees Kelvin or lower.

The barrier layers 36, 40 also preferably have a high doping level, sufficiently high to ensure at least 10% and preferably close-to-complete ionization of the dopants at the operating temperature. Instead of grading and heavily doping the barrier layers, which are located immediately adjacent to the quantum well, prior art VCSELs and edge-emitting lasers typically have barrier layers of spatially uniform composition and typically have a low doping concentration. The composition grades in the prior art, if present, occur in separate-confinement heterostructure (SCH) inner cladding regions of those lasers, which are located beyond the barrier layers and farther away from the quantum well. Unlike the thin graded barrier layers of the presently disclosed diode structure, prior art VCSELs and edge-emitting and ring-cavity lasers have a typical thickness of ≥150 nm for each of their two graded SCH portions on each of the two sides of the quantum well.

For low-voltage operation at the cryogenic temperatures, a VCSEL with a diode structure of the present technology preferably has intra-cavity electrical contacts that are located laterally outside a core region of the VCSEL. There are at least two contacts and those contacts could be located above, below or at the side of the core region. For example, one contact could be located above the core region and a second contact could be located at the side of the core region. A longitudinal-cavity laser (e.g., edge emitting, ring cavity or disk cavity) with a diode structure of the present disclosure may have one or more of its electrical contacts located vertically above and/or below the core region of the laser and could have none, one, or more of its electrical contacts located laterally outside the core region of the laser.

Electrical carriers are conducted from the electrical contacts to the core region through lateral-current transporting layers made from a material that has high carrier mobility, such as GaAs or InP. In a preferred embodiment, the lateral-current transporting layers are the lateral-current conducting layers. The electrical contacts may be located on different sides of the quantum well.

For enhanced conduction of electrons to the quantum well 38, the conduction band edge of the graded material comprising the electron-conducting N-type barrier layer 36 should be lower in energy than the conduction band edge of the material comprising the lateral-current transporting layer 34. For enhanced conduction of holes to the quantum well, the valence band edge of the graded material comprising the hole-conducting P-type barrier layer 40 preferably is closer in energy to that of the quantum well material than the valence band edge of the material comprising the lateral-current transporting layer 26 for the holes, if one is used for transporting the holes. In some embodiments, the lateral-current transporting layer 26 is doped p-type and transports holes. However, in other embodiments, the lateral-current transporting layer 26 is doped n-type and transports electrons.

In a preferred embodiment for VCSELs, adjacent the P-type barrier layer 40 is a tunnel junction 28, 30 formed from a heavily P-doped material (such as GaAs or InGaAs or GaAsSb) and a heavily N-doped material (such as GaAs or InGaAs or InNGaAs). The P-doped material 28 of the tunnel junction is located closer to the quantum well 38 than the N-doped material 30 of the tunnel junction. Since the diode structure has a tunnel junction 28, 30, electrical contacts and each lateral-current transporting layer 26, 34 for conducting the electrical current from the electrical contacts to the core region can include N-doped material, with electrons being the majority electrical carrier, which reduces the electrical resistance of the device because the mobility of electrons is significantly higher than the mobility of holes. For embodiments with a tunnel junction 28, 30, the valence band edge of the material of the P-type hole-conducting barrier layer 40 should have an energy closer to that of the quantum well 38 material than the valence band edge of the P-doped material 28 of the tunnel junction. If an optional P-doped spacer 42 is located between the tunnel junction 28, 30 and the P-type barrier layer 40 then the material of the P-type hole-conducting barrier layer 40 should have an energy closer to that of the quantum well 38 than the valance band edge of the P-doped spacer 42.

The barrier layers 36, 40 can be doped to a concentration between $10^{16}$ cm$^{-3}$ and $10^{19}$ cm$^{-3}$ (inclusive) and preferably doped to a concentration between $2 \times 10^{18}$ cm$^{-3}$ and $5 \times 10^{18}$ cm$^{-3}$ (inclusive). The phrase "heavily doped material" can mean that the material is doped such that the material is electrically conductive at a particular operating temperature. The phraseology "heavily doped" is defined in the context of temperature. As is known, a semiconductor doped to such high levels that it acts more like a conductor than a semiconductor is a very highly doped semiconductor.

A VCSEL of the present disclosure preferably has a first lateral-current conducting layer 26 located between a first set of distributed Bragg reflecting (DBR) mirrors 48 and the tunnel junction 28, 30. A first electrical contact 20, and possibly a second electrical contact 24 (present in edge-emitting lasers and LEDs), which may be ohmic contacts, contact the first lateral-current conducting layer 26. The VCSEL has a second lateral-current conducting layer 34 located between a second set of DBR mirrors 32 and the quantum well 38. A third 18 electrical contact, and possibly a fourth 22 electrical contact (present in edge-emitting lasers and LEDs), which may be ohmic contacts, contact the second lateral-current conducting layer 34. The first set of electrical contacts 20, 24 may be located closer to the core region 12 than the second set of electrical contacts 18, 22. Further, whether the first "set" is a single contact or a set of two contacts and likewise whether the second "set" is a single contact or a set of two contacts depends on whether the device has a circular geometry with single "ring" shaped contacts or has a linear geometry with contacts located on each of two sides of the core region.

The DBR mirrors 32 and 48 in a VCSEL of the present disclosure may be similar or identical to those found in the prior art. As shown in FIG. 10B the DBRs 32 and 48 may have GaAs layers 70 and AlGaAs layers 72. For the device structure shown in FIG. 20B the DBRs 132 and 148 may have GaAsSb layers 170 and AlAsSb layers 172.

In an exemplary embodiment, the two sets of DBR mirrors 32, 48 for the VCSEL are spaced apart by one-half an "effective" wavelength of the emitted light in the material. The description "effective wavelength" of the light propagating in a material is equal to the wavelength of that light in free-space or in vacuum divided by the optical refractive index of that material. For light emitted in the range of 850-1000 nm wavelength in free space, this one-half wavelength spacing would be approximately 130-170 nm. The quantum well 38 in FIG. 10B, or 138 in FIG. 20B, is preferably located at about the center of the "optical cavity" defined by the two sets of DBR mirrors. The tunnel junction 28, 30, may be placed adjacent or immediately adjacent to the relatively thin (e.g., 20 nm thickness) graded P-side barrier layer 40. This arrangement minimizes or reduces the optical-cavity length while still maintaining sufficient thickness of material layers. The choice of this thickness depends on the electrical mobility and carrier concentration (electrical conductivity) of the material comprising the lateral-current conducting layers 26, 34 in the lateral-current conducting region or regions 16. The two N-type lateral-current conducting layers 26 and 34 of this exemplary embodiment are preferably directly on either side of the quantum well 38 and are preferably located within the one-half wavelength spaced optical cavity in order to obtain low series resistance (e.g. generally less than 100 Ohms and preferably less than 10 Ohms). Thus, for the half-wavelength cavity spaced embodiment, the first lateral-current conducting layer 26 has a thickness of less than one-quarter wavelength and the second lateral-current conducting layer 34 has a thickness of approximately one-quarter wavelength.

In another exemplary embodiment, the two sets of DBR mirrors 32 and 48 for the VCSEL are spaced apart by one effective wavelength of the emitted light in the material. For light emitted in the range of 850-1000 nm wavelength in free space, this effective one-wavelength spacing would be approximately 260-340 nm. The combined thickness of the composition-graded P-side barrier layer 40 together with a P-doped spacer layer 42 may be sufficiently large (e.g., 60-80 nm thickness) to place the tunnel junction 28, 30 at or near an intensity minimum or node in the optical standing-wave pattern defined by the one-wavelength optical cavity. This is with the quantum well 38 located approximately at the center of that one-wavelength spaced optical cavity. Placing the tunnel junction 28, 30 at or near a minimum in the optical intensity pattern reduces the optical absorption loss due to the heavily doped tunnel junction. The quantum well 38 may be located approximately one quarter-wavelength apart from the tunnel junction. For this single-wavelength, cavity-spaced embodiment, the first lateral-current conducting layer 26 has a thickness of approximately one-quarter wavelength and the second lateral-current conducting layer 34 has a thickness of approximately one-half wavelength.

In yet another exemplary embodiment, the two sets of DBR mirrors 32 and 48 for the VCSEL are also spaced apart by one effective wavelength of the emitted light in the material. The quantum well 38 is preferably located at about the center of the "optical cavity" defined by the two sets of DBR mirrors. The tunnel junction 28, 30 is placed immediately adjacent to the relatively thin (e.g., ≤20 nm thickness) graded P-side barrier layer 40. For light emitted in the range of 850-1000 nm wavelength in free space, each one-half-wavelength spacing from the quantum well 38 to one of the sets of DBR mirrors would be approximately 130-170 nm. This embodiment has higher optical absorption from the tunnel junction but avoids the free-carrier absorption from having a P-doped spacer 42. For this single-wavelength cavity spaced embodiment, the first lateral-current conducting layer 26 has a thickness less than one-half wavelength and the second lateral-current conducting layer 34 has a thickness of approximately one-half wavelength.

In another exemplary embodiment, the two sets of DBR mirrors 32 and 48 for the VCSEL are spaced apart by one and one-half effective wavelengths of the emitted light in the material. For light emitted in the range of 850-1000 nm wavelength in free space or a vacuum, each one-half wavelength spacing would be approximately 130-170 nm. The composition-graded P-side barrier layer 40 in combination with a P-doped spacer layer 42 are sufficiently thick (e.g., 60-80 nm thickness) to place the tunnel junction 28, 30 at a node or intensity minimum in the optical standing-wave pattern defined by the one-and-one-half wavelength optical cavity. The quantum well 38 is located at an anti-node or intensity maximum of that standing-wave pattern, approximately one quarter-wavelength apart from the tunnel junction 28, 30 and also near the center of the one-and-one-half wavelength optical cavity. For this one and one-half wavelength cavity spaced embodiment, the first lateral-current conducting layer 26 has a thickness of approximately one-half wavelength and the second lateral-current conducting layer 34 has a thickness of approximately three-quarter wavelength.

An embodiment of a lateral-cavity laser of the present technology could have the quantum well 38 and the two doped and composition-graded barrier layers 36, 40 located within a separate confinement heterostructure (SCH) inner-cladding region. The SCH inner-cladding region would preferably enclose or at least partially surround the quantum well and the two doped and composition-graded barrier layers. In some embodiments, the tunnel junction 28, 30 also could be located within the SCH inner-cladding region. A desired feature is that the conduction-band energy of the N-type graded barrier layer 36 and of the quantum well 38 is below the conduction band energy of the adjacent SCH inner-cladding region. Also, the valence-band energy of the P-type graded barrier layer 40 and of the quantum well 38 is closer to mid-gap than the valence-band energy of the P-side 28 of the tunnel junction, if the structure has a tunnel junction, or is closer to mid-gap than the valence-band energy of the adjacent SCH inner-cladding region, if the structure does not have a tunnel junction. For operation at cryogenic temperatures, the SCH region also may be heavily doped so as to avoid a "freeze out" of the dopants. The SCH region is preferably doped such that the dopants are activated or ionized at the cryogenic temperature at which the device is being operated.

The presently disclosed diode structure enables lasers operated at low cryogenic temperatures (e.g. 30 degrees Kelvin) to have greater conversion efficiency from modulated-electrical input power to modulated-optical output power. This reduces both the input modulation-current swing and the input modulation-voltage swing needed to achieve a given output optical-intensity swing at a high modulation frequency, such as greater than 1 GHz. Prior art lasers, such as prior art VCSELs, have achieved lower threshold current for the onset of lasing and also lower bias current for high-speed modulation when operated at a higher cryogenic temperature such as 77 degrees Kelvin than when they are operated at room temperature (e.g., 300 degrees Kelvin). However, the voltage swing required to modulate those prior art VCSELs is significantly higher when they are operated at a cryogenic temperature than when they are operated at room temperature. The high voltage swing at cryogenic temperatures for prior art VCSELs is at least in part due to the poor electrical-carrier conduction through the carrier-depleted regions of those prior art devices. This happens at temperatures close to 0 degrees Kelvin because the current due to carrier diffusion at such a low temperature is very low. Since the VCSEL has a PN diode junction, the presence of a carrier-depleted region in the vicinity of that PN junction is inevitable. In contrast, the presently disclosed diode structures have barrier layers 36, 40 with heavy doping and a graded composition immediately adjacent to the quantum well 38. The composition grades in the barrier layers 36, 40 on each side of the quantum well produce electric-fields on each side that assist the conduction of the electrical carriers (holes and electrons) via a drift current to the quantum well 38 from the heavily doped lateral-current conducting layers 26, 34 and tunnel-junction spacer 42, in which those majority carriers are conducted by displacement currents.

The tunnel junction 28, 30 in the presently disclosed diode structure reduces the series resistance of the device, for example when the topside lateral-current conducting layer 26 is thinner and the contacts 20, 24 are located laterally outside of the core region 12. The tunnel junction 28, 30 thereby reduces the voltage swing that accompanies the current swing that produces the modulation in the output light from the laser. The various embodiments of the present disclosure balance the desire to minimize the optical absorption due to the heavily doped layers of the tunnel junction and contact areas with the desire to ensure low electrical-resistance for the lateral (in-plane) and vertical (cross-plane) conduction of carriers from the contacts to the core region 12 of the laser, and also lower-resistance vertical (cross-plane) conduction of holes from the tunnel junction 28, 30 to the quantum well 38. In these embodiments, the tunnel junction is preferably doped to a concentration between $5 \times 10^{18}$ cm$^{-3}$ and $5 \times 10^{20}$ cm$^{-3}$ (inclusive).

Figure 8C:
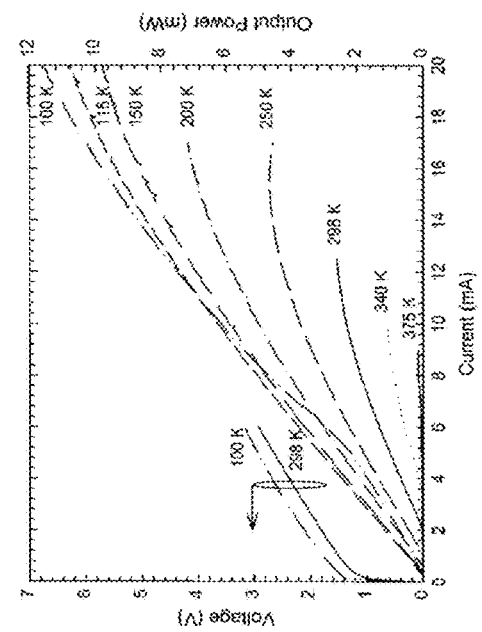
FIGS. 8A, 8B and 8C show electrical diode current-voltage characteristics of prior art VCSELs measured at different operating temperatures.
Figure 8B:
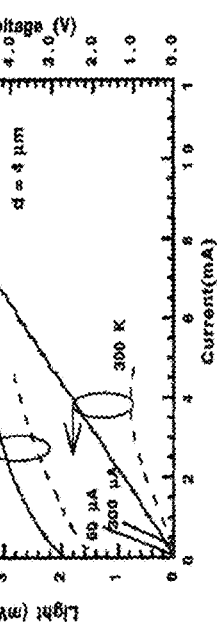
Figure 8A:
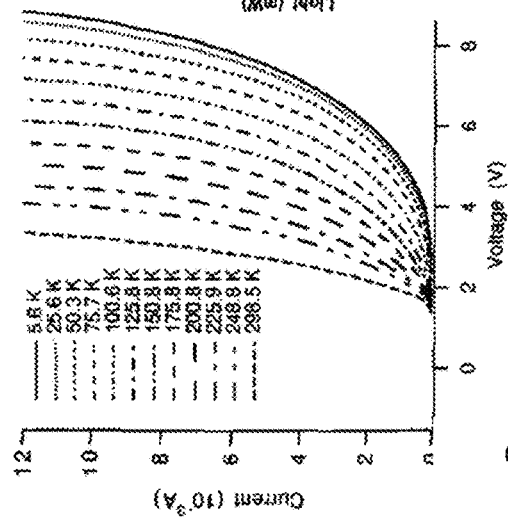

For all known prior VCSELs, the forward-biased turn-on voltage of those devices increases significantly as the operating temperature is reduced, for example see FIG. 8A. Part of that increase in turn-on voltage, the voltage above which the forward current becomes appreciable, is attributed to the need to conduct electrical current through the DBR mirrors of those VCSELs. These DBR structures have many interfaces between materials having very different bandgaps and large differences between their conduction band-edge energies as well as their valence band-edge energies, as described in Reference [8], which is incorporated herein by reference. Although some prior art VCSELS have intra-cavity electrical contacts, such that electrical conduction through their DBR mirrors is not needed, the turn-on voltages of those intra-cavity contacted devices still are higher at lower operating temperatures. For example see FIG. 8B, as described in Reference [9], which is incorporated herein by reference. At operating temperatures of 10K and below, the value for kT (the product of the Boltzmann constant and the absolute temperature) is so small compared to the electrical bandgap of the materials in the VCSEL and compared to the ionization energies of the dopants that diffusion of carrier is essentially absent in the prior art devices. Thus, larger and larger applied voltages are needed to produce electrical current flow through the essentially carrier-depleted regions of the device when the operating temperature is reduced.

Many prior art waveguide lasers as well as some prior art VCSELs have their light-emitting quantum wells located in a GRIN-SCH configuration. The GRIN-SCH typically places the quantum wells and their barrier layers between a pair of wide optical-confinement regions whose material composition is graded so that they establish a graded optical refractive-index profile. The SCH, both a configuration in which the material composition is not graded and configurations in which the material composition is graded (i.e., a GRIN-SCH), is used in lasers to improve the optical confinement of the light and thus to have higher optical intensity in the vicinity of the quantum wells, thereby improving the laser efficiency. To accomplish the improved optical confinement, the SCH region on each side of the quantum wells typically has a width >100 nm. The GRIN-SCH configuration also can result in a reduced turn-on voltage, for example see FIG. 8C compared with FIG. 8B. Nevertheless, even with a GRIN-SCH, the diode turn-on voltage of the prior art VCSELs is higher at lower temperatures, as described in Reference [10], which is incorporated herein by reference.

To achieve power-efficient modulation of the light emitted by a laser, it is preferable to minimize the change in voltage that accompanies a given change in the current conducted through the laser, preferably near the diode turn-on regime. VCSELs and other lasers operated at cryogenic temperatures (e.g., 77K and below) and at temperatures below 10K can have very low threshold currents. For example, the lasing-threshold current for one prior art VCSEL at 77K temperature is 60 µA, as described in Reference [9]. The lasing threshold of another prior VCSEL, which has an improved optical-cavity structure, is only 12 µA (25 A/cm$^2$ threshold current density) at 77K temperature. [4] The reduction in threshold current density that is achieved as the temperature is reduced results from the improved differential gain of the strained quantum-well laser and from the reduced transparency current at the lower temperatures. This improvement in transparency current is expected to continue as the operating temperature is further reduced to temperatures below 10K.

Figure 9:
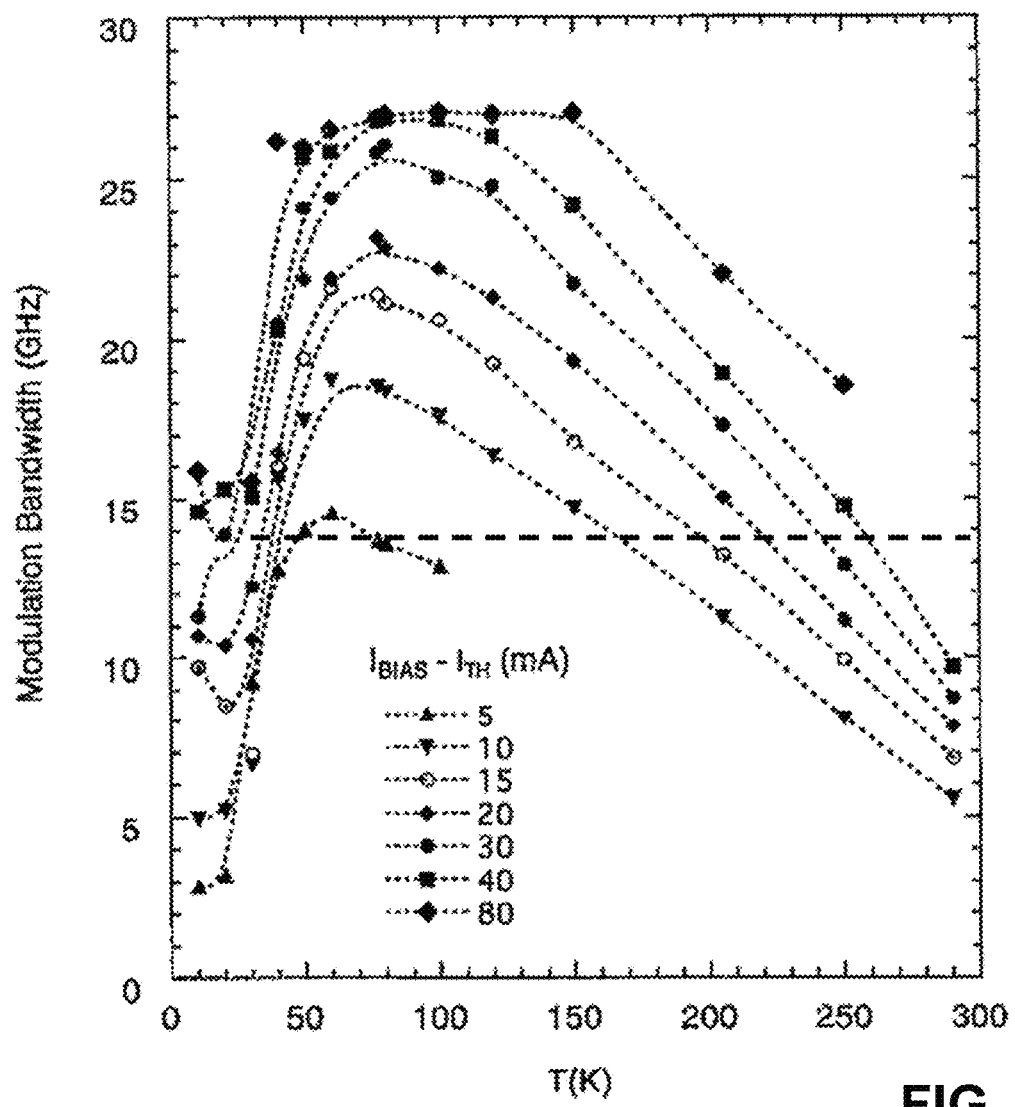
FIG. 9 shows the effect of operating temperature on the bias current needed to achieve a given modulation bandwidth.

The average current for a laser whose output light is modulated (typically with On/Off modulation) is substantially higher than the threshold current in order to ensure that the average density of the photons in the laser cavity is high enough to support the desired frequency of that output modulation. In fact, for a given average bias current, the resonance frequency of a laser's modulation response is proportional to the square root of the differential gain, which improves as the operating temperature is lowered. This improvement in differential gain allows the bias current of the laser to be reduced, so that the laser can be operated closer to its threshold current, while still achieving the desired modulation-frequency bandwidth, as described in Reference [11], which is incorporated herein by reference. The results shown in FIG. 9 indicate a modulation bandwidth of 14 GHz is obtained with a bias current that is 40 mA above threshold when the temperature is 260K, 10 mA above threshold when the temperature is 170K and only 5 mA above threshold when the temperature is 77K. Although these results were obtained for an edge-emitting laser, similar reduction in the bias current needed to achieve a given modulation bandwidth also would be obtained for VCSELs operated at low temperatures.

To take advantage of the power savings enabled by the reduced threshold current and the reduced modulation-current swing achieved by operating a quantum-well laser at cryogenic temperatures, there is a need to also reduce the accompanying modulation-voltage swing. The prior art VCSEL configurations actually have degraded (i.e., larger) modulation voltage swing as the operating temperature is reduced, as described above. The disclosed diode structures address this need and achieve small modulation-voltage swings at cryogenic temperatures and, preferably, at temperatures below 10K.

Prior analyses have pointed to the difficulty of carrier transport through (or over) hetero-barriers at low temperatures, for which kT is small compared to the barrier energy, as being a reason for the larger modulation-voltage swings needed at low temperatures. Analyses the inventors have done suggest that another reason for the poor transport of carriers to the quantum well of a laser diode at cryogenic temperatures is the smaller diffusion coefficient of both the holes and the electrons. The carrier mobility at moderate to low doping levels (e.g. generally below $10^{18}$ cm$^{-3}$)

decreases as the temperature is reduced from 100K to lower temperatures. Also, the diffusion coefficient is proportional to kT times the mobility. Thus, at a temperature of 30K, the diffusion coefficient is an order of magnitude lower than its value at room temperature. And at 4K, the diffusion coefficient is almost yet another order of magnitude lower.

The disclosed diode structure overcomes this diffusion-limited carrier transport by producing an electric field on both sides of the quantum well that facilities drift of the holes and electrons from those heavily doped regions (i.e. the lateral-current conducting layers and the spacer layer), in which they are majority carriers, through the carrier-depleted regions and into the quantum well. These electric fields are formed by grading the composition of the barrier layers 36, 40 that are on the two sides of the quantum well. Also, the width and doping of the barrier layers are designed to facilitate tunneling of carriers into the quantum well 38. To avoid the hetero-junction barrier that would be present between two adjacent quantum wells, the disclosed structure preferably has a single quantum well in its active region. In fact, other than the tunneling barrier at the $N^+P^+$ 30, 28 tunnel junction, the core region of the disclosed structure does not have any energy barriers due to hetero-junctions. Instead, it has energetically favorable composition grades that facilitate drift of the carriers toward the quantum well.

Figure 10A:
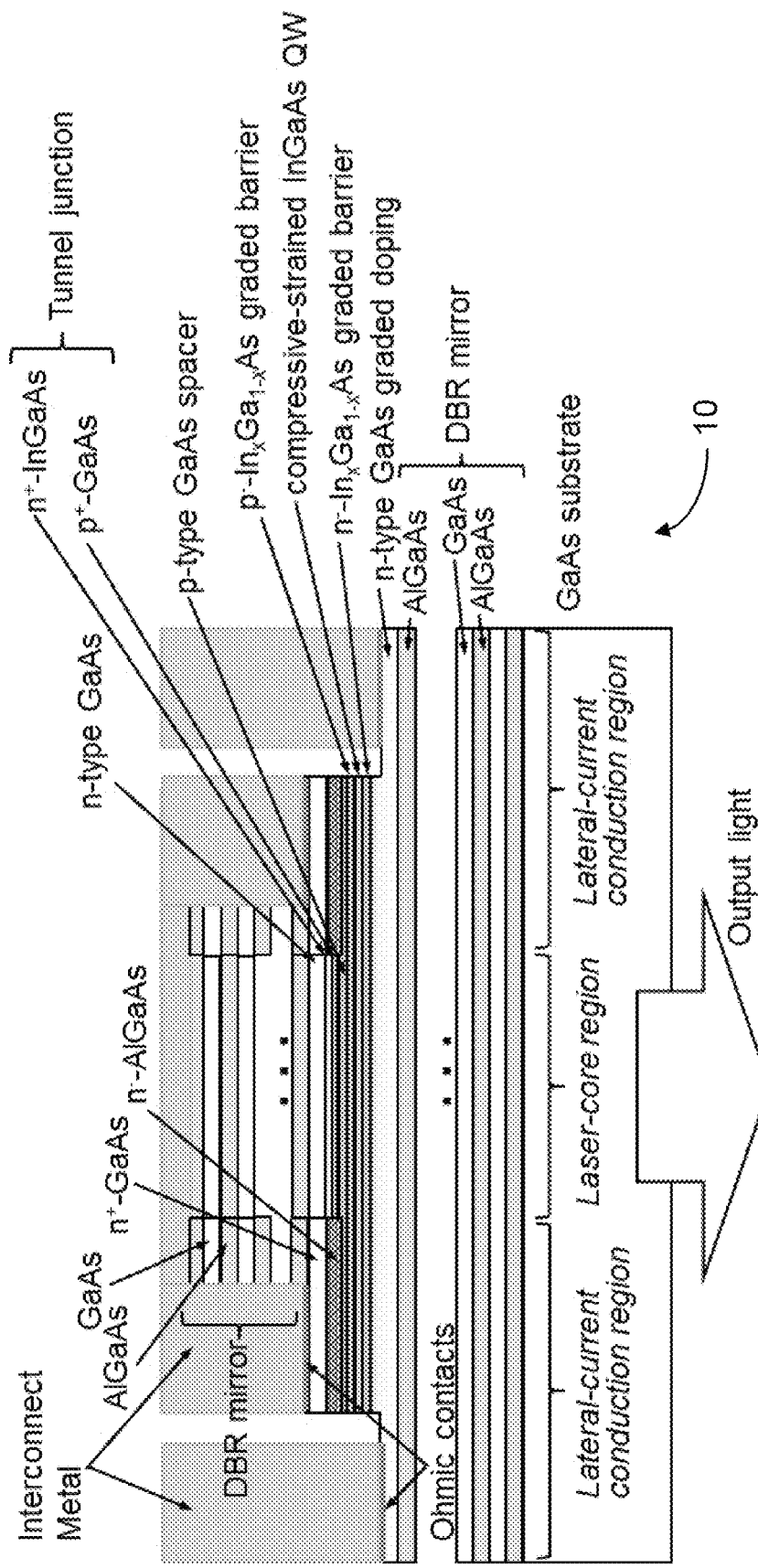
FIG. 10A shows a cross-section of a VCSEL structure that has composition-graded InGaAs barriers sandwiching a single InGaAs quantum well, grown on GaAs with the features labeled
Figure 10B:
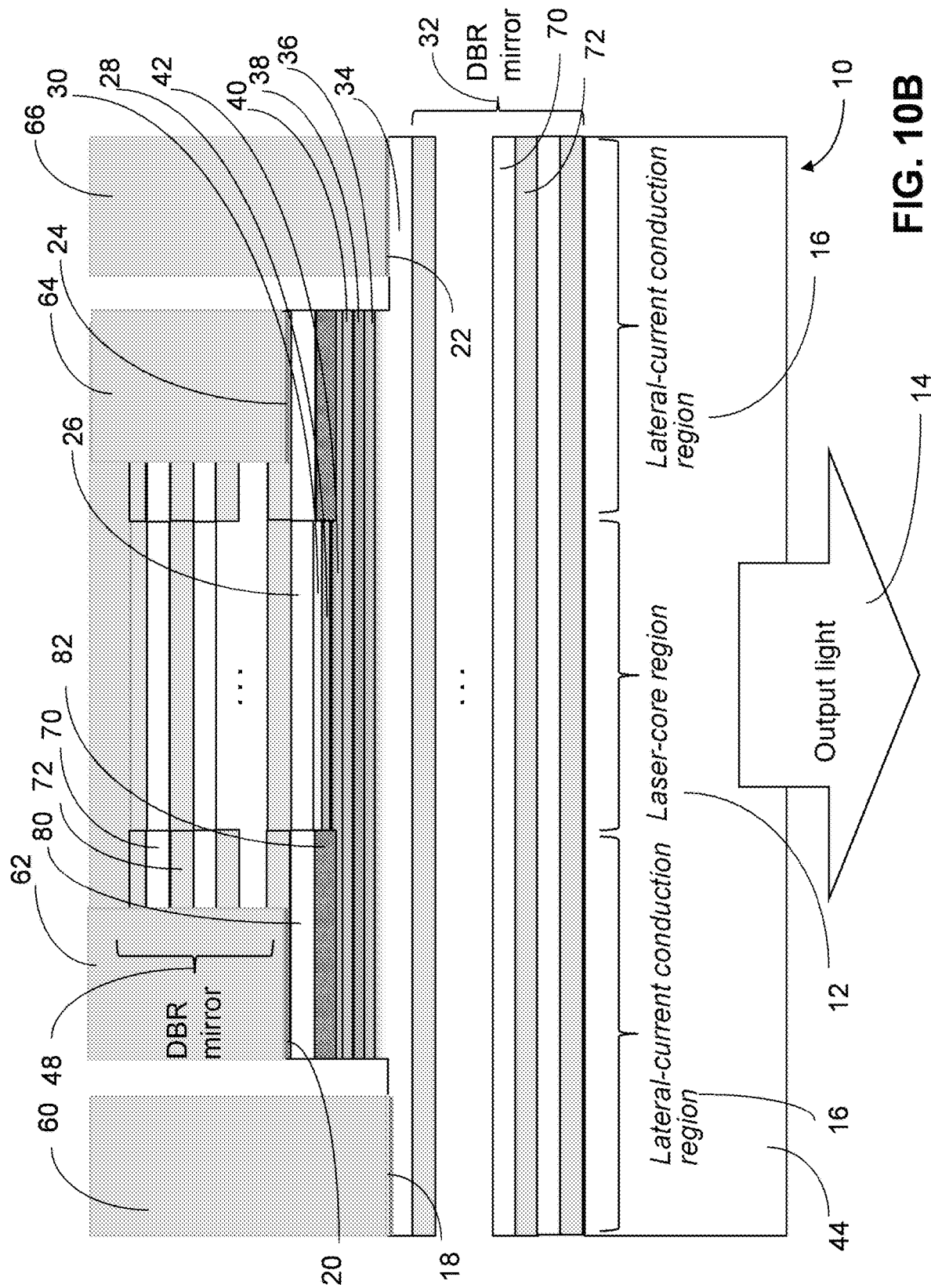
FIG. 10B is the same as FIG. 10A with further reference numbers in accordance with the present disclosure.
Figure 12A:
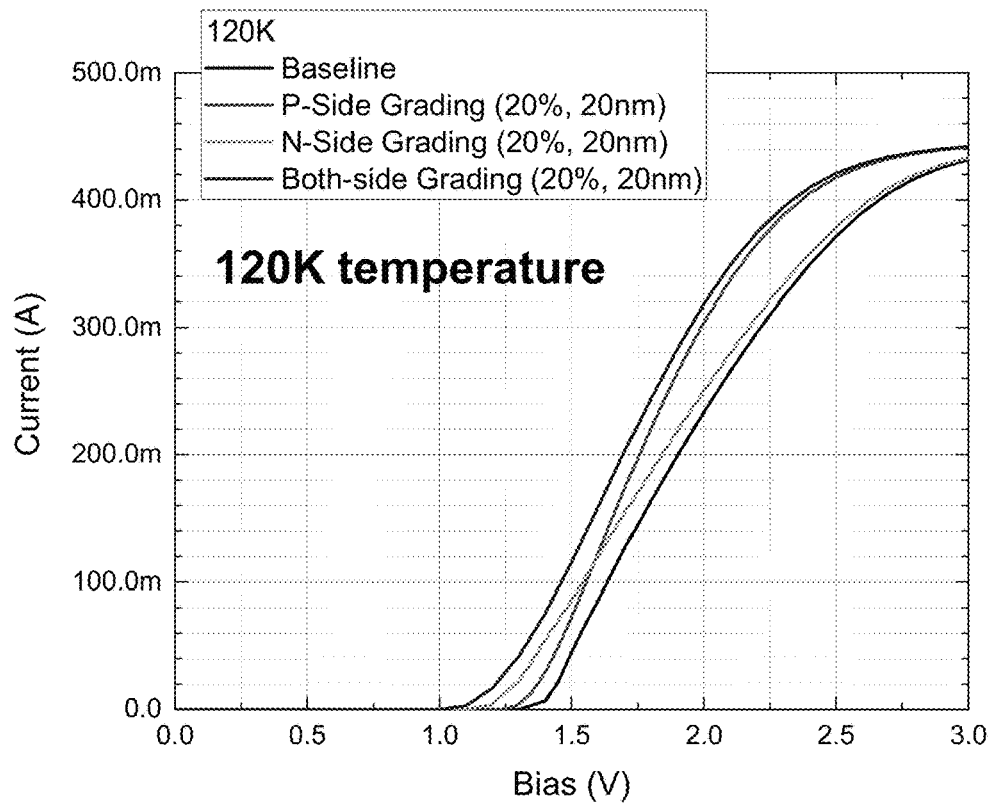
FIGS. 12A, 12B, 12C, and 12D show calculated current vs voltage characteristics of the basic PN diode in the core region of the laser, obtained for 2 different operating temperatures in accordance with the present disclosure.
Figure 12B:
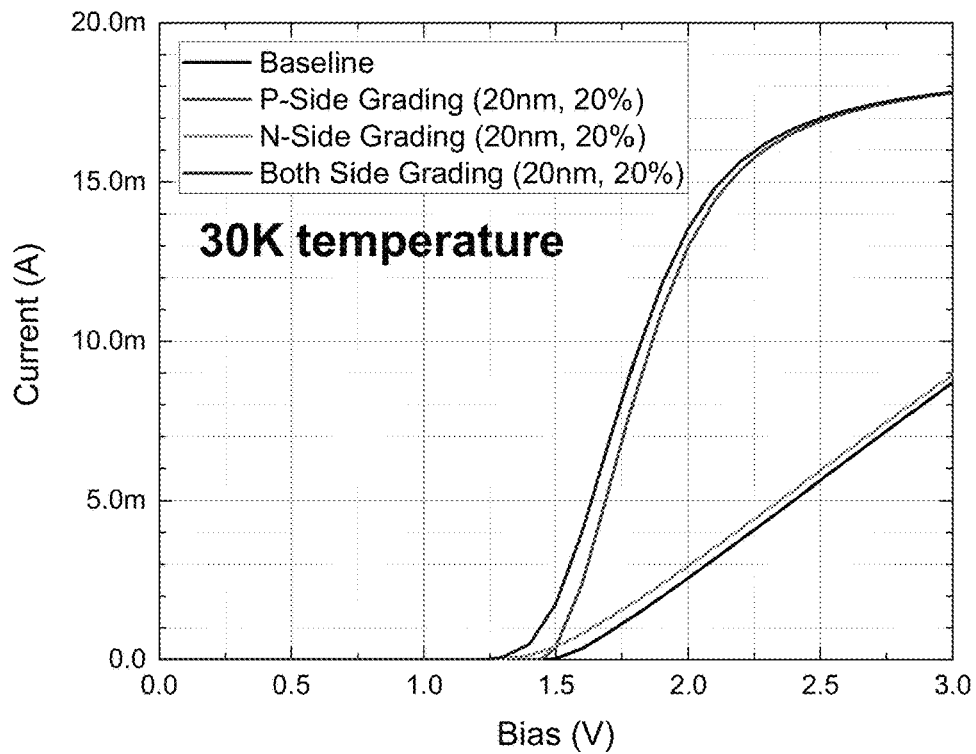
Figure 12C:
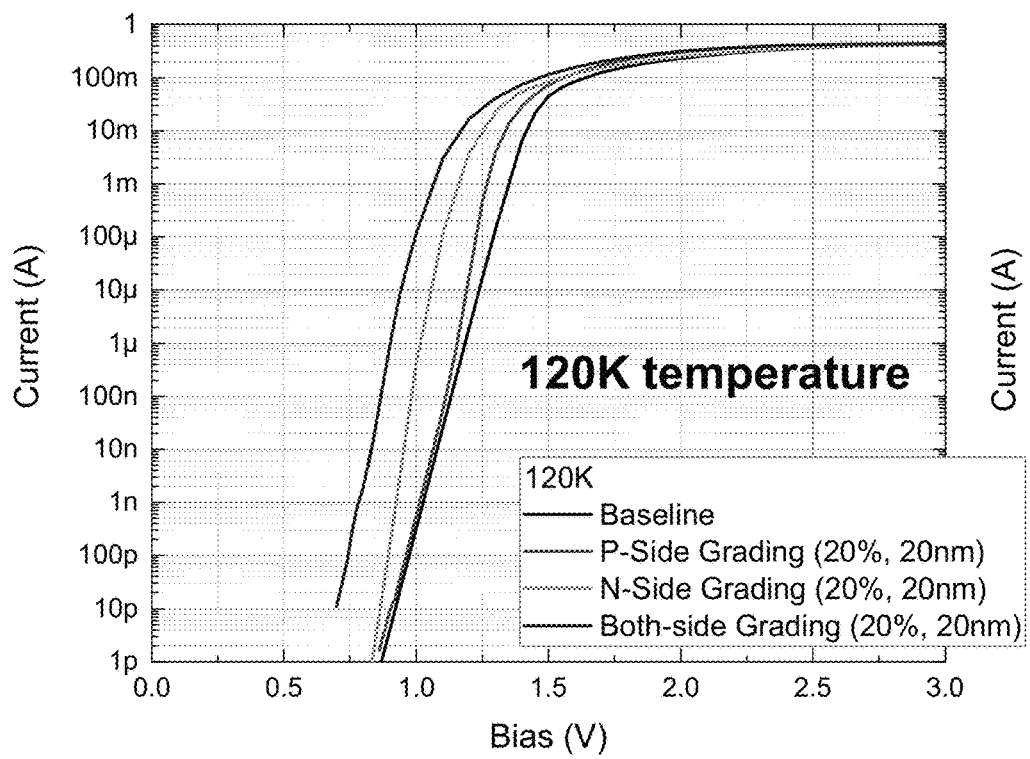
Figure 12D:
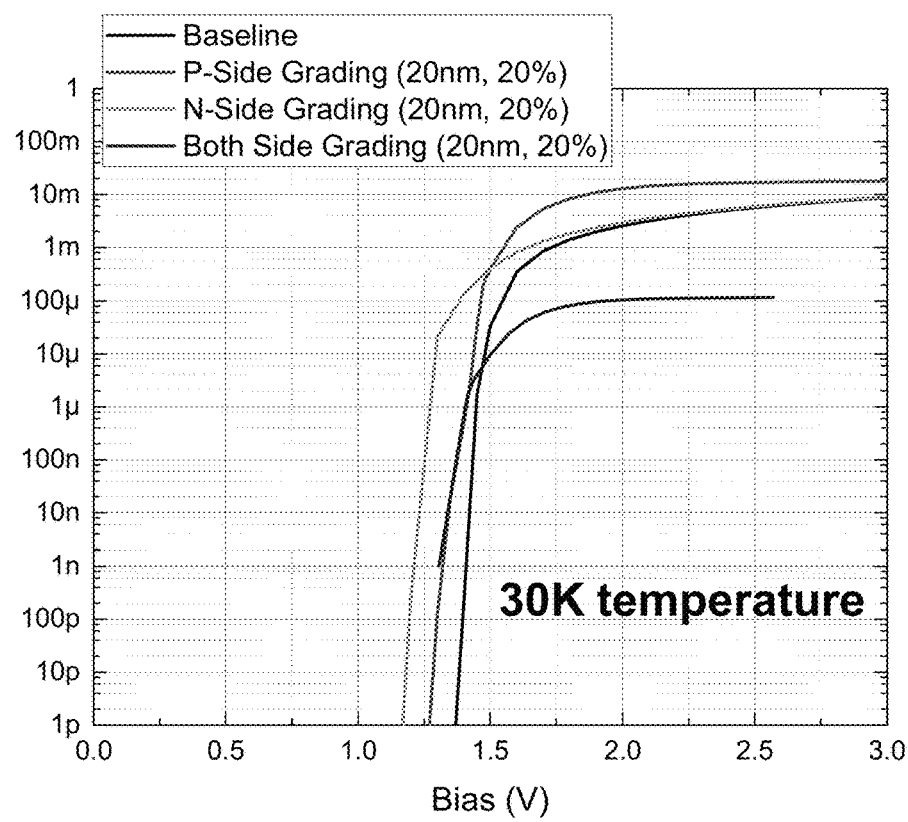

FIGS. 10A and 10B illustrate the cross-section of one embodiment a diode structure 10 of the present disclosure that is incorporated in a VCSEL. This laser has a core region 12 through which the current is directed and in which the light 14 is generated and propagates. On the two lateral sides of the core region 12 (as depicted in this cross-section) are lateral-current conducting regions 16, which contain the electrical contacts 18, 20, 22 and 24, which may be ohmic contacts. The carriers injected at these contacts flow from those contacts to the core region 12. The electrical contacts 18, 20, 22 and 24 preferably are a part of the lateral-current conducting region or regions 16. The electrical current flows primarily in the lateral direction in the lateral-current conducting regions 16 and the current flows primarily in the vertical direction in the laser-core region 12. The directions lateral and vertical are relative to the orientation of FIGS. 10A and 10B. Note that lasers and LEDs having a circular structure such as a VCSEL would have a single annular lateral-current conducting region 16 that surrounds the central core region 12.

The exemplary VCSEL as illustrated in FIGS. 10A and 10B is typically formed in two or more epitaxial growth processes. First, the structure in the core region 12 up through at least the n-type GaAs conducting layer 26 above the tunnel junction formed of layers 28 and 30 is grown. This lower portion of the core region includes a GaAs/AlGaAs DBR mirror 32, a n-type GaAs lateral-current conducting (and contact) layer 34, a n-type composition-graded InGaAs barrier layer 36 directly abutting the quantum well 38, a single strained InGaAs quantum well 38, a p-type composition-graded InGaAs barrier layer 40 directly abutting the quantum well 38, an optional p-type GaAs spacer layer 42, if present, a $P^+$ GaAs portion 28 of the tunnel junction, an $N^+$ InGaAs portion 30 of the tunnel junction, and the n-type GaAs lateral-current conducting layer 26. The material with the largest conduction-band energy is the n-type GaAs layers 26 and 34 of the lateral-current conduction and contact layers. Preferably, the n-type GaAs lateral-current conduction and contact layers 26 and 34 have a larger conduction band energy than that of the n-type barrier layer 36 and the quantum well 38. The material with the greatest valence-band energy is the p-type GaAs of the optional spacer layer 42, which injects holes toward the quantum well. Preferably the p-type GaAs of the spacer layer 42 has a greater valence band energy than that of the p-type barrier layer 40 and the quantum well 38. Thus, the disclosed diode structure presents energetically downhill flows for both the electrons and the holes toward the quantum well 38, with apparently no energy barriers to that carrier flow other than at the tunnel junction 28, 30. This is in contrast to the prior art structures of FIGS. 1, 2, 3 and 4 for which there are multiple AlGaAs or AlAs heterojunction barriers to impede the transport of electrons and holes. The absence of such energy barriers minimizes or reduces the applied voltage needed to produce current flow.

The InGaAs barrier layers 36 and 40 on the two sides of the quantum well 38 have composition grades that form electric fields to facilitate the flow of carriers to the quantum well. Preferably, the GaAs regions outside those barriers have sufficiently high doping to not be depleted even at temperatures as low as 3-4K, or to have a very thin depleted region. Also, the $P^+$ GaAs portion 28 and the $N^+$ InGaAs portion 30 of the tunnel junction both have sufficiently high doping and large thickness to avoid being depleted. Besides the $P^+$ GaAs 28 and $N^+$ InGaAs 30 tunnel junction illustrated in FIG. 10B, other forms of tunnel junctions compatible with the GaAs lattice constant also could be used, such as $P^+$GaAsSb/$N^+$InGaAs or $P^+$GaInAs/$N^+$ GaInNAs tunnel junctions.

The n-type GaAs lateral-current conducting layers 26 and 34 of the VCSEL extend through both the laser core region 12 and its surrounding lateral-current conducting region 16 of the device. Each of the two lateral-current conducting layers 26 and 34 of the VCSEL structure is contacted to metal electrical contacts located in the lateral-current conduction region 16. In this embodiment, the lateral-current conducting layer 26 located above the quantum well 38 and above the tunnel junction of layers 28 and 30 is coupled to a metal contact 20, 24 located closer to the core region 12. The lateral-current conducting layer 34 located below the quantum well 38 and close to the substrate 44 is coupled to a metal contact 18, 22 located farther from the core region 12. Thus, both sets of electrical contacts 20, 24 and 18, 22 can be accessed from the top side of the device 10. The device 10 has metal 60, 62, 64 and 66 for interconnecting to the electrical contacts. The lateral-current conduction region 16 preferably has some construct, such as the lightly doped or undoped (e.g. generally less than or equal to $10^{16}$ cm$^{-3}$) AlGaAs layer 82, shown in the structure of FIG. 10B, that impedes or blocks the flow of carriers in the vertical direction through the portion of the quantum well 38 in the lateral-current conduction region 16 and instead promotes the lateral flow of carriers between the contacts and the core region 12, and is part of the lateral-current conducting region 16. The n+ GaAs layer 80 and the n$^-$ —AlGaAs layer 82 are part of the lateral-current conduction region 16.

FIG. 11 shows an example of the material structure in the core region 12 of the VCSEL that has been used in model simulations of the electrical performance of the diode structure 10 at cryogenic temperatures. For this example the quantum well 38 comprises In$_{0.3}$Ga$_{0.7}$As. The compositions of the two barriers 36 and 40 on either side of and directly adjacent to the quantum well 38 are graded from In$_{0.2}$Ga$_{0.8}$As to GaAs or from In$_{0.1}$Ga$_{0.9}$As to GaAs, respectively, in two steps 36a and 36b, and 40a and 40b. When operated at a temperature of 10K or lower, the energy step between the In$_{0.3}$Ga$_{0.7}$As quantum well 38 and the In$_x$Ga$_{1-x}$As barrier material at the edge of the quantum well 38 still should be sufficient to provide carrier confinement in the quantum well 38. The example shows barrier layers 36 and 40 that have a more weakly graded portion 36b or 40b, which may be 30 Å and 40 Å thick, respectively, and a more strongly graded portion 36a or 40a, which are 70 Å and 40 Å thick, respectively. Other barrier layer composition grade profiles may be used. The barrier layers may have grading that varies, for example, continually all the way from the edge of the quantum well 38 to the edge of the GaAs material of the spacer layer 42 or P-doped tunnel junction layer 28, or continually all the way from the edge of the quantum well 38 to the edge of the lateral-current conducting layer 34. Also some portions of the barrier layers 36 and 40 may have uniform composition with no grading.

Simulations have been performed to investigate the effects of the operating temperature and the barrier grading on the current-voltage (I-V) characteristic of the basic PN diode that is formed in the vicinity of the quantum well. This basic diode comprises a P-type GaAs conductor, a P-type $In_xGa_{1-x}As$ barrier, an undoped $In_{0.35}As$ quantum well, an N-type $In_xGa_{1-x}As$ barrier, and an N-type GaAs conductor. FIGS. 12A-12D show IV characteristics obtained for a "baseline" device that has 20 nm thick lightly-doped GaAs barriers (i.e., with no composition grade) on both the P-side and the N-side of the quantum well, a device for which the 20 nm thick barrier on the P-side of the quantum well has linearly graded composition from GaAs to $In_{0.2}Ga_{0.8}As$, a device for which the 20 nm thick barrier on the N-side of the quantum well has linearly graded composition from GaAs to $In_{0.2}Ga_{0.8}As$, and a device for which the 20 nm barriers on both sides of the quantum well have graded composition. Results are shown for the IV characteristics obtained at temperatures of 30K and 120K. When operated at the lower cryogenic temperatures (e.g., <10K), the modulated drive current to the laser would be no greater than 1 mA and likely would remain less than 100 µA, and even could be less than 20 µA for temperatures around or at 4K.

Consider first the "baseline" structure. As the temperature is reduced, the bias voltage needed to produce 1 mA current becomes higher. This trend of needing higher bias voltage at lower temperature also applies for 100 µA current and even for 10 µA current. The increase in bias voltage is unavoidable because the carrier mobility is lower when the temperature is lower. Next, from these results it is seen that the composition grade of the barrier region reduces the bias voltage needed to achieve a given drive current. At the higher current levels (e.g., 1 mA) and for the range of temperatures covered by the data shown in FIG. 12, grading the P-side barrier significantly increases the current that is achieved at a given voltage. The grading increases the E-field assisted drift of carriers through the barrier layers. At the lower current levels (e.g., ≤100 µA) and for the range of temperatures covered by the data shown in FIGS. 12A-12D, grading the N-side barrier significantly reduces the bias voltage associated with a given current. This suggests that the carrier-depleted region is located more in the P-side barrier than in the N-side barrier. The greatest benefit is obtained when both P-side and N-side barriers have composition grades. Considering the result for 30K temperature, a current swing from 1 µA (which may be below the lasing threshold for a VCSEL, for example) to 100 µA (which may be well above the lasing threshold) would require a voltage swing of approximately 0.1 volts. This represents a differential resistance of approximately 1 kOhms.

Figure 13A:
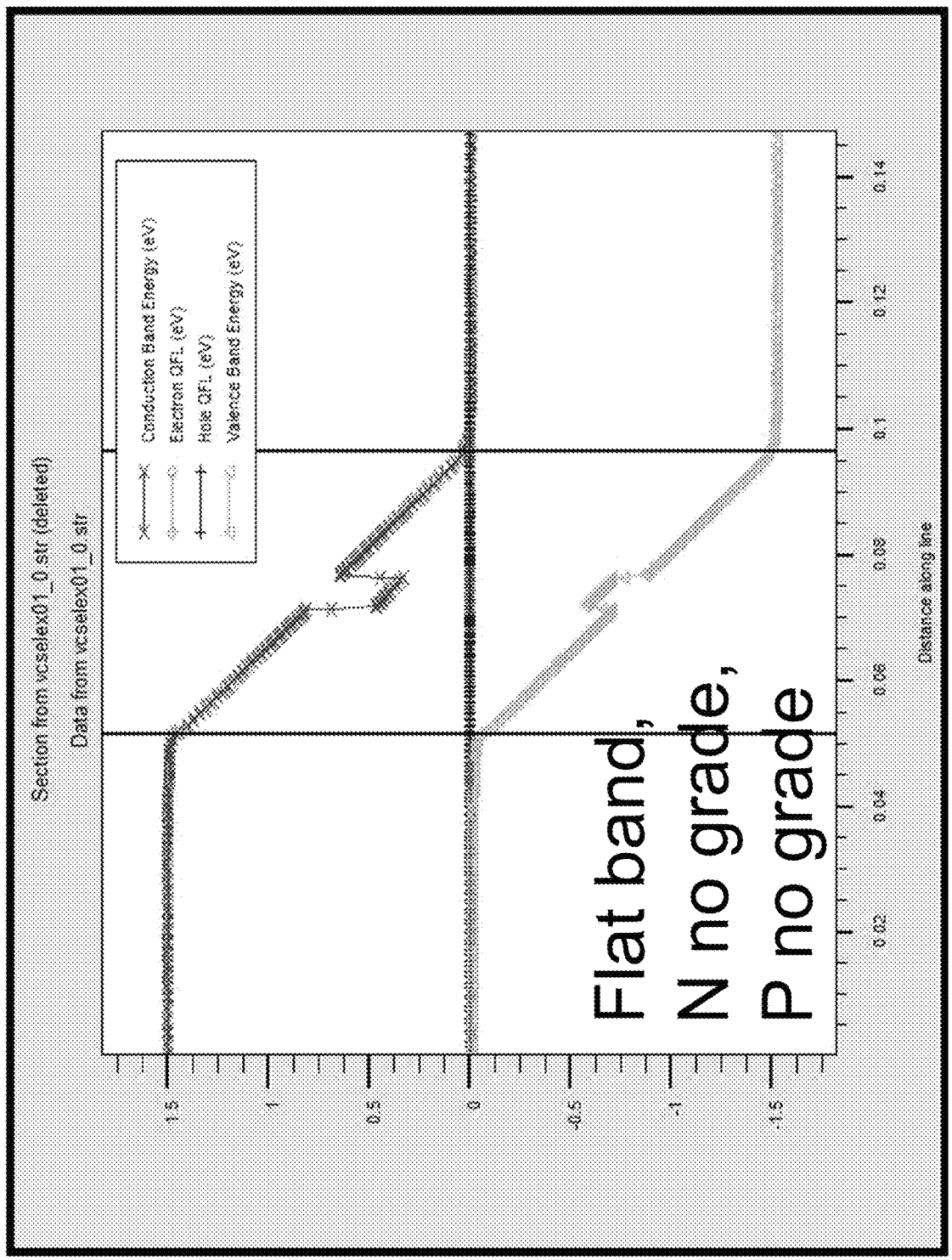
FIGS. 13A, 13B, 13C, 13D, 13E and 13F show calculated energy-band diagrams, at 30K operating temperature, comparing structures with graded barrier layers and structures with ungraded barrier layers.
Figure 13B:
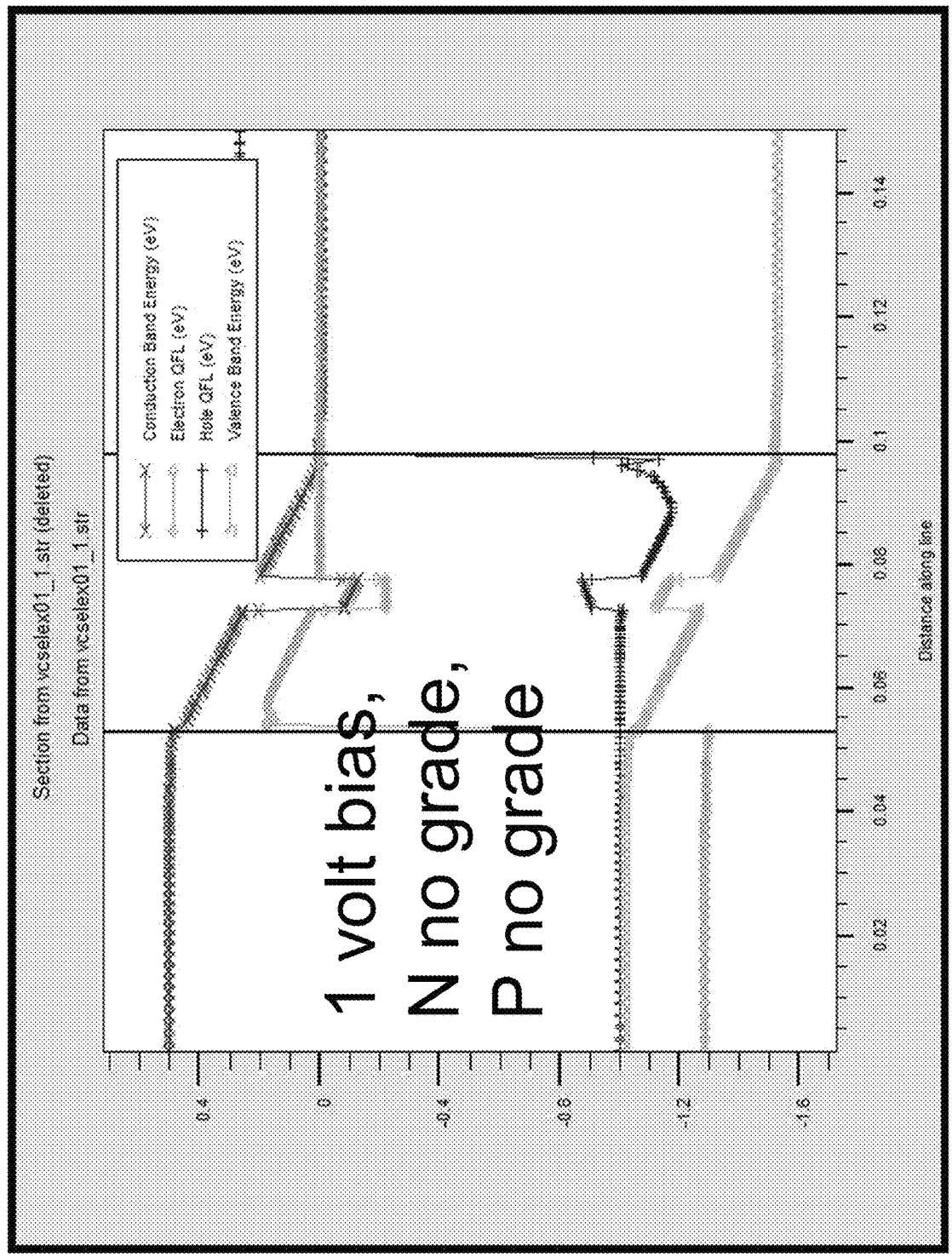
Figure 13C:
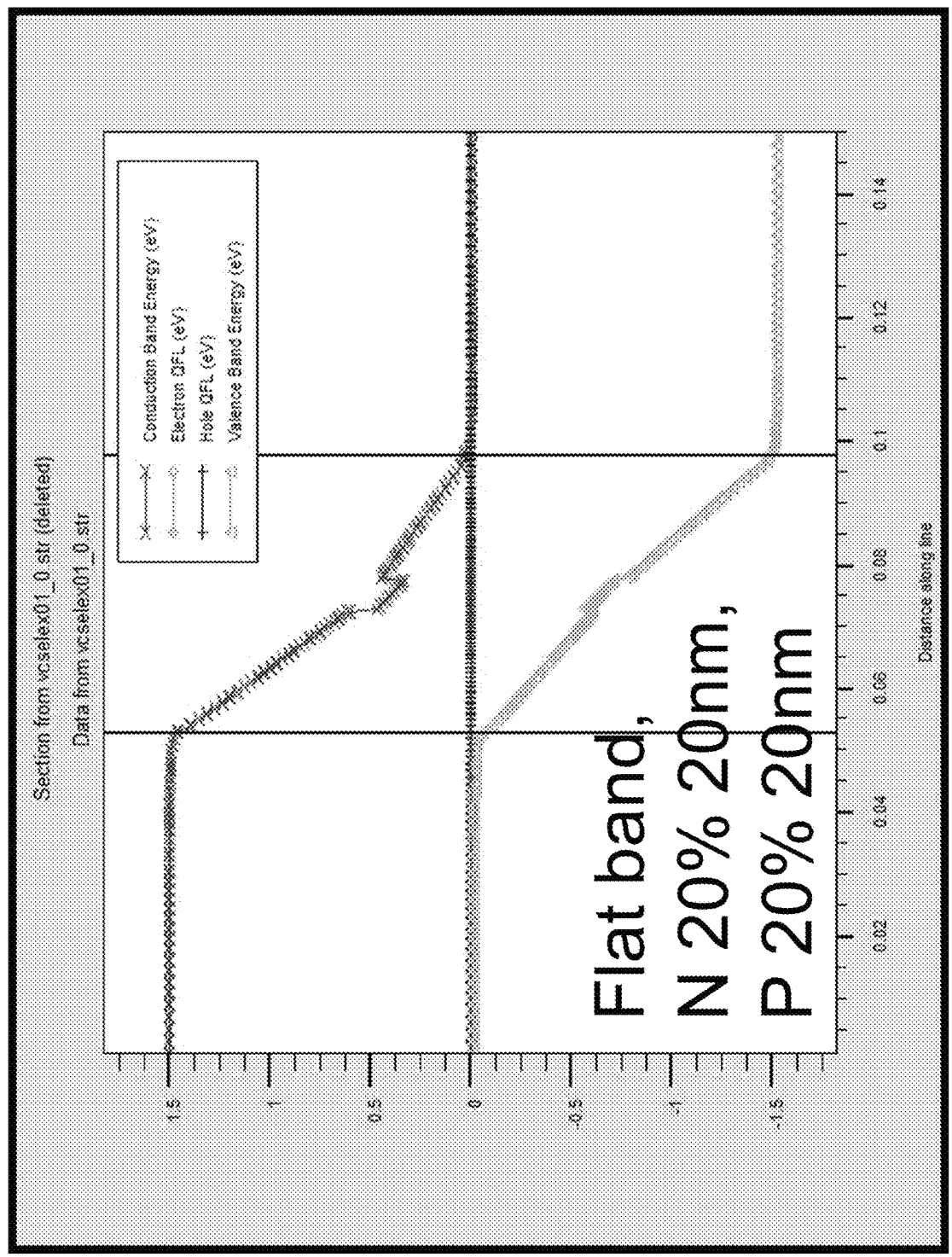
Figure 13D:
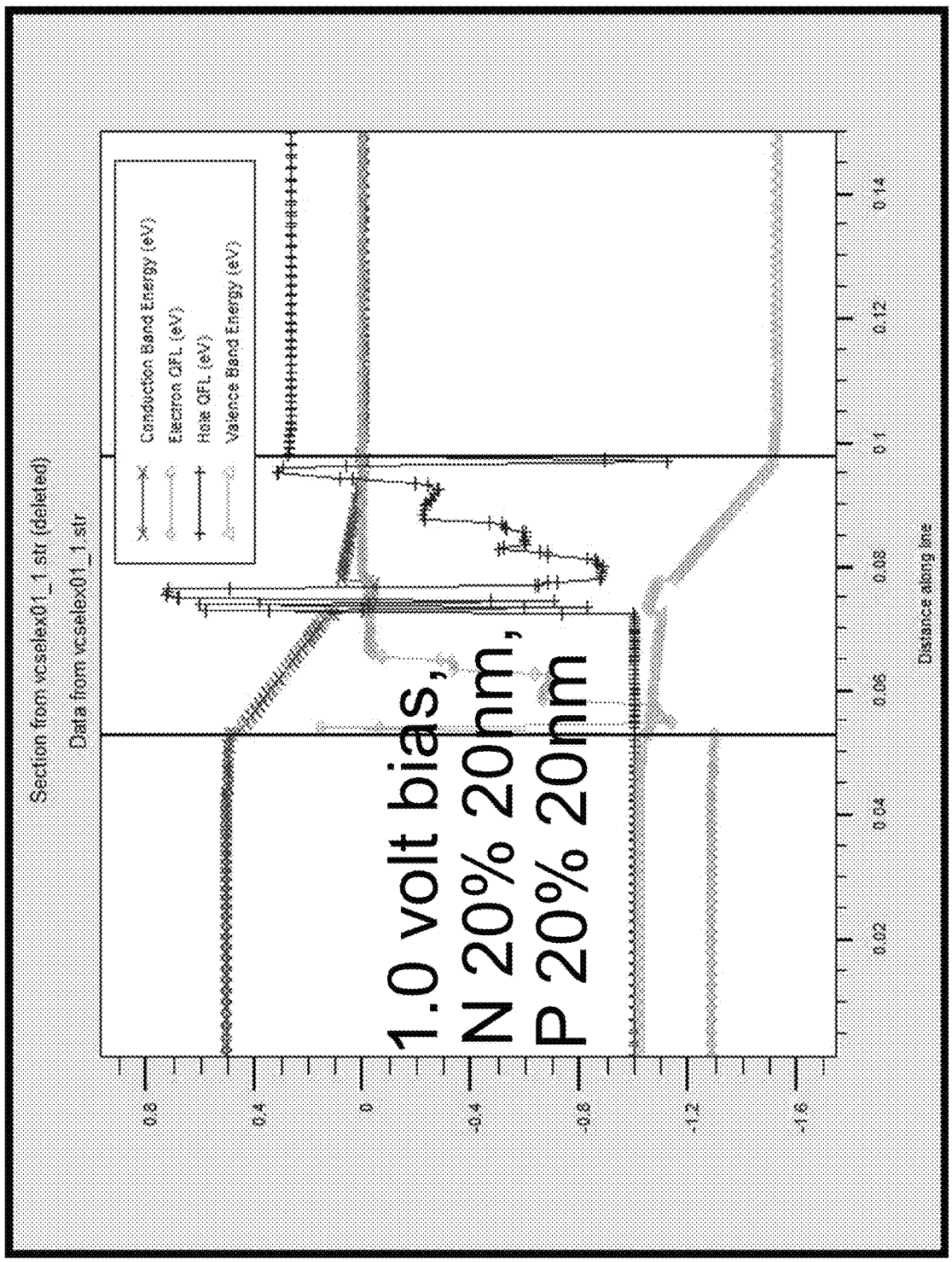
Figure 13E:
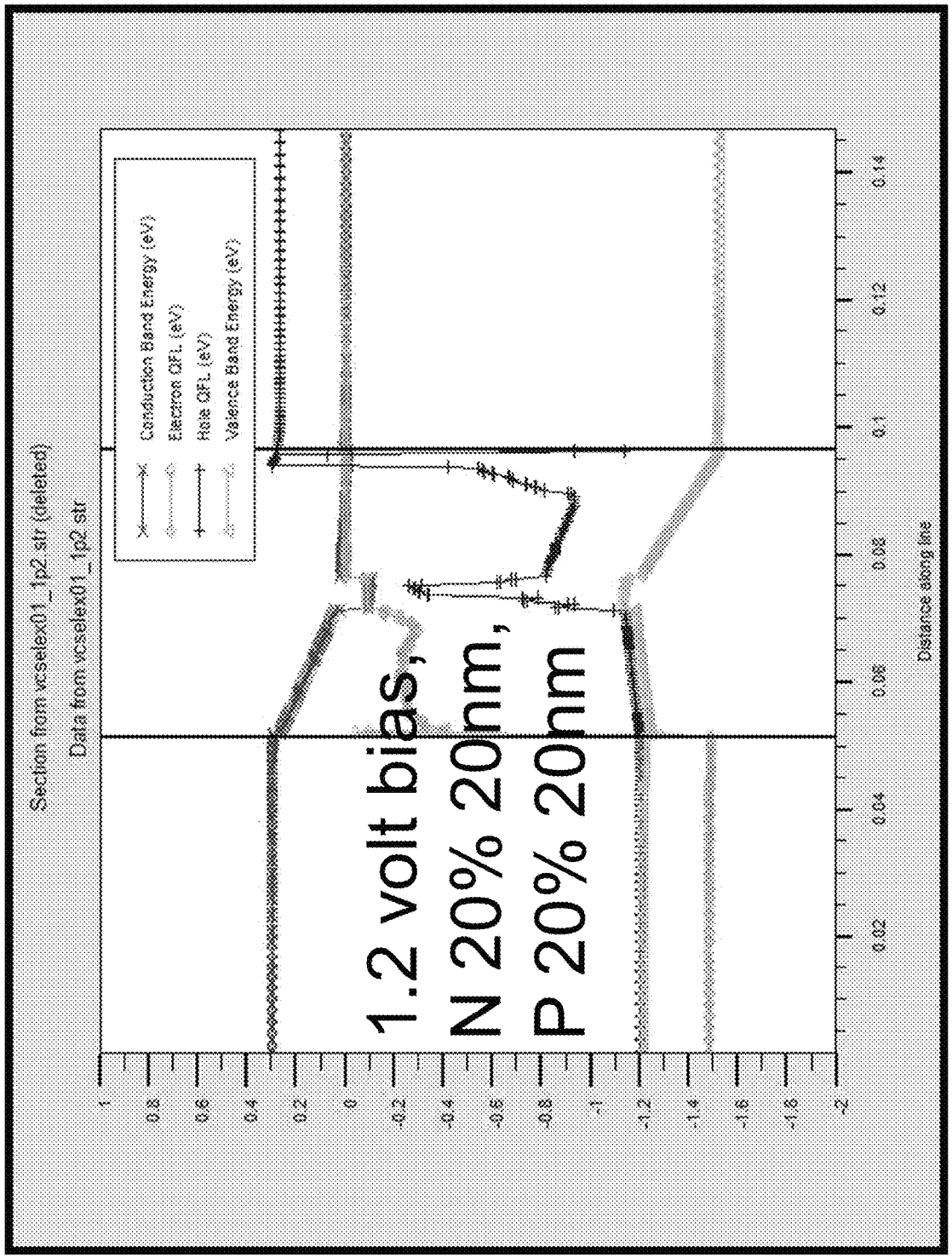
Figure 13F:
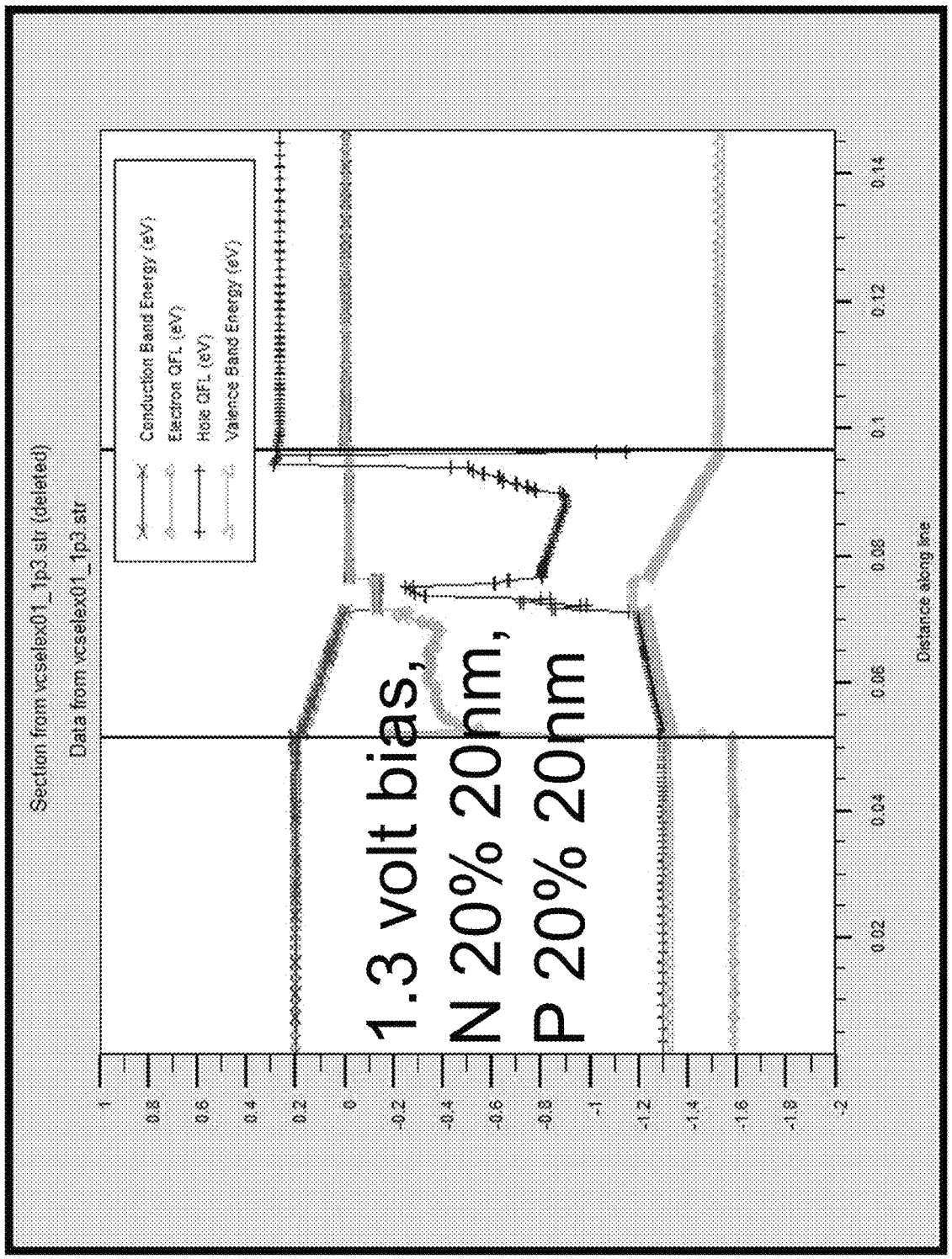

A benefit of having a graded barrier can be illustrated by examining the energy-band diagrams for a structure with un-graded barriers and for a structure with composition-graded barriers, as shown in FIGS. 13A-13F. Even when negligible current is flowing through the structure (e.g., for 1 volt bias as shown in FIGS. 13B and 13D), the structure with graded barriers has a smaller energy separation between the quasi-Fermi level for the electrons (or for the holes) and the edge of the conduction band for the electrons (or of the valence band for the holes). As a greater bias voltage is applied and the current is increased, the conduction and valence band edges in the barrier layers are further bent (or flattened) to coincide with the quasi-Fermi levels or even to have an energy that is closer to the mid-gap energy than the quasi-Fermi levels (which would indicate substantial injection of carriers (holes and/or electrons) into the quantum well), as shown in FIGS. 13E and 13F.

Figure 14A:
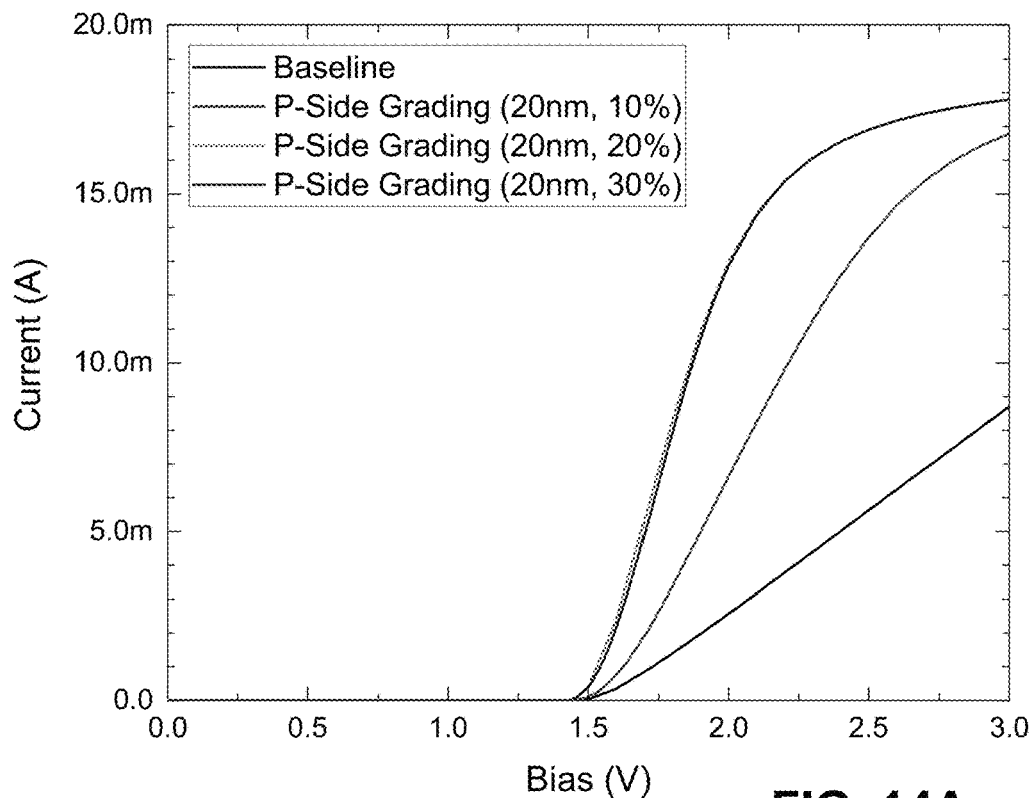
FIGS. 14A, 14B, 14C, 14D, 14E and 14F show calculated current vs voltage characteristics of the basic PN diode in the core region of the laser, obtained for different steepness of the composition-grading profile for 30K temperature in accordance with the present disclosure.
Figure 14B:
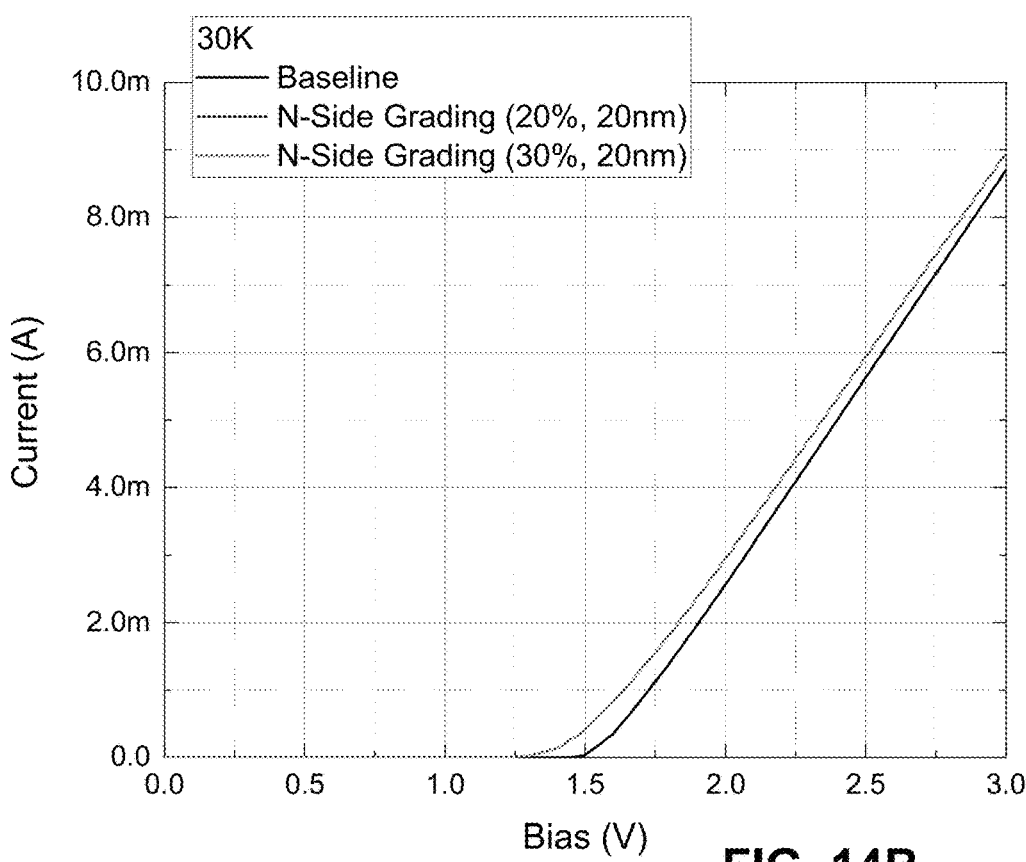
Figure 14C:
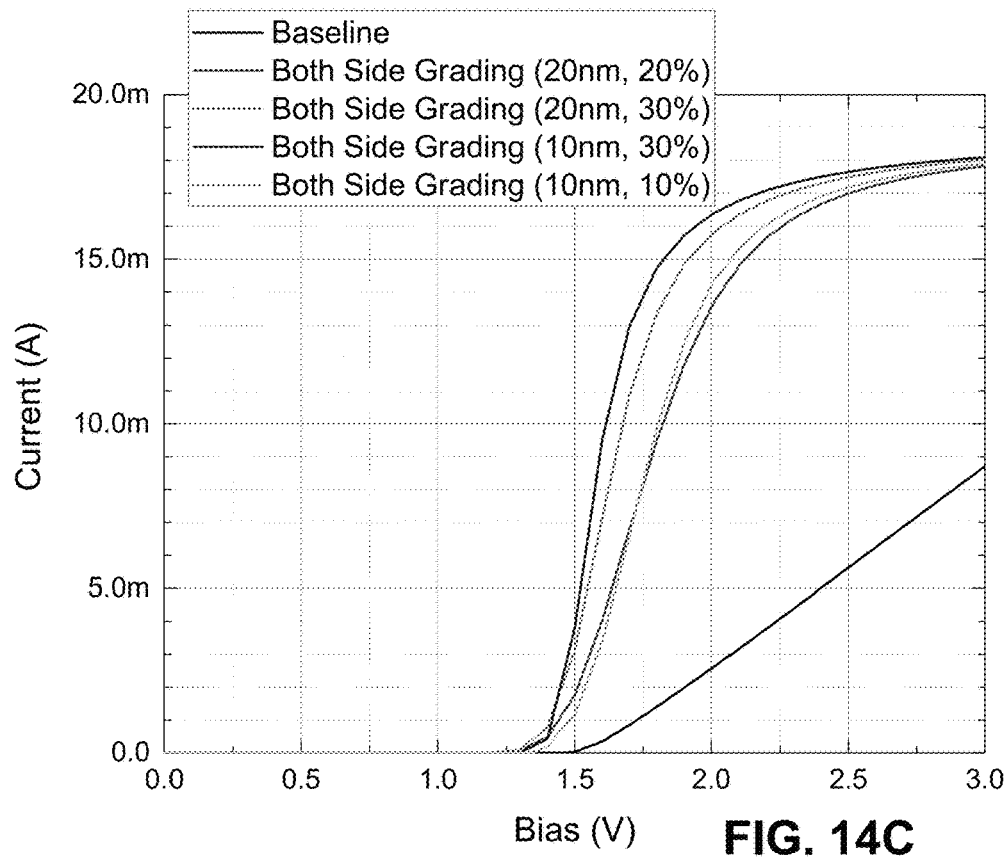
Figure 14D:
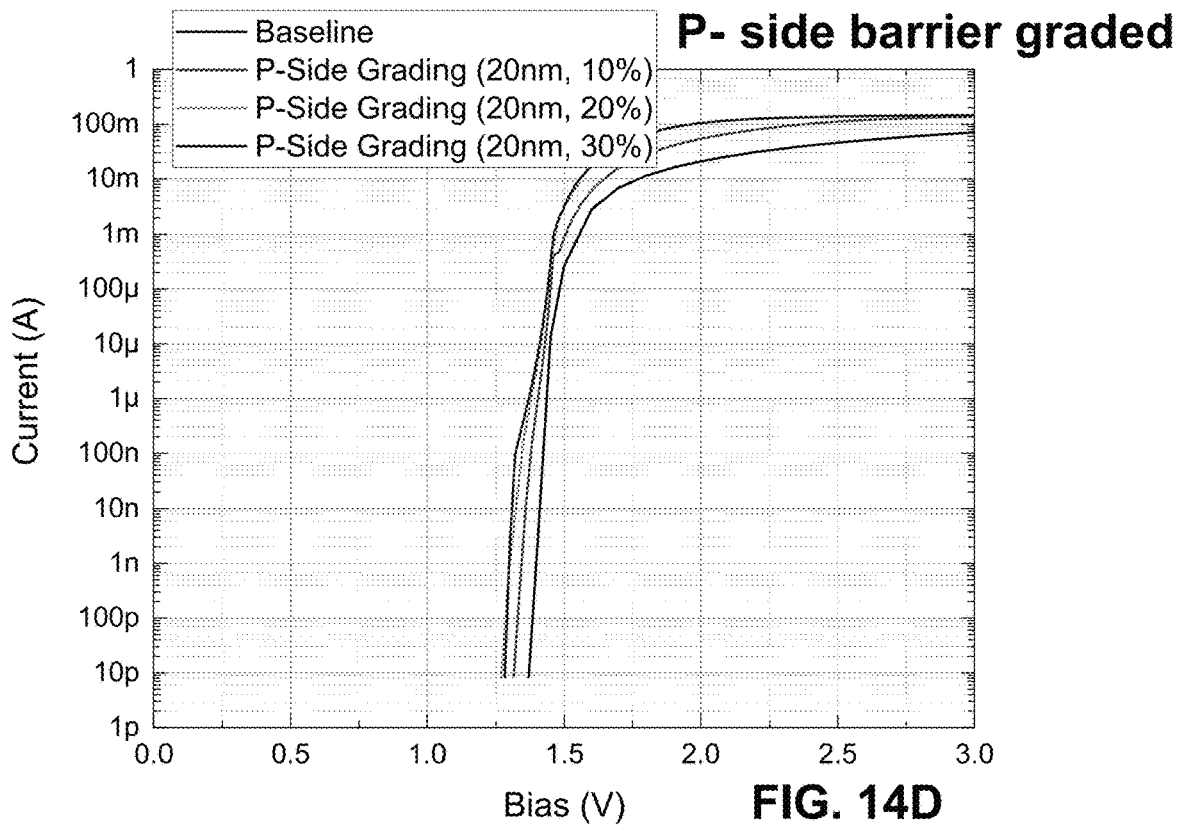
Figure 14E:
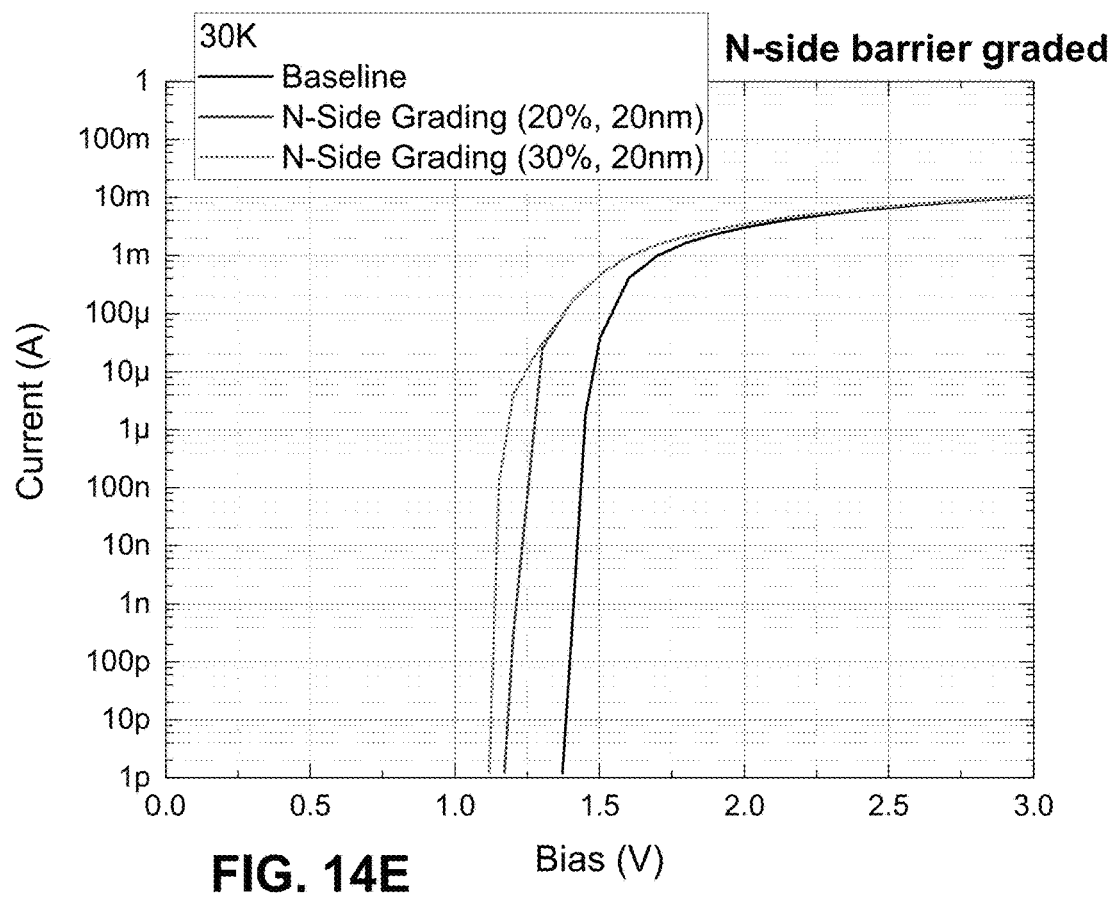
Figure 14F:
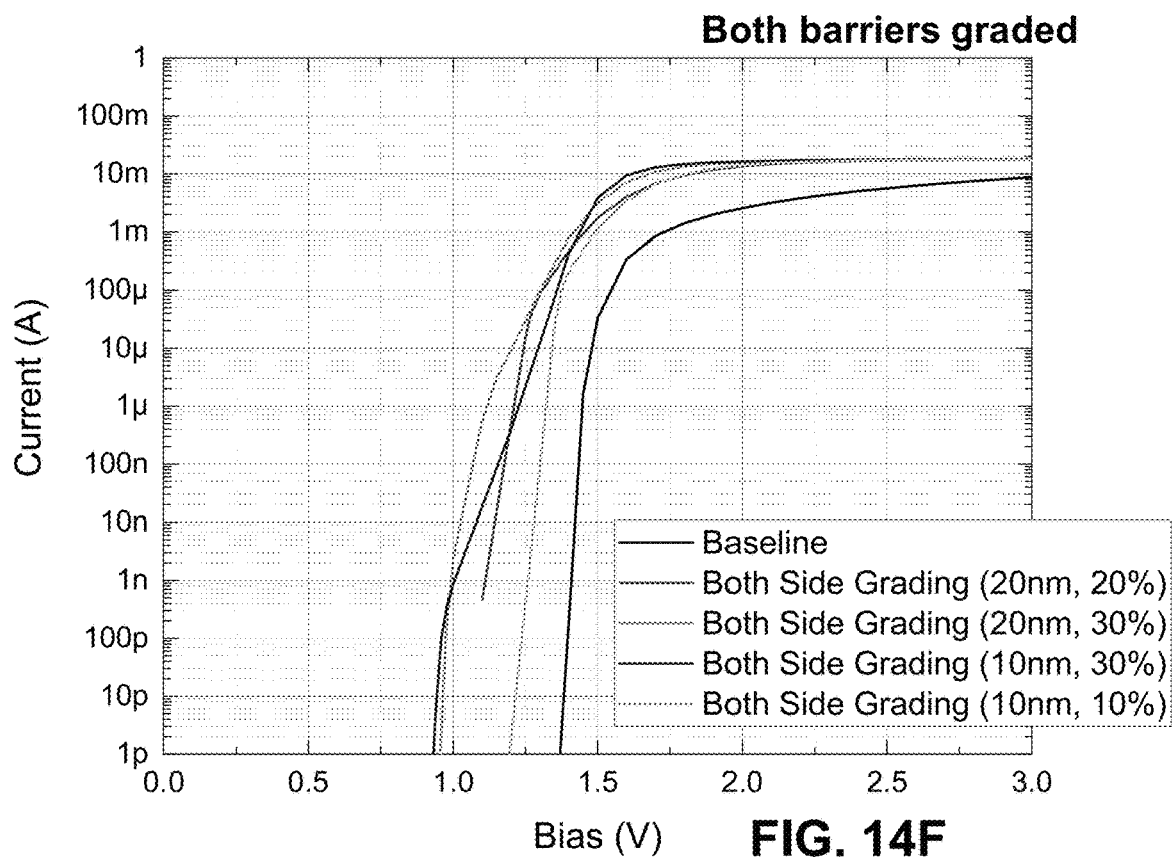

The edge of the graded barrier immediately adjacent to the GaAs spacer or to the GaAs lateral-current conducting layer has the same composition as GaAs. The edge of the graded barrier immediately adjacent to the InGaAs quantum well has a different InGaAs composition, with less indium, than the material of the quantum well. FIGS. 14A-14F compare the relative effects of ending the composition grades for the barrier at $In_{0.1}Ga_{0.9}As$ (10% indium for the Group III element), $In_{0.2}Ga_{0.8}As$ (20% indium) or $In_{0.3}Ga_{0.7}As$ (30% indium). The plotted results show that ending the composition grade in an InGaAs material with greater indium content shifts the IV curve to lower bias voltage, especially for the voltage corresponding to very low current (such as 100 nA and lower). Also, extending the composition grade to an InGaAs material with greater indium content can make the slope of the IV curve steeper (especially for the higher range of current values), so a smaller change in drive voltage would be needed to produce the same large change in the current through the active layer (see FIG. 14c). These results also show that grading the P-side barrier increases the maximum current obtained at a higher bias voltage, as shown in FIG. 14A and grading the N-side barrier reduces the minimum bias voltage obtained at a low current, as shown in FIG. 14E. Grading both the barrier on the electron-transporting side of the quantum well and also the barrier on the hole-transporting side of the quantum well, such as shown by the green and the dark blue curves in FIG. 14F, achieves the greatest benefit in terms of both reducing the modulation-voltage swing for a given modulation-current swing as well as reducing the average voltage.

For lasers and light emitters grown on GaAs substrates, both the InGaAs barrier material and also the InGaAs quantum well are strained and are not lattice-matched to the GaAs. Thus, there is a limit to the allowable thickness of the two graded InGaAs barrier layers, especially since the InGaAs quantum well material has even greater strain. For example, it may be desirable to keep the thickness of the quantum well and barrier layers below the critical thickness values suggested by Matthews and Blakeslee, as described in Reference [12], which is incorporated herein by reference. The critical thickness is the thickness below which dislocations (defects) in the epitaxially grown material are not formed despite the strain due to the mismatch between the lattice constant of the substrate or underlying material and the newly grown layer of material. Values for the critical thickness are given in the reference by Matthews and Blakeslee. If the composition grade ends at a higher indium mole-fraction, the barrier should be thinner, which makes the grading profile even steeper. A more steeply graded barrier actually is beneficial in that such a structure has a smaller density of states in the barrier, which could result in lower threshold current at the cryogenic temperatures, as described in Reference [13], which is incorporated herein by reference. But it is preferable that the graded barriers be wide enough to minimize the carrier depleted regions abutting each side of the quantum well. Also, the maximum indium content at the quantum-well edge of a graded barrier layer should be sufficiently lower than the indium content in the quantum-well material that quantum confinement of the carrier-states is achieved at the operating temperature. This combination of constraints can guide the design of the barrier layers and their composition grading profiles, as exemplified by the profiles given in FIG. 11.

Figure 15A:
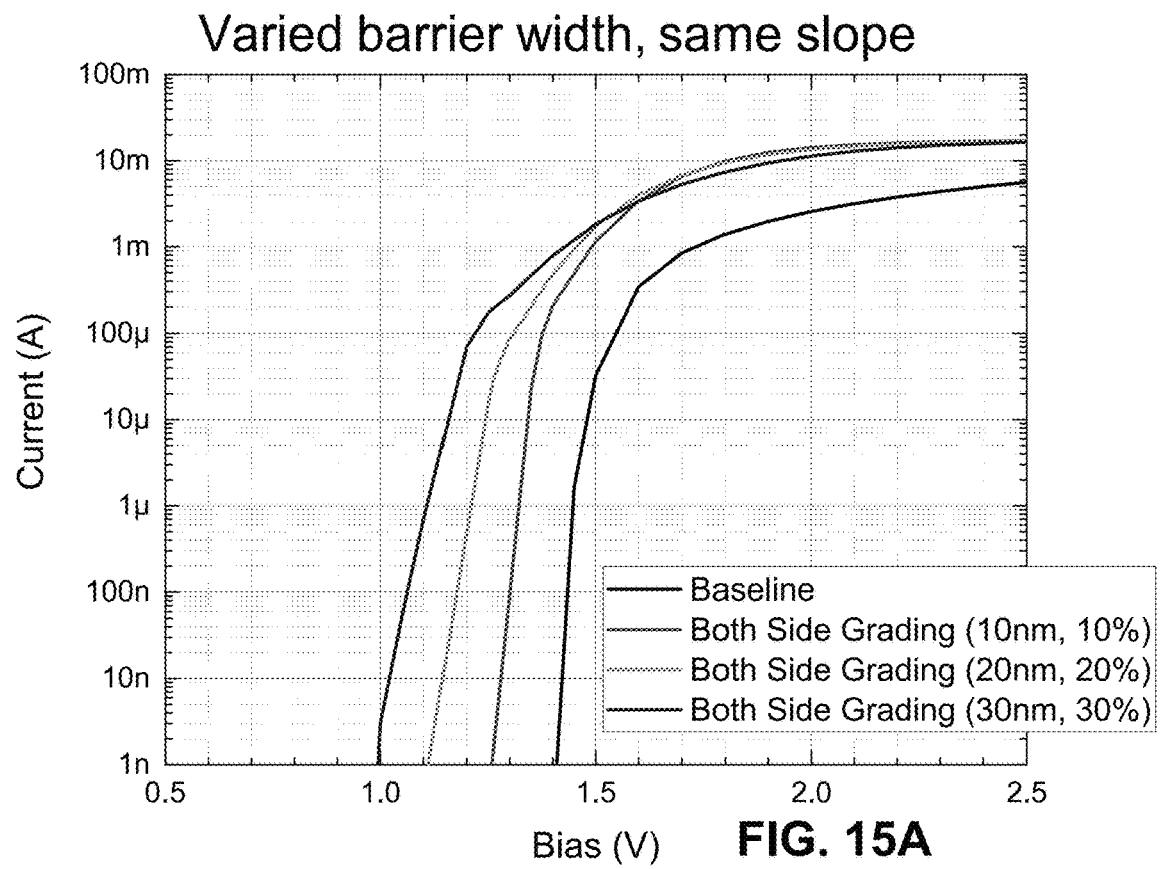
FIGS. 15A and 15B show calculated current vs voltage characteristics of the basic PN diode in the core region of the laser, obtained for different profiles of the composition-graded barrier adjacent to the quantum well for 30K temperature in accordance with the present disclosure.
Figure 15B:
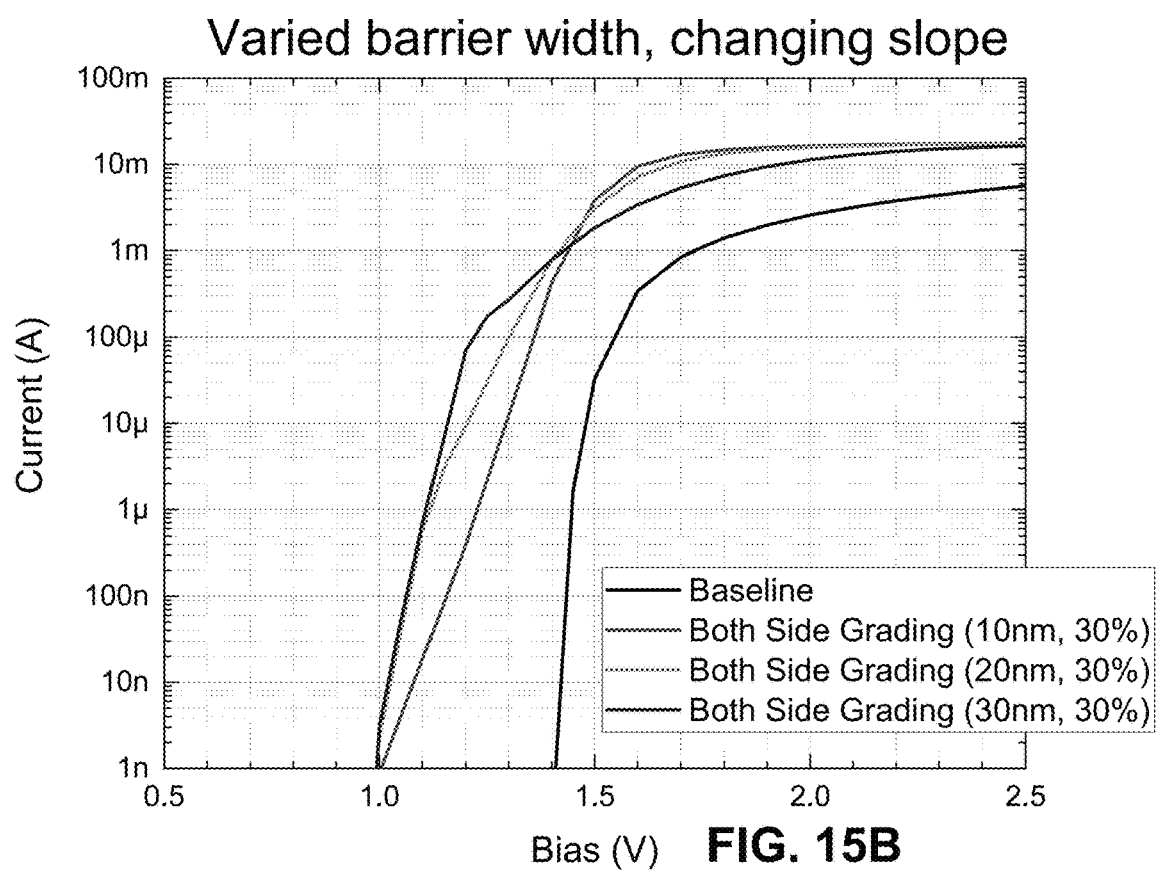

FIGS. 15A and 15B show results of simulations that considered the thickness of the barrier layers and the slope of their composition grade. For FIG. 15A, the slope of the composition grades on both the N-side and the P-side remained the same as the width of the barrier layers was changed. Thus, the wider barriers end with an InGaAs composition that has more indium. As an example, consider the current ranges below 1 mA and even below 100 µA. In these current ranges, the bias voltage needed is reduced when the grade ends with a material having more indium (and thus has a smaller bandgap). For FIG. 15B, the ending InGaAs composition for the edge of the barrier abutting the quantum well is kept the same as the width of the barrier layers was changed. Thus, the narrower barriers have a steeper composition grade. The plotted results suggest that for the steeper composition grade, a larger voltage swing may be needed to achieve the same current swing (such as a swing between 1 µA and 100 µA).

Figure 16A:
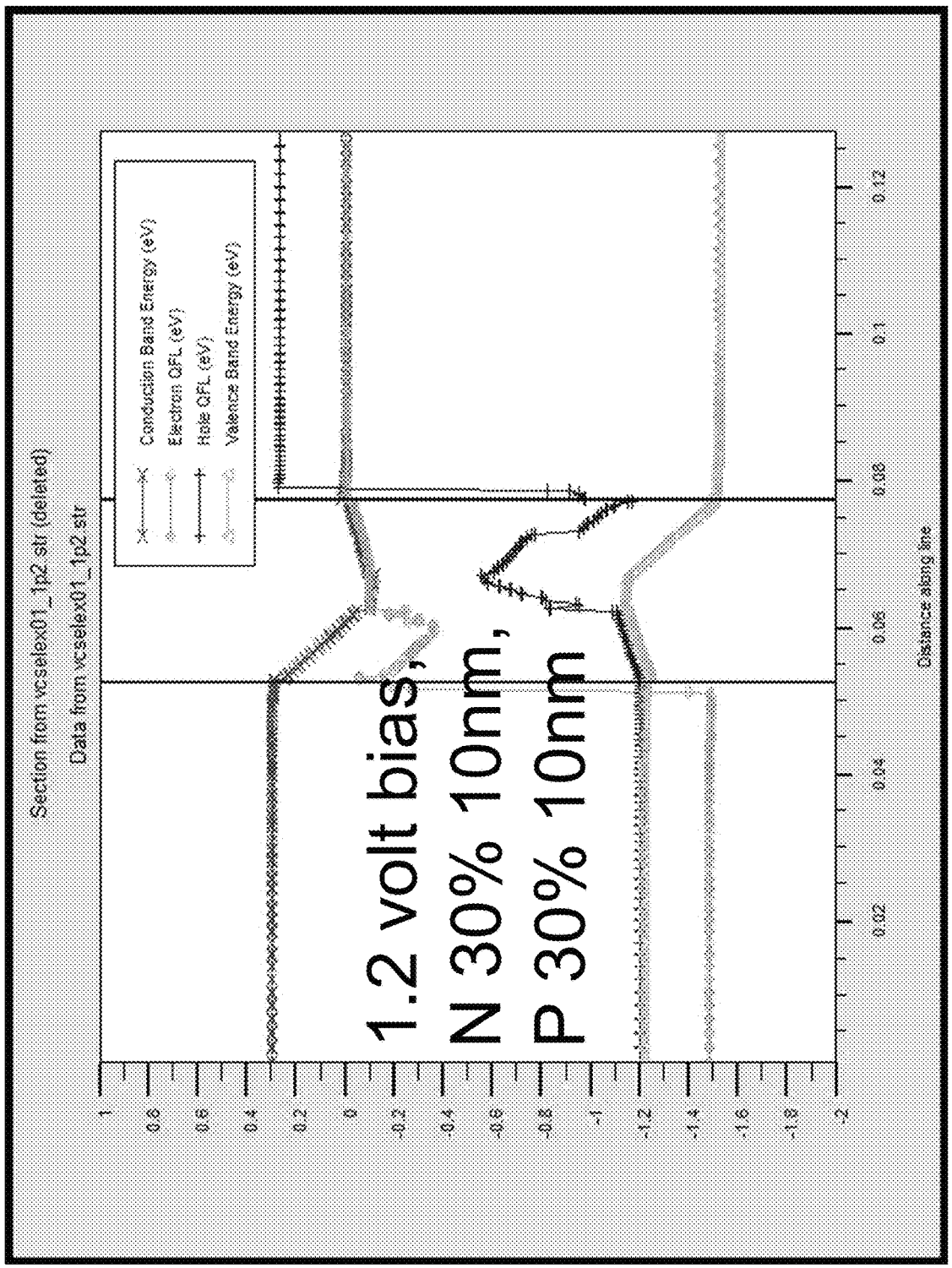
FIGS. 16A, 16B, 16C, 16D, 16E and 16F show energy band diagrams and carrier concentration profiles of exemplary quantum-well structures with composition-graded barriers for 30K temperature in accordance with the present disclosure.
Figure 16B:
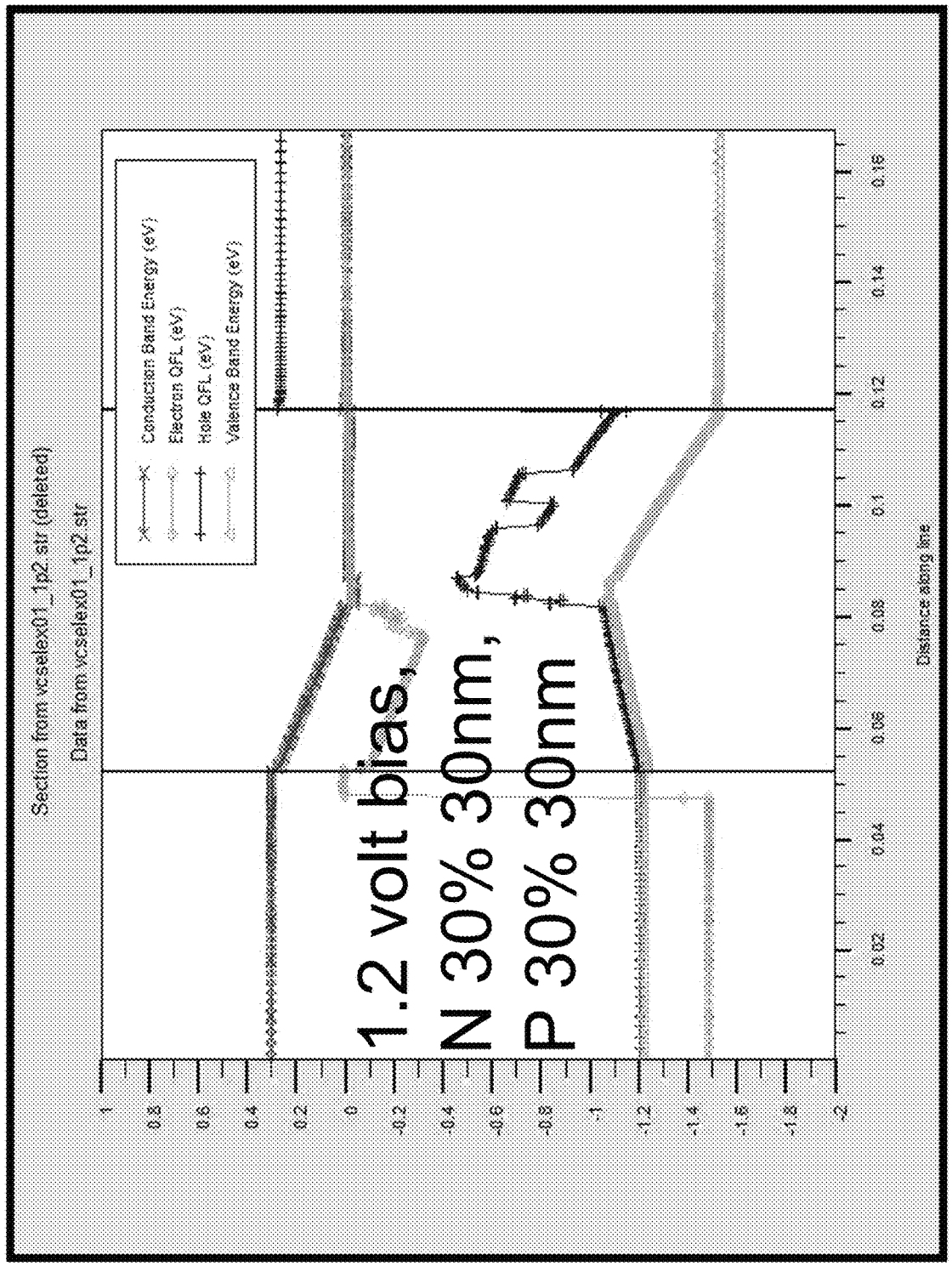
Figure 16C:
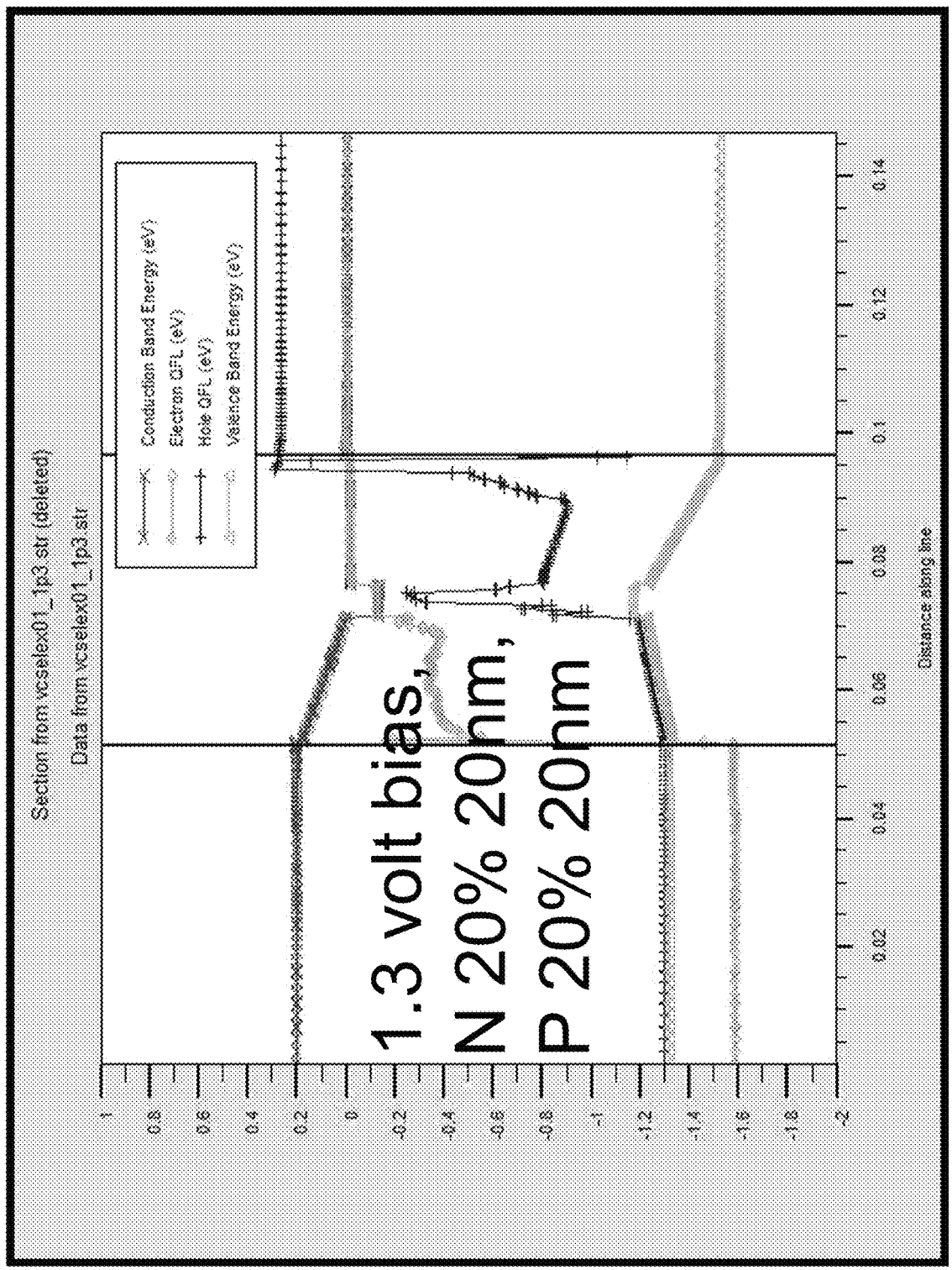
Figure 16D:
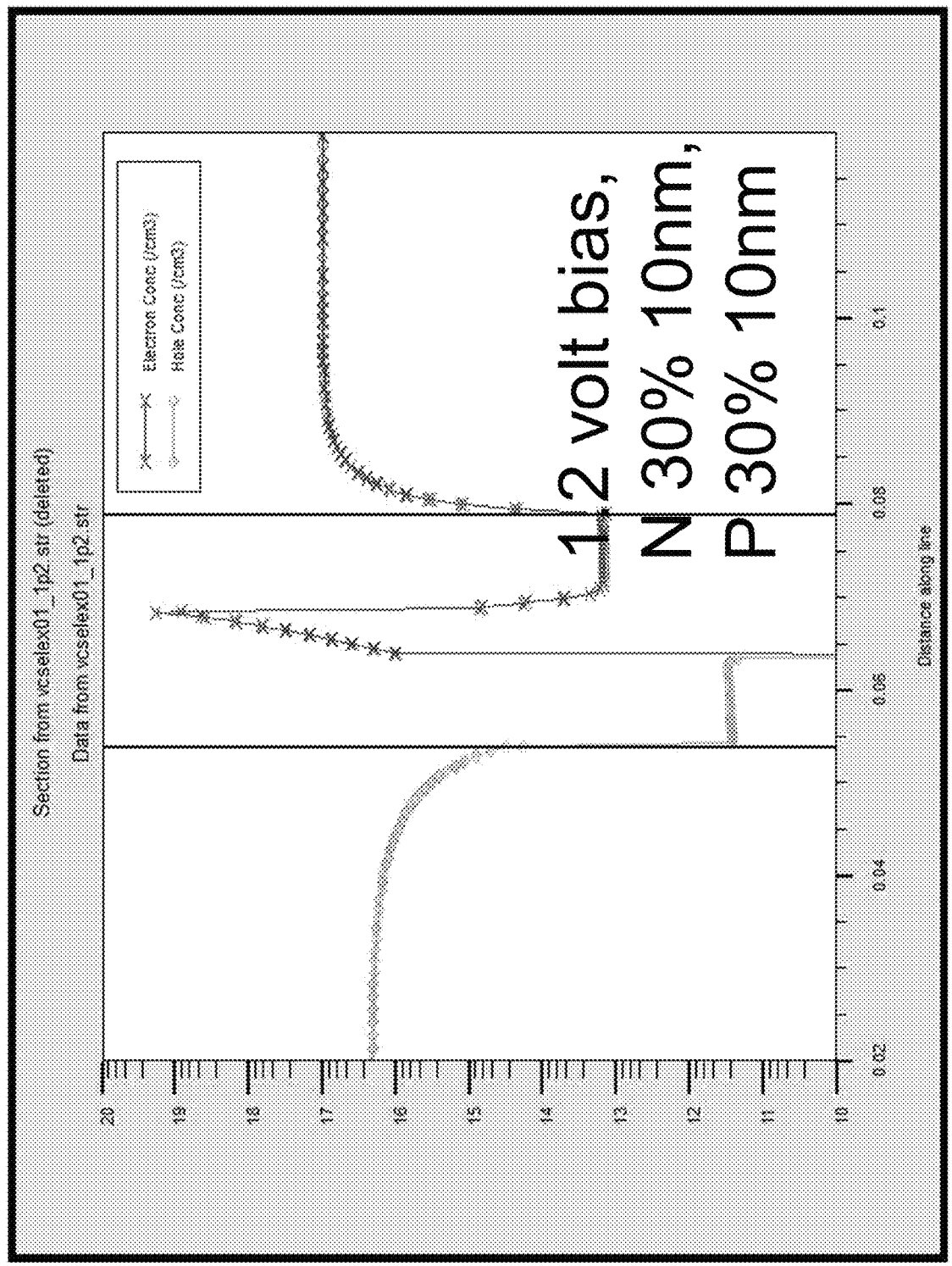
Figure 16E:
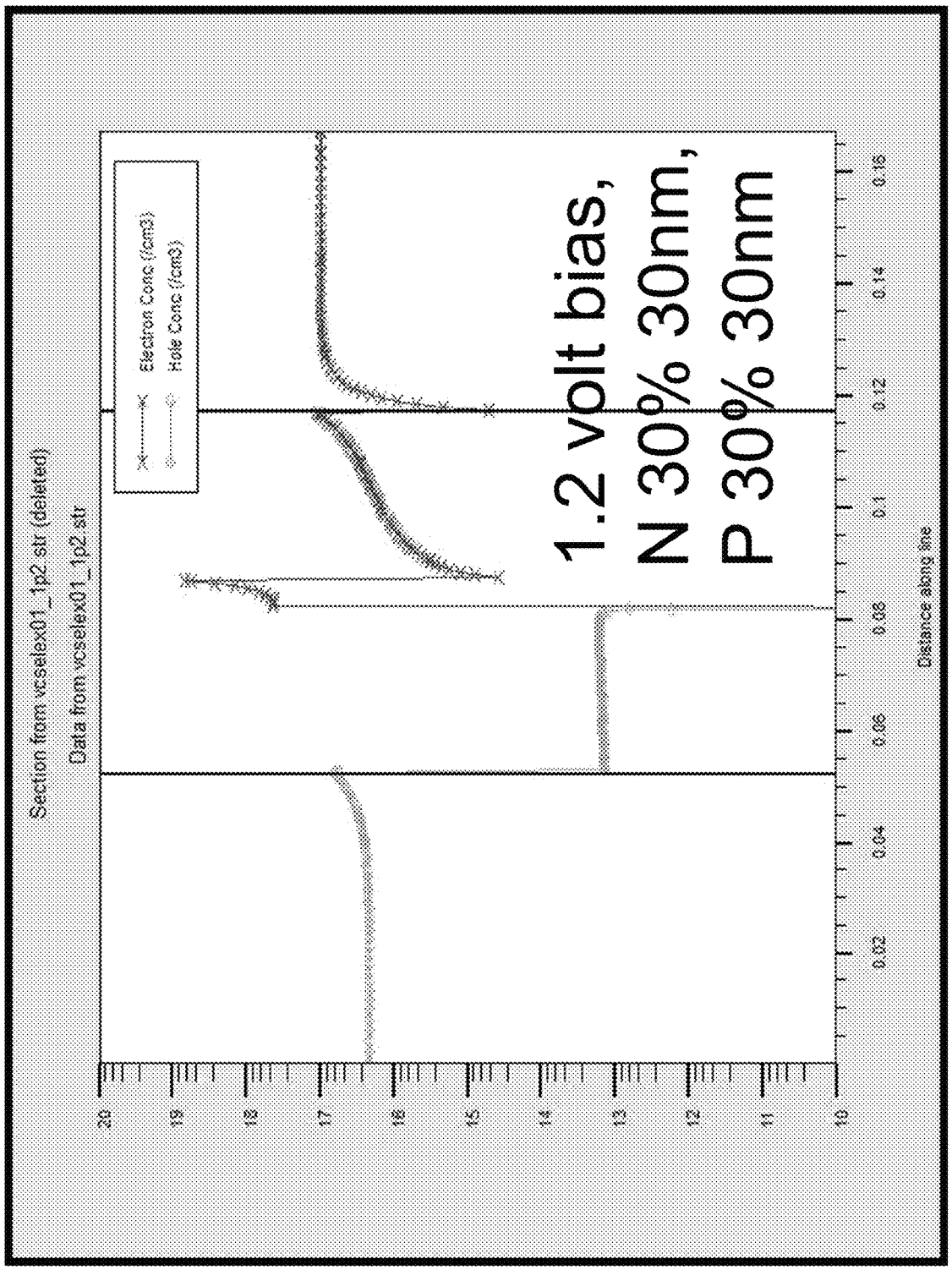
Figure 16F:
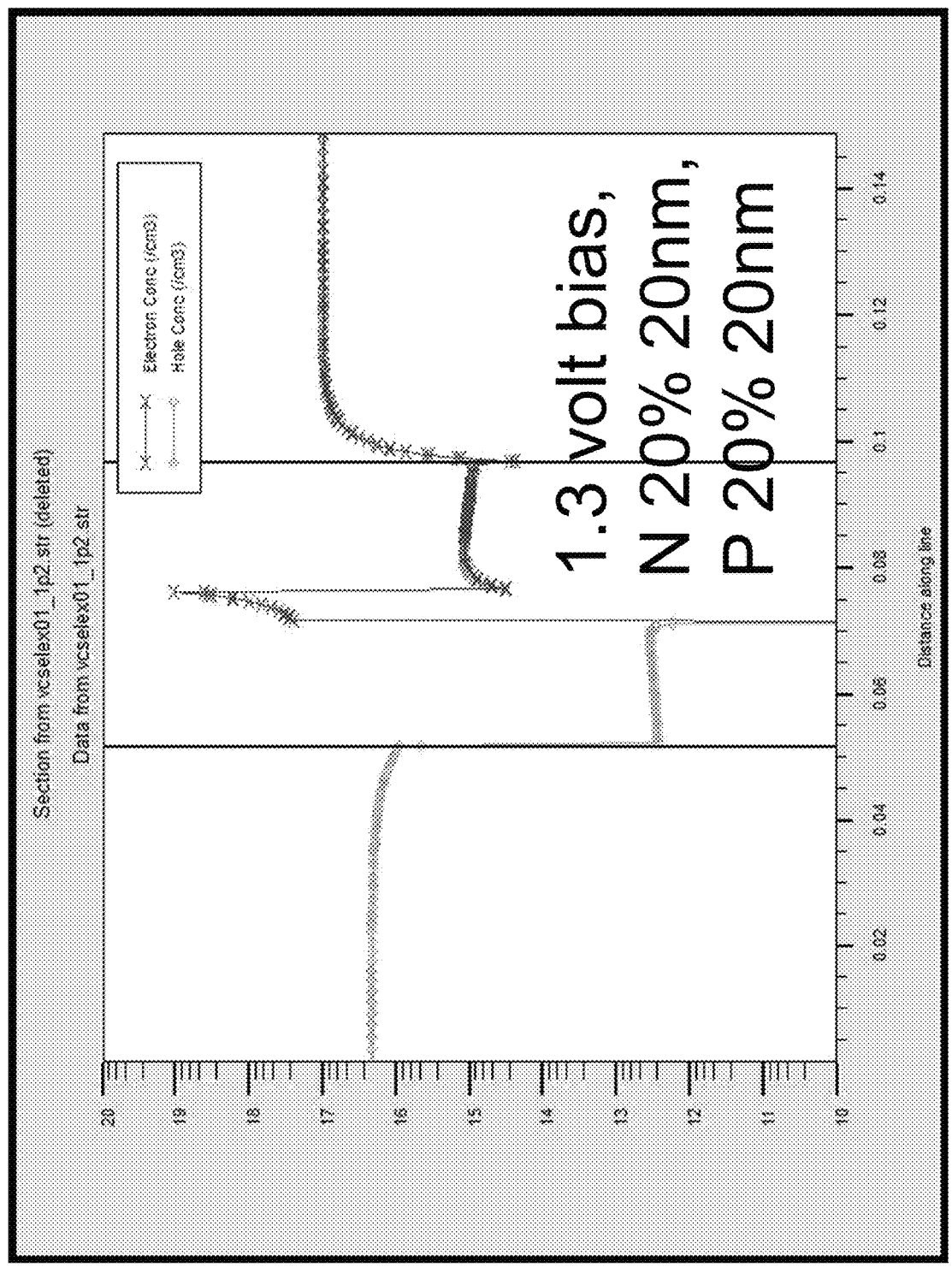

To further examine the effect of the composition grade in the barrier layers, FIGS. 16A-16C plot the energy-band diagrams for three different composition grade profiles. At the bias voltages selected for these plots, the quasi-Fermi levels are nearly aligned with the conduction and valence band edges in the two GaAs lateral-current conducting layers. FIGS. 16D-16F plot the hole and electron carrier concentration profiles obtained for these same composition grade profiles. The doping levels are $1E19$ cm$^{-3}$ in the GaAs conduction layers and $1E16$ cm$^{-3}$ in the graded barrier layers. Note that the dopant concentration in the barriers was intentionally set such that those barriers resemble undoped material, which allows the effects of the composition grade and a doping grade to be separately considered.

First, the model used assumes the activation of the dopants in the barrier layers is not complete at the low (30K) temperature. Also, it is seen that the applied bias voltage is more effective for facilitating the transport of electrons through the barrier layer on the N-side of the quantum well than for the transport of holes through the barrier layer on the P-side of the quantum well. The low carrier density in the P-side barrier layer limits the overall current flow and thus, the net injection of carriers into the quantum well. This carrier density in the P-side barrier layer is even lower when the P-barrier composition grade is steeper, as consistent with the lower current achieved for that structure.

Figure 17A:
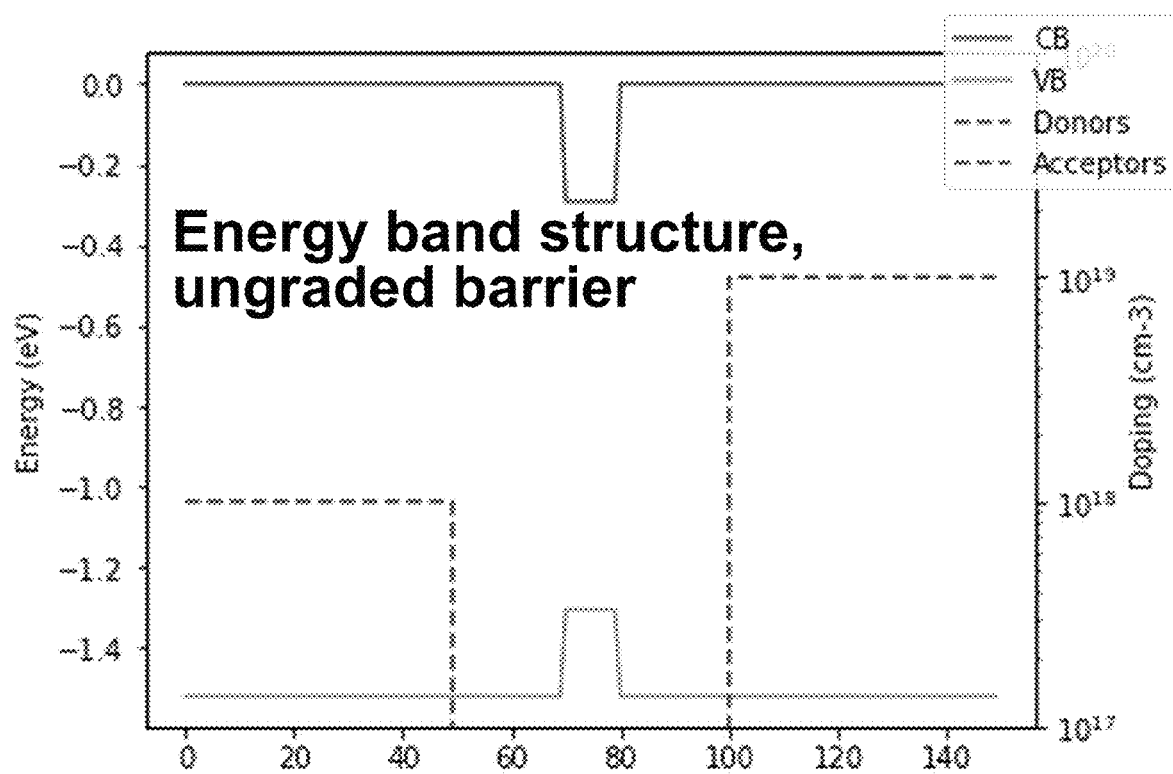
FIGS. 17A, 17B, 17C, 17D, 17E and 17F show energy band diagrams and carrier concentration profiles of exemplary quantum-well structures with lightly doped barrier layers and assuming zero diffusion of the carriers in accordance with the present disclosure.
Figure 17B:
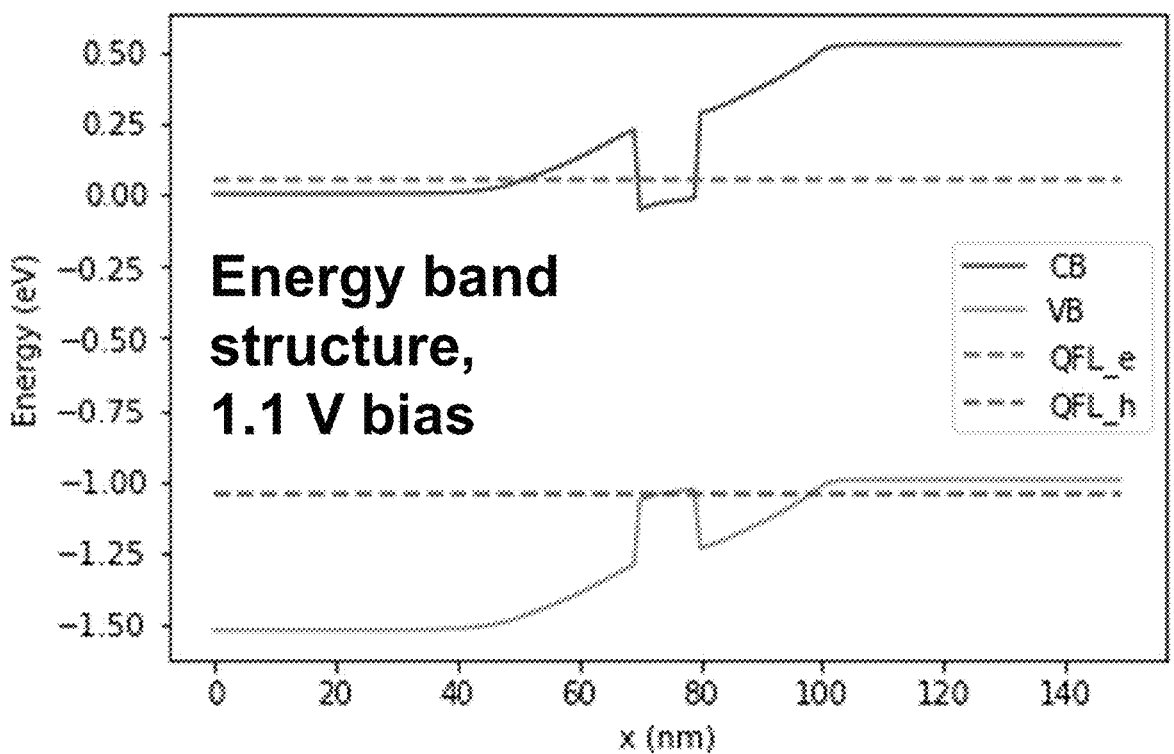
Figure 17C:
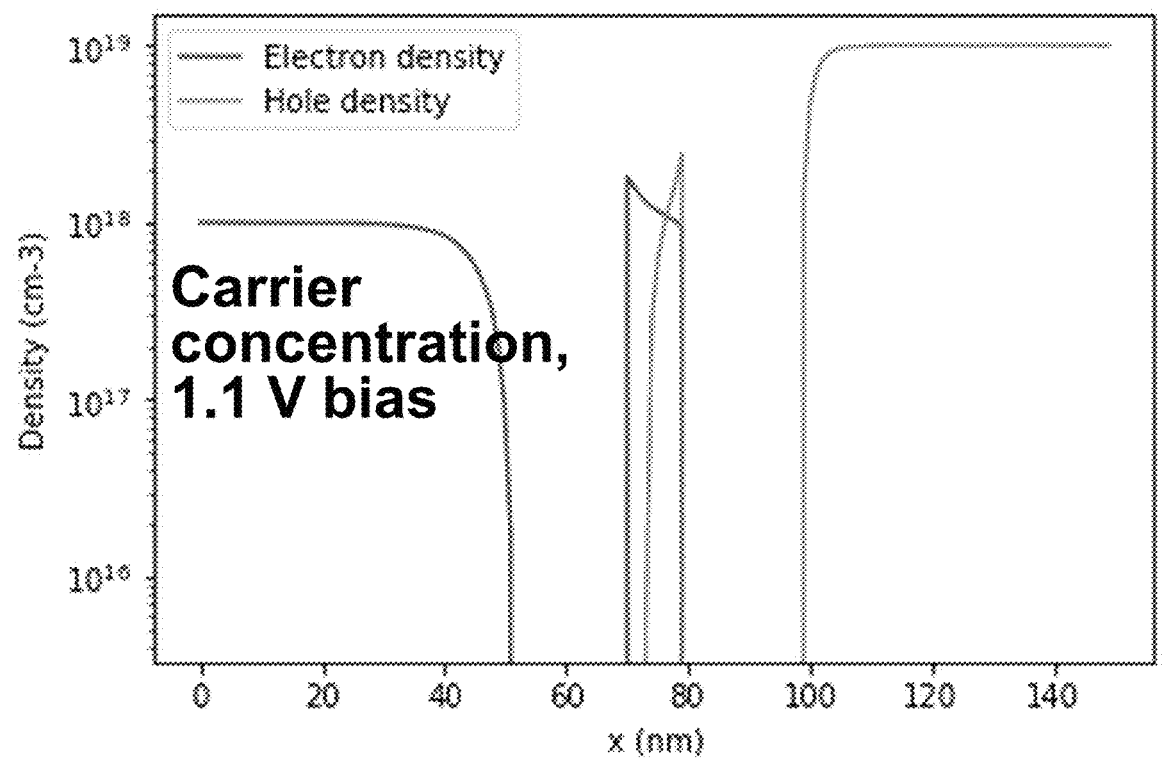
Figure 17D:
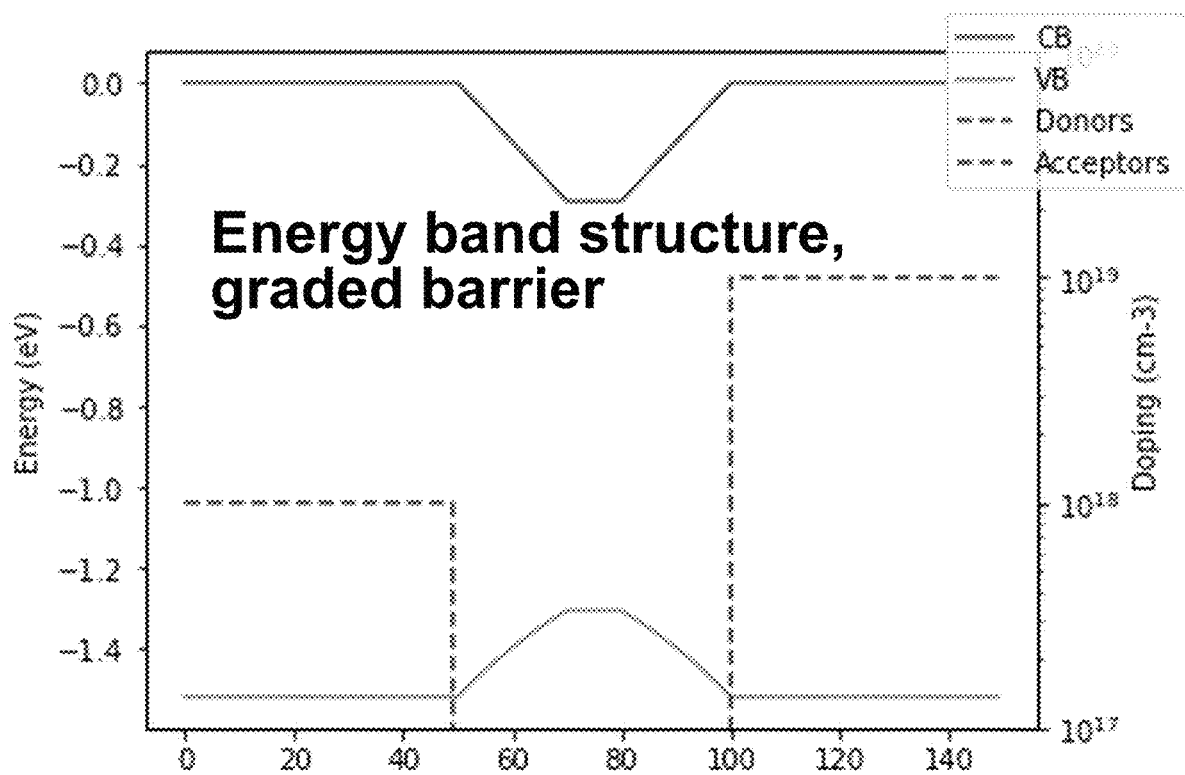
Figure 17E:
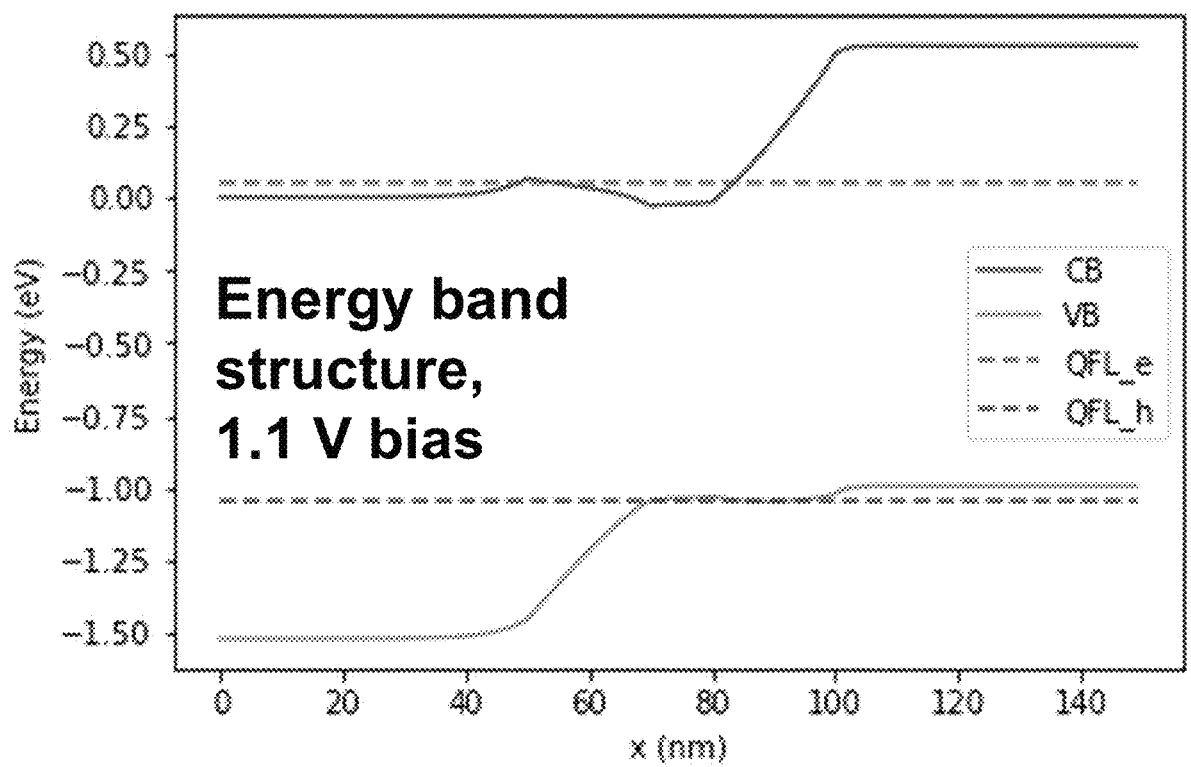
Figure 17F:
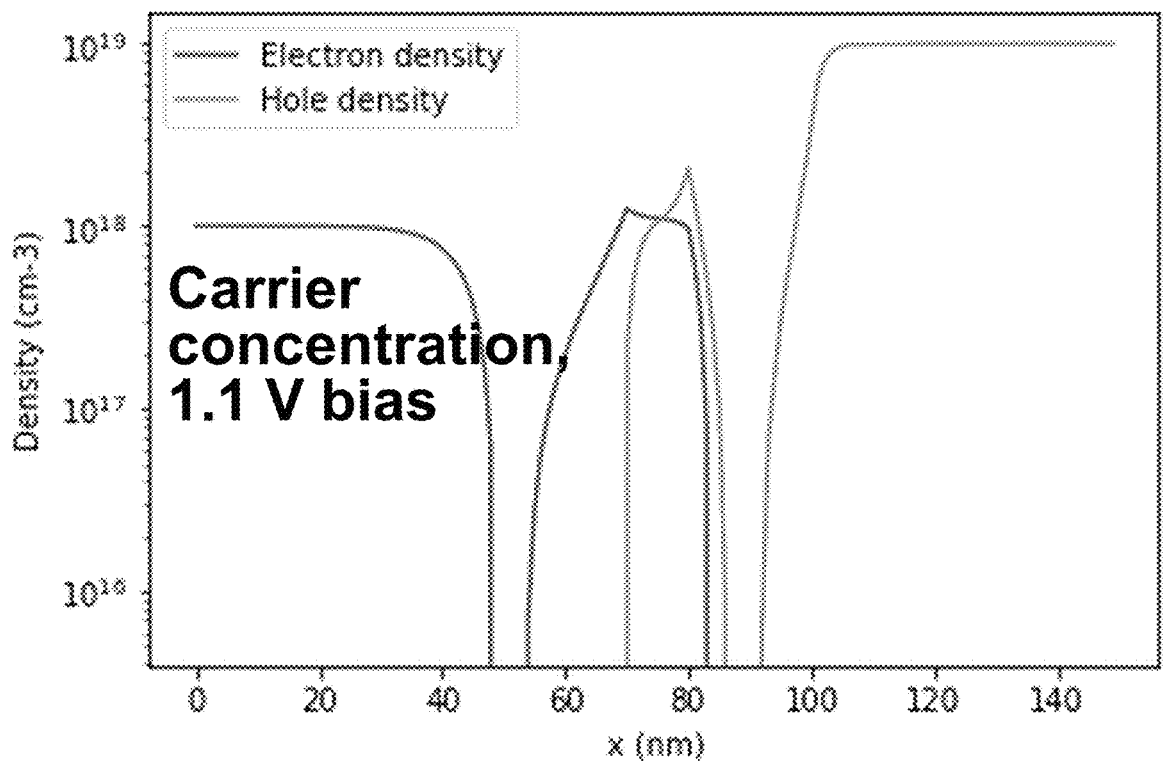

When the temperature is reduced from 30K to near 0K, the diffusion current through the carrier-depleted regions becomes negligible. However, carriers can maybe be transported from the un-depleted regions into the quantum well by tunneling through the depleted regions. FIGS. 17A-17F show results of an analysis for a structure in which 20 nm thick barrier layers on the N-side and on the P-side of a single quantum well are lightly doped. For these plots, the N-side is located toward the left of the quantum well, which is located near the center of each plot, and the P-side is located toward the right. The concentrations of the dopants (the donors and the acceptors) are shown by the dashed lines in FIGS. 17A and 17D. Lightly doped, in this context, is below $10^{17}$ cm$^{-3}$ and possibly below $10^{16}$ cm$^{-3}$, beyond the range depicted in the figures. The barrier-well-barrier combination is sandwiched between heavily doped layers of GaAs, with the n-GaAs having a carrier concentration of 1e18 cm$^{-3}$ and the p-GaAs having a carrier concentration of 1e19 cm$^{-3}$. The results show that having composition-graded barrier layers reduces the energy-barrier for tunneling of the electrons and the holes into the quantum well where they would recombine, as shown by comparing FIGS. 17B and 17E. The composition grades also reduce the spatial thickness of the carrier-depleted regions, both for the electrons and for the holes, as shown by comparing FIGS. 17C and 17F. For the simplistic analysis shown in FIG. 17A-17F, it was assumed that the carrier-recombination rate is zero in the quantum well. Thus, the FIGS. 17C and 17F show an accumulation of both holes and electrons in the quantum well for which the value of x, the horizontal axis of the plots, is between 70 and 80 nm. For an efficient laser or light-emitter, it is desirable to have the tunneling rates equal to or exceeding the carrier-recombination rate. Preferably, the structure is designed to have the tunneling probabilities and tunneling rates of the holes and the electrons approximately the same and also equal to or higher than the anticipated carrier recombination rate. Note that FIGS. 17A-17C are energy band diagrams and a carrier concentration profile for a structure without composition graded barrier layers. FIGS. 17D-17F are energy band diagrams and a carrier concentration profile for a structure with composition graded barrier layers. The composition grade is evident from the sloped valence band and conduction band profiles (solid lines) in the energy-band diagram shown in FIG. 17D, whereas the valence band and conduction band profiles in the barrier layers (extending from 50-70 nm and again from 80-100 nm along the horizontal axis) are not sloped for the energy-band diagram shown in FIG. 17A.

Figure 18A:
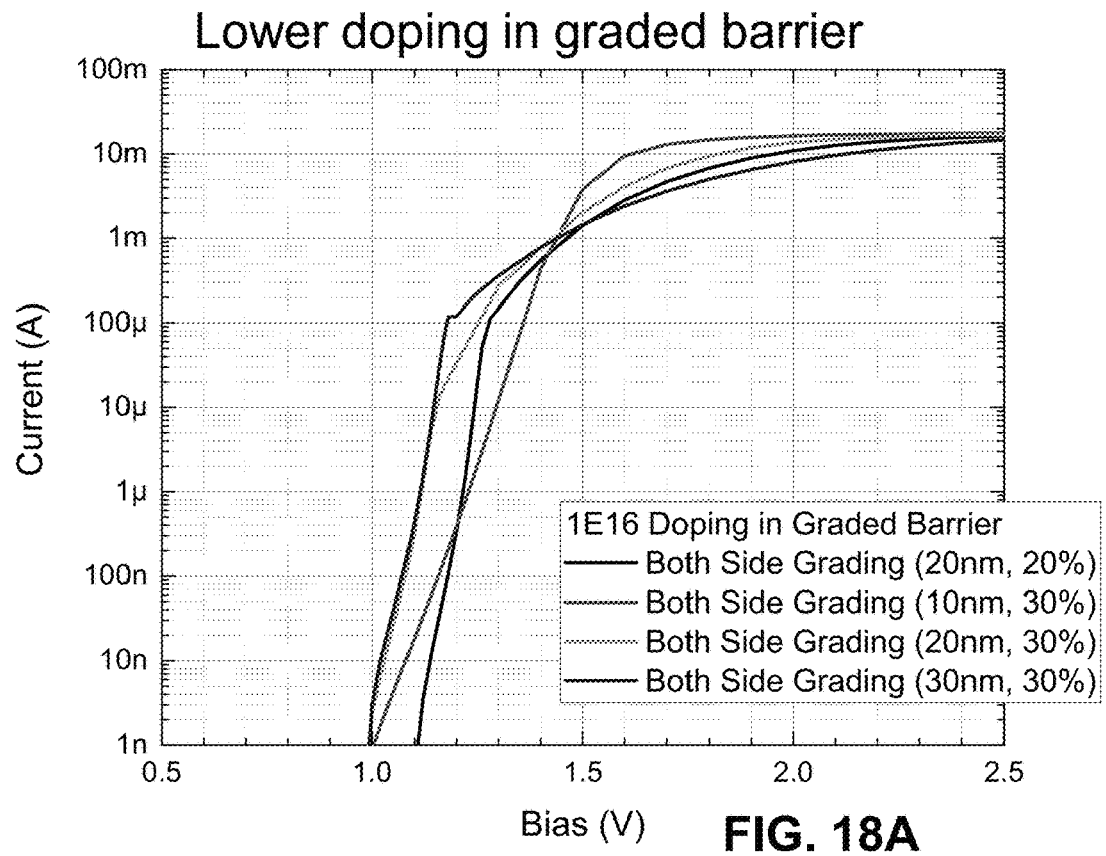
FIGS. 18A and 18B show calculated current vs voltage characteristics of the basic PN diode in the core region of the laser, obtained for different profiles and doping levels of the composition-graded barrier adjacent to the quantum well for 30K temperature in accordance with the present disclosure.
Figure 18B:
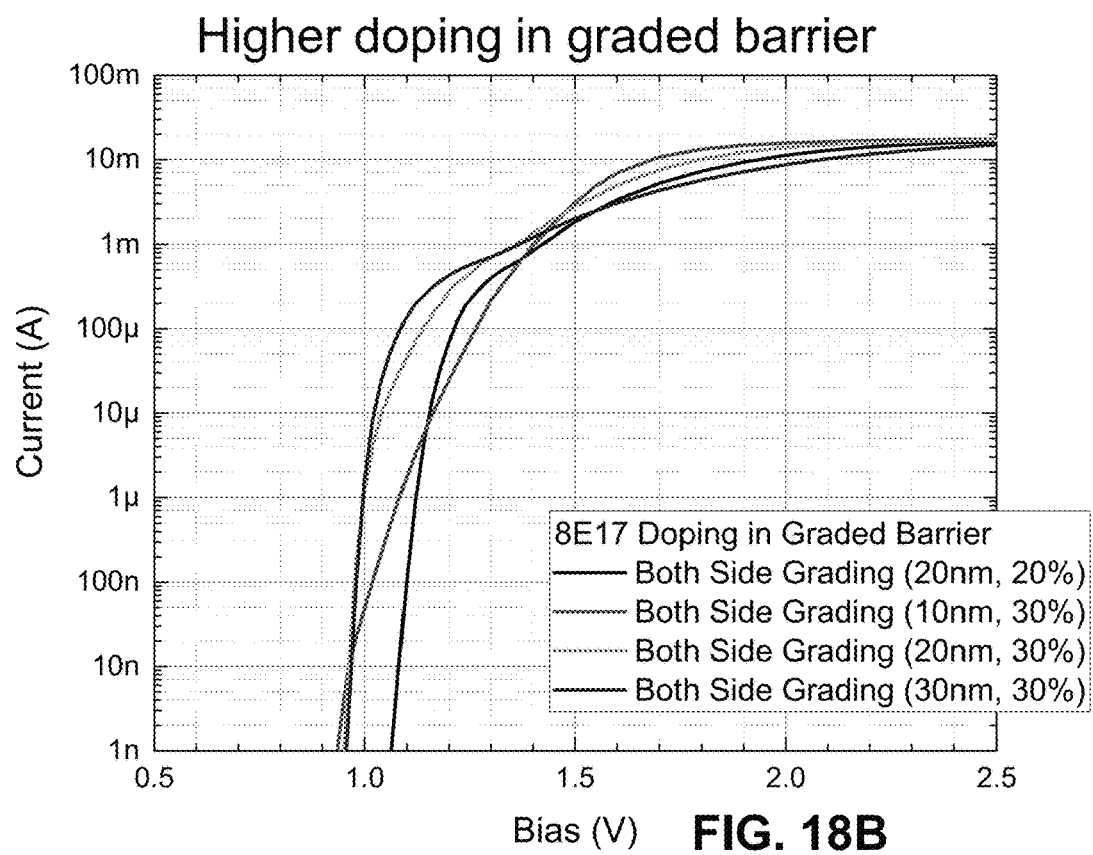

FIGS. 18A and 18B show the effect of increasing the doping level in the composition-graded barrier layers. A comparison of FIGS. 18A and 18B shows that increasing the doping in the barrier layers increases the current achieved for a given bias voltage. This is consistent with both an increase in the diffusion current component and also an increase in the carrier-tunneling probabilities. The figures also show that the differential resistance (the change in current vs the change in voltage) is reduced by increasing the doping in the barrier layers. Thus, a smaller swing in bias voltage would be needed to achieve a current swing between 1 µA and 100 µA, for example. Nevertheless, even for the higher doping level in the barrier layers, a shallower composition grade is preferable to a steeper composition grade for minimizing the differential resistance.

Figure 19:
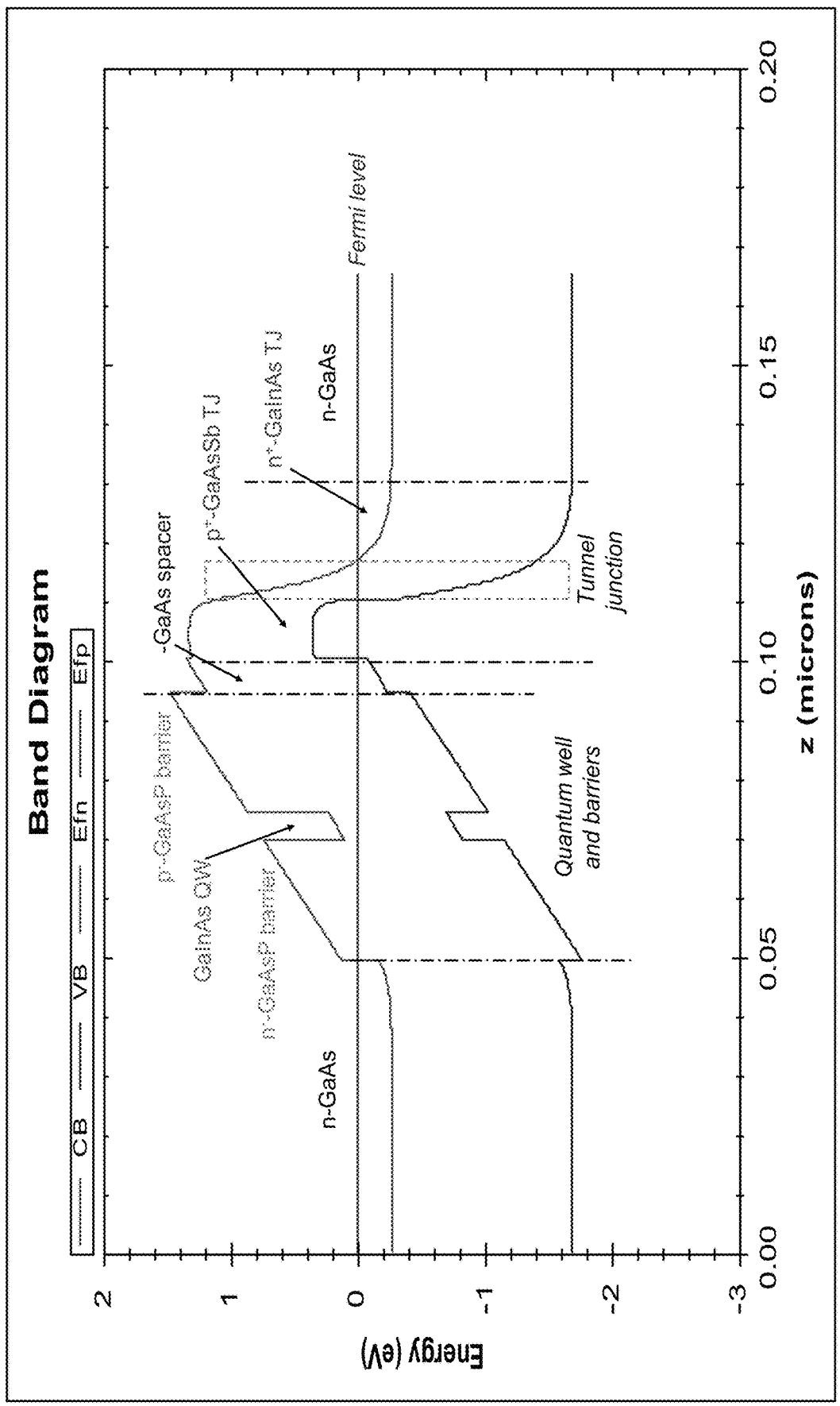
FIG. 19 shows energy band diagrams for a structure with quantum well and barrier layers as well as a tunnel junction with barrier layers with un-graded composition in accordance with the present disclosure.

FIG. 19 illustrates an energy band diagram that includes not only the portion of the structure around the quantum well and barrier layers but also the tunnel junction. In this figure, the N-side of the structure is depicted as being located at the left of the quantum well, and the P-side of the structure is located at the right of the quantum well. The tunnel junction allows both lateral-carrier conduction layers to be N-type, and thereby reduces the series resistance of the device achieved for a given thickness of those lateral-carrier conduction layers. It also allows both metal contacts to be made to N-type material, so the contact resistance also can be lower. For the structure illustrated, the lateral-carrier conduction layers are N-doped GaAs and the (optional) spacer between the tunnel junction and the P-type barrier layer is P-doped GaAs. The tunnel junction in this example is constructed from P-doped GaAsSb and N-doped GaInAs, whose band gaps are smaller than that of GaAs but which are compressive strained materials when grown on GaAs. It is preferable to have a thinner tunnel-junction region, which can be accomplished by increasing the carrier concentrations in the P-doped and N-doped layers of that tunnel junction (TJ) structure. The GaAsP barrier material shown in this illustration has an even larger band gap than GaAs and has tensile strain, which could serve to compensate for the compressive strain of the InGaAs quantum well material and the materials for the tunnel junction. However, a larger valence-band energy step, as provided by a GaAsP barrier, can be detrimental to the transport of holes from the tunnel junction to the quantum well. Also, having a thicker P-doped GaAs spacer could further impede the transport of holes from the tunnel junction to the quantum well. To facilitate the transport of the electron and hole carriers from the N-doped GaAs layers into the quantum well, it is beneficial to grade the composition of materials around any steps in the band-edge energy that are present along the path of those carriers to the quantum well. For example, in the structure of FIG. 19, the electrons face a conduction-band energy step that would hinder their transport from the n-GaAs layer into the n-GaAsP barrier layer adjacent to the quantum well. A grade in the material composition from GaAs to GaAsP at that interface would be desirable. Likewise, the holes face a valence-band energy step at the junction between the $p^+$-GaAsSb layer of the tunnel junction structure and the p-GaAs spacer and another energy step at the junction between the p-GaAs spacer and the p-GaAsP barrier layer. Grades in the material composition from GaAsSb to GaAs and again from GaAs to GaAsP would be desirable to reduce these impediments to the transport of holes to the quantum well.

Figure 20A:
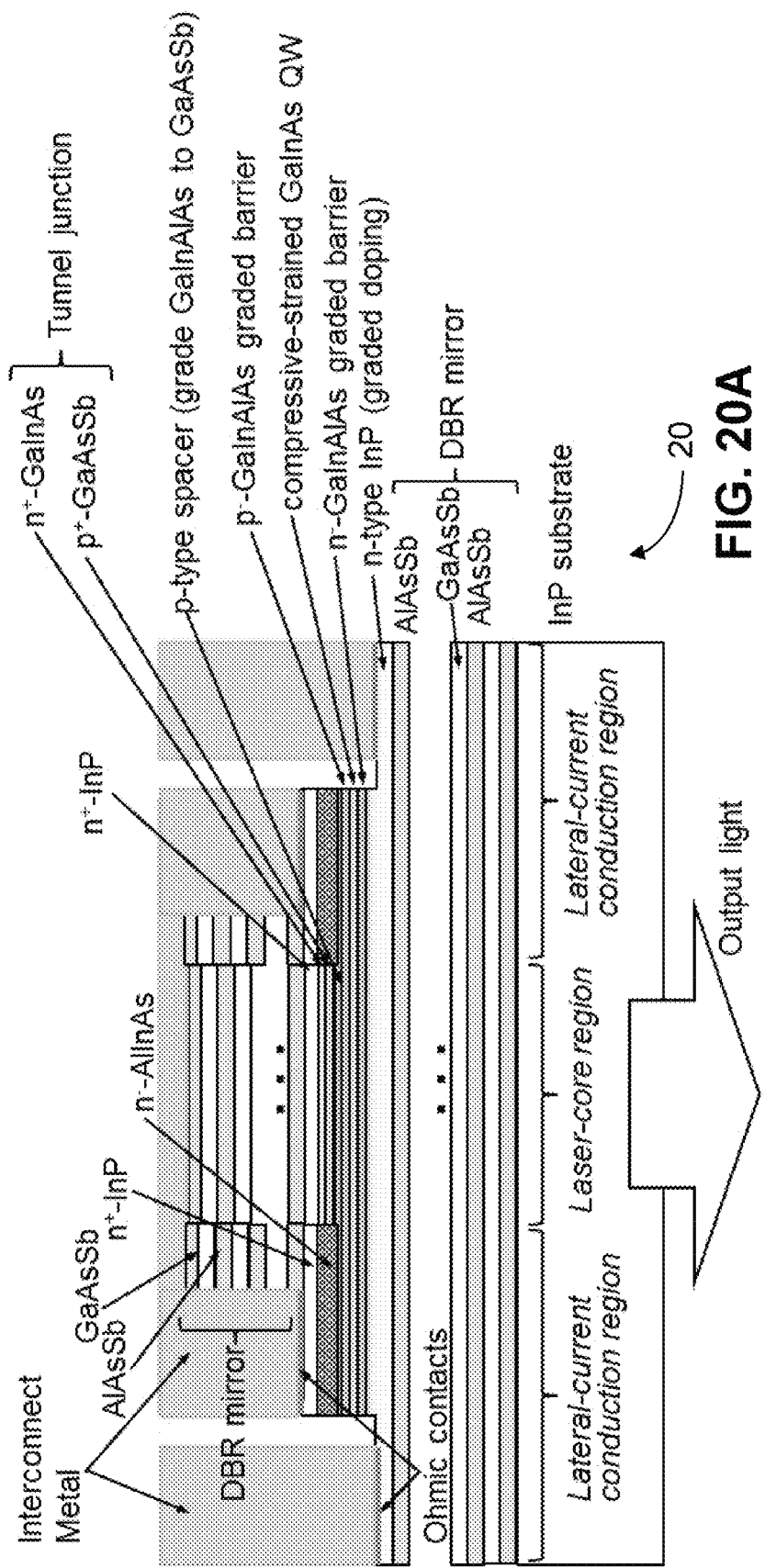
FIG. 20A shows a cross-section of a VCSEL structure that has composition-graded GaInAlAs barrier layers sandwiching a single InGaAs quantum well, grown on InP with the features labeled
Figure 20B:
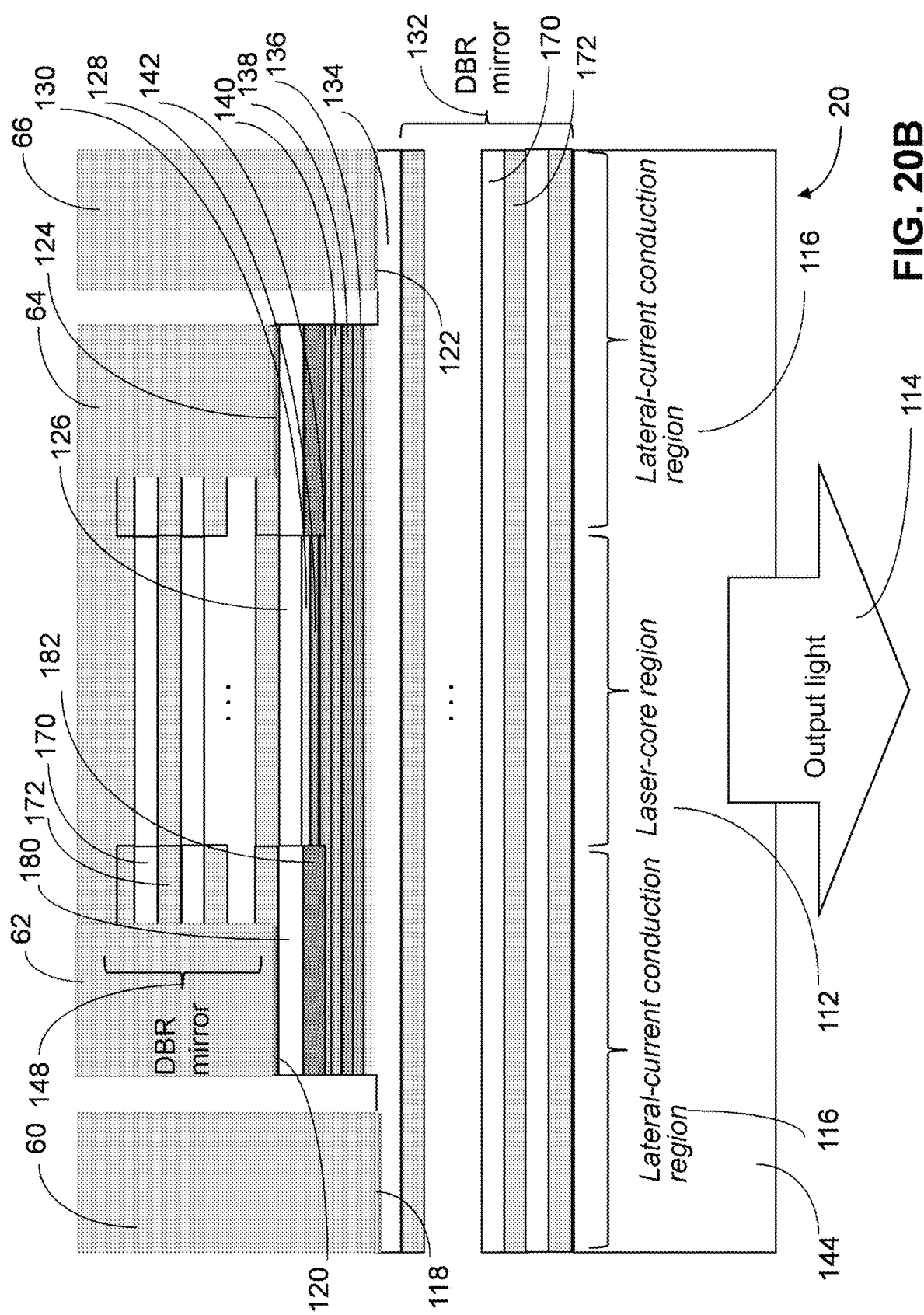
FIG. 20B is the same as FIG. 20A with further reference numbers in accordance with the present disclosure.

FIGS. 20A and 20B show a diode structure 20 of the present disclosure that is grown on an InP substrate 144, rather than the GaAs substrate 44 for the diode structure 10 of FIGS. 10A and 10B.

For laser and light-emitting diode structures grown on InP substrates, in contrast to the structures grown on GaAs substrates, it is possible to obtain materials for barrier layers that are lattice matched to InP. Thus, those barrier layers may be thicker, if desired, without exceeding a critical thickness for avoidance of dislocations. In fact, a composition-graded barrier layer having graded bandgap energy can be achieved while still remaining lattice match to InP. Also, it is possible to obtain barrier layer materials that are tensile strained, if desired for strain compensation since the material of the quantum well is compressive strained, but whose valence-band energy is not much greater than that of a lattice-matched barrier material. Narrow-bandgap P-type and N-type materials for a tunnel junction also may be lattice matched to InP. How great the valence-band energy in a tensile-strained barrier layer can be depends on the details of the structure and also on the operating temperature. Greater valence-band energy results in a potential barrier to the transport of holes into the quantum well, which would be increasingly more difficult to overcome at lower and lower operating temperatures.

FIGS. 20A and 20B show an example of a VCSEL structure that is compatible with InP substrates. This laser has a core region 112 through which the current is directed and in which the light is generated and propagates. On the two lateral sides of the core region 112 (as depicted in this cross-sectional illustration) are lateral-current conducting regions 116, which contain the electrical contacts and through which the carriers injected at the contacts flow from those contacts to the core region. The VCSEL is typically formed in two or more epitaxial growth processes. First, the structure in the core region 112 up through the n-type InP conducting layer 126 above the tunnel junction 128, 130 is grown. This lower portion of the core region 112 includes a GaAsSb/AlAsSb DBR mirror 132, a n-type InP lateral-current conducting (and contact) layer 134 (possibly having graded doping profile), a composition-graded n-type GaInAlAs barrier layer 136 directly abutting a quantum well 138, the single strained InGaAs quantum well 138, a composition-graded p-type GaInAlAs barrier layer 140 directly abutting a quantum well 138, an optional p-type spacer layer 142 (if present), a $P^+$ GaAsSb portion 128 of the tunnel junction, an $N^+$ GaInAs portion 130 of the tunnel junction, and an n-type InP lateral-current conducting layer 126. The material with the largest conduction-band energy is the n-type InP of the lateral-current conduction and contact layers 126, 134. The material with the largest valence-band energy is the p-type GaInAlAs of the spacer layer 142, which injects holes toward the quantum well 138. Thus the disclosed VCSEL structure presents energetically down-hill flows for both the electrons and the holes toward the quantum well 138, without energy barriers to that carrier flow other than at the tunnel junction 128, 130. The n+ InP layer 180 and the n$^-$-AlInAs layer 182 are part of the lateral-current conduction region 116. The lateral-current conduction is provided by the n$^+$-InP and the n-type (graded doping) InP layers 126, 134. The AlInAs layer 182 shown in diode structure 20 of FIG. 20B impedes or blocks the flow of carriers in the vertical direction through the portion of the quantum well 138 in the lateral-current conduction region 116 and instead promotes the lateral flow of carriers between the contacts and the core region 112 and is part of the lateral-current conducting region 116.

Figure 21A:
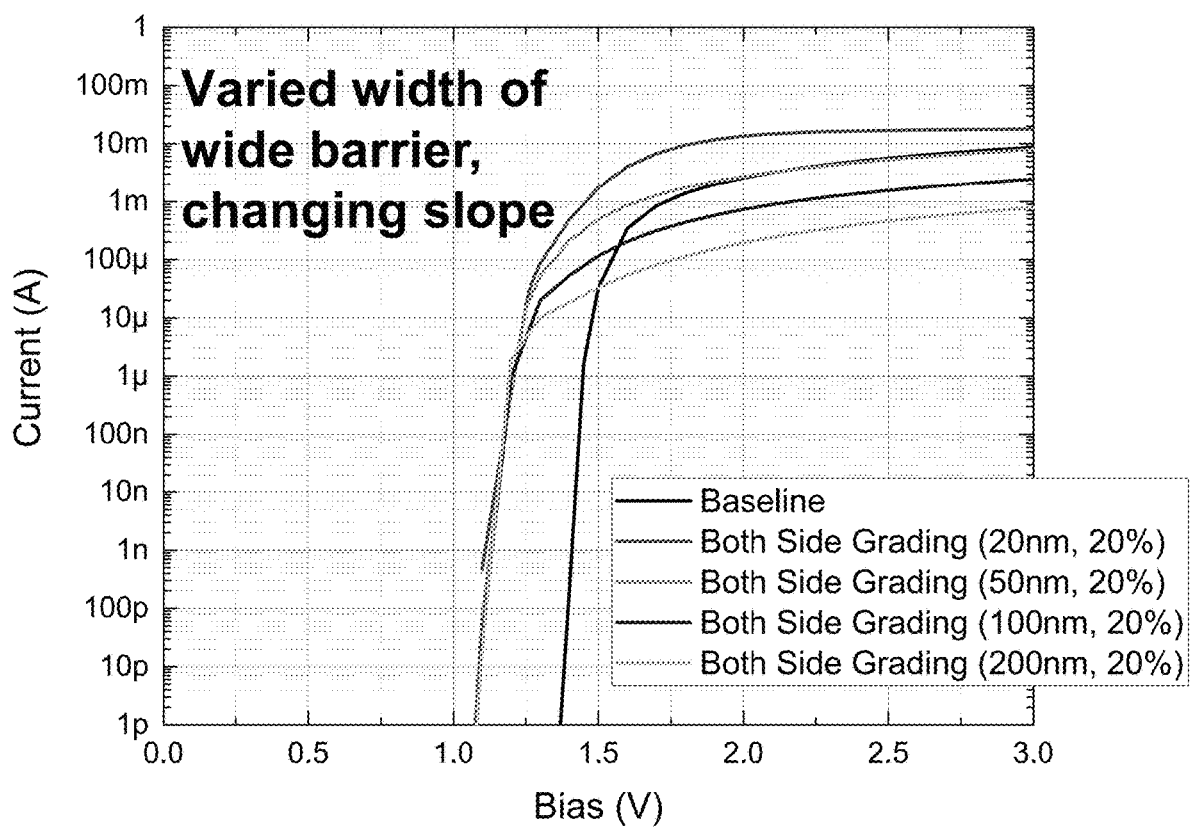
FIGS. 21A and 21B show calculated current vs voltage characteristics of the basic PN diode in the core region of the laser, obtained for different profiles of the composition-graded barrier adjacent to the quantum well for 30K temperature in accordance with the present disclosure.
Figure 21B:
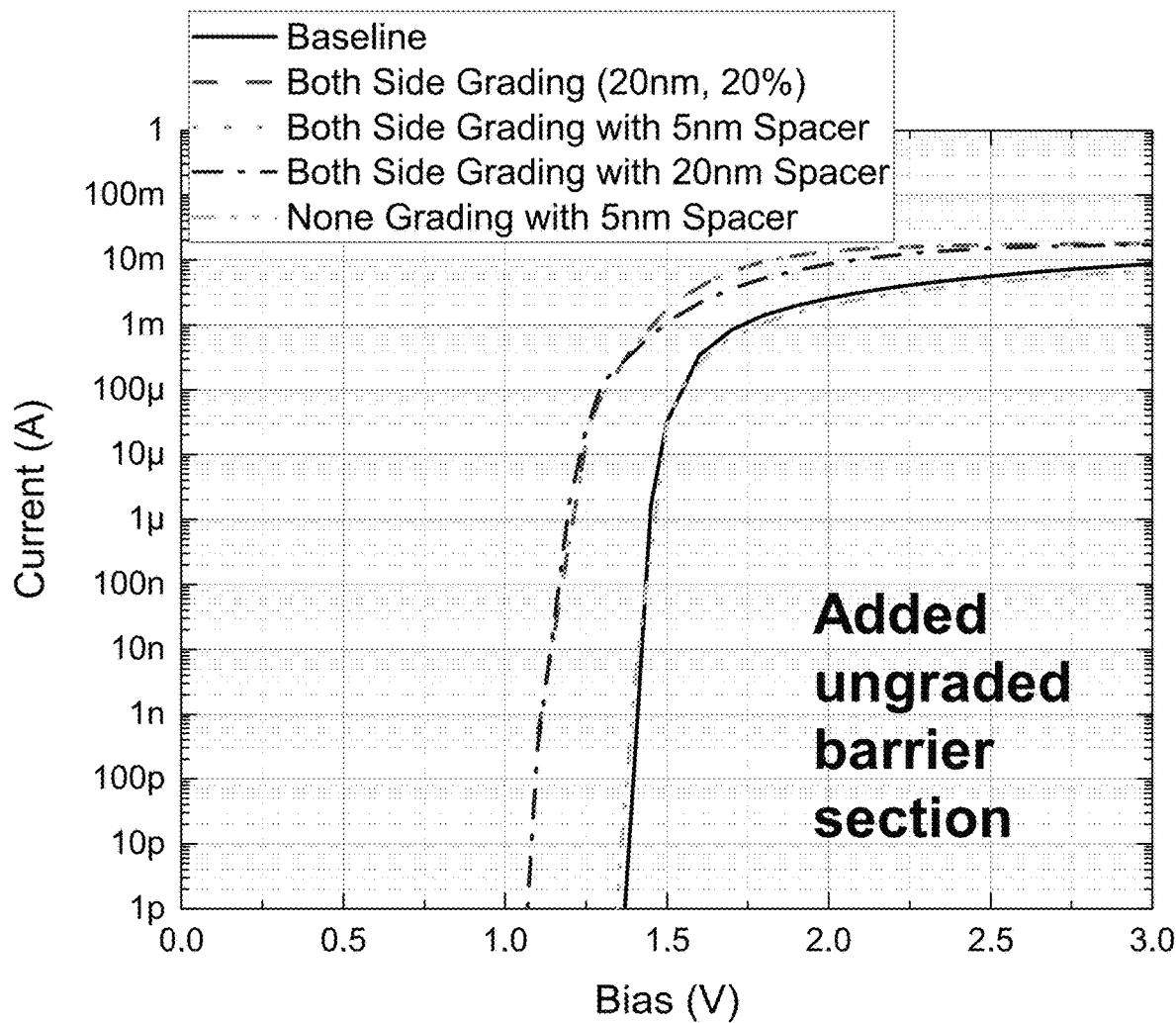

FIGS. 21A and 21B illustrate other effects of the composition-grading profile that may be implemented in the barrier layers abutting the quantum well. The separate-confinement heterostructure (SCH) regions of prior quantum-well lasers are generally very wide, and could be as wide as approximately one-half wavelength of the light in the VCSEL material (~130-170 nm for GaAs-based VCSELs and even larger for InP-based VCSELs) for the part of the SCH region on each side of the quantum well. Note that although these particular simulation results are for the material parameters of a GaAs-based device, the lessons learned can be applied readily to an InP-based device. FIG. 21A shows that if the graded barrier layer is made wider (and thus the grading profile is shallower), the maximum current for which the composition-grading reduces the bias voltage swing becomes lower. The current through the barrier regions has contributions from the diffusion of carriers and from the E-field driven drift of carriers. Spreading the composition grade over a larger width (or thickness of the barrier layer) produces a weaker electric field in that barrier layer and thus reduces the drift-current component. Also, increasing the width of the depleted barrier layer results in a smaller carrier-concentration gradient and thus reduces the diffusion-current component. If the current swing is from 1 µA to 100 µA for the exemplary laser at 30K temperature, FIG. 21A shows that both diffusion and drift make significant contributions to the overall modulation-current swing of the device. If the need is to swing the current between 1 µA and 100 µA, the results of FIG. 21A indicate that the barrier width should be <50 nm and preferably be 20 nm or smaller in order to minimize or reduce the associated voltage swing, for the assumed barrier-layer doping level of 1e16 cm$^{-3}$.

The range of barrier widths (20 nm-200 nm) considered in the data of FIG. 21A would exceed the allowed critical thickness (for maintaining the strain and avoiding relaxation of the lattice-mismatched material and the consequent formation of defects in the crystal) if that example were applied to the strained InGaAs barrier and strained InGaAs quantum well materials in a GaAs-based VCSEL, such as the one illustrated in FIG. 10. However, for lasers based on InP substrates, as shown in FIG. 20, the composition-graded barriers could be formed in materials that are lattice-matched to InP and thus are not strained. The quantum well of an InP-based laser is preferably strained, to improve the differential gain of the laser. For InP-based lasers, the composition-graded barriers may be much wider since their maximum widths are not necessarily governed by critical-thickness limitations.

FIG. 21B shows that a multi-section barrier layer comprising a combination of a thin (or narrow) ungraded and lightly doped section (designated as "spacer" in this figure) abutting the quantum well and a composition-graded section abutting the heavily-doped layer (the P-type spacer layer, adjacent to the tunnel junction, or the lateral-current conducting layer) does not significantly degrade the modulation-voltage swing or achievable modulation-current swing over most of the current range of interest. For the particular example considered in this simulation, the presence of the additional ungraded portion of the barrier, which has the same doping level as the graded portion of the barrier, becomes significant when the current is 200 μA or higher. Thus, for the lower current levels, it may be more preferable to have the composition grade present in the portion of the barrier near which there is a large decrease in the doping level (such as near the heavily doped spacer and lateral-current conducting layers) than in the portion of the barrier near which the doping level remains constant or has a smaller decrease (such as adjacent to the quantum well).

Figure 22A:
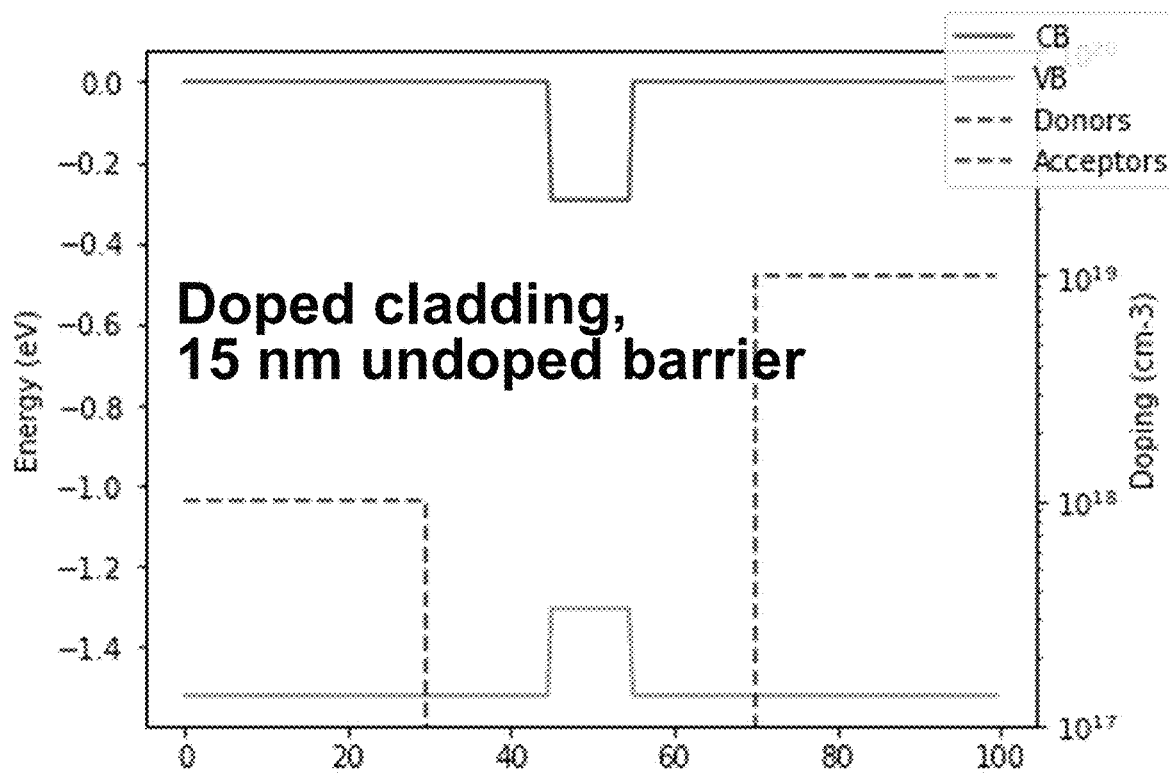
FIGS. 22A, 22B, 22C, 22D, 22E and 22F show examples of quantum-well structures with lightly doped barrier layers analyzed and the dependence of the electron and hole tunneling probabilities in those structures on the applied voltage in accordance with the present disclosure.
Figure 22B:
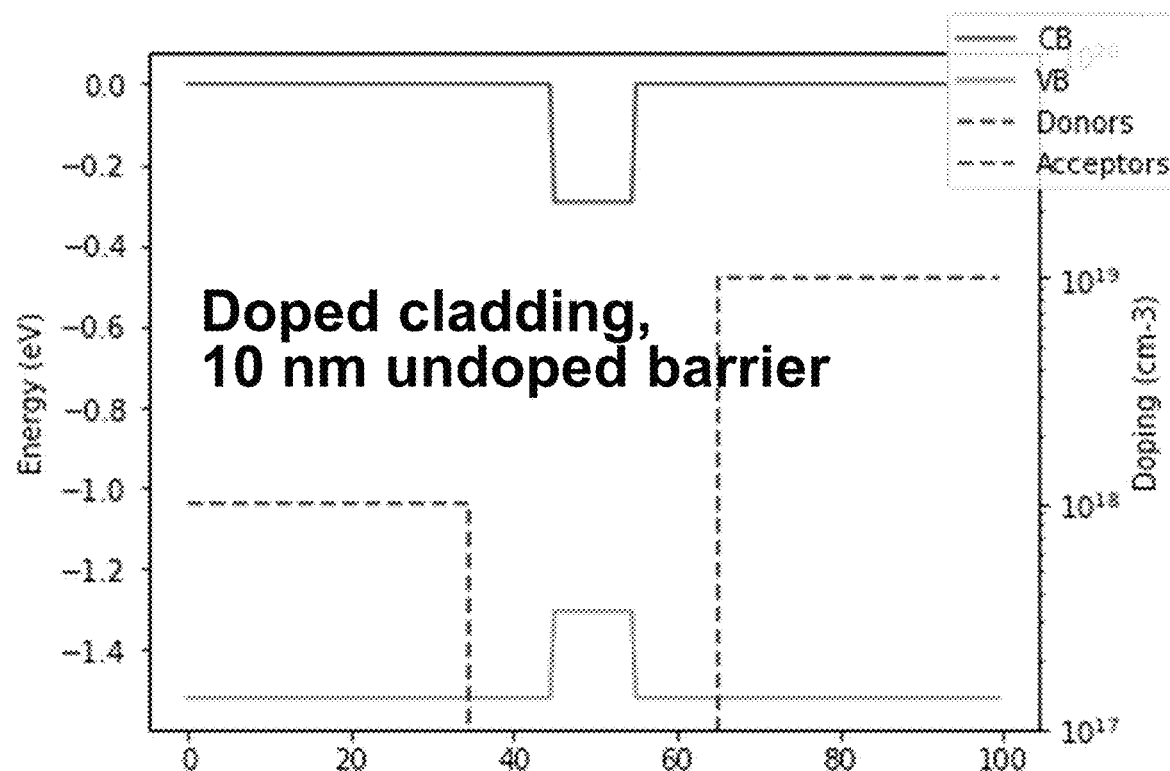
Figure 22C:
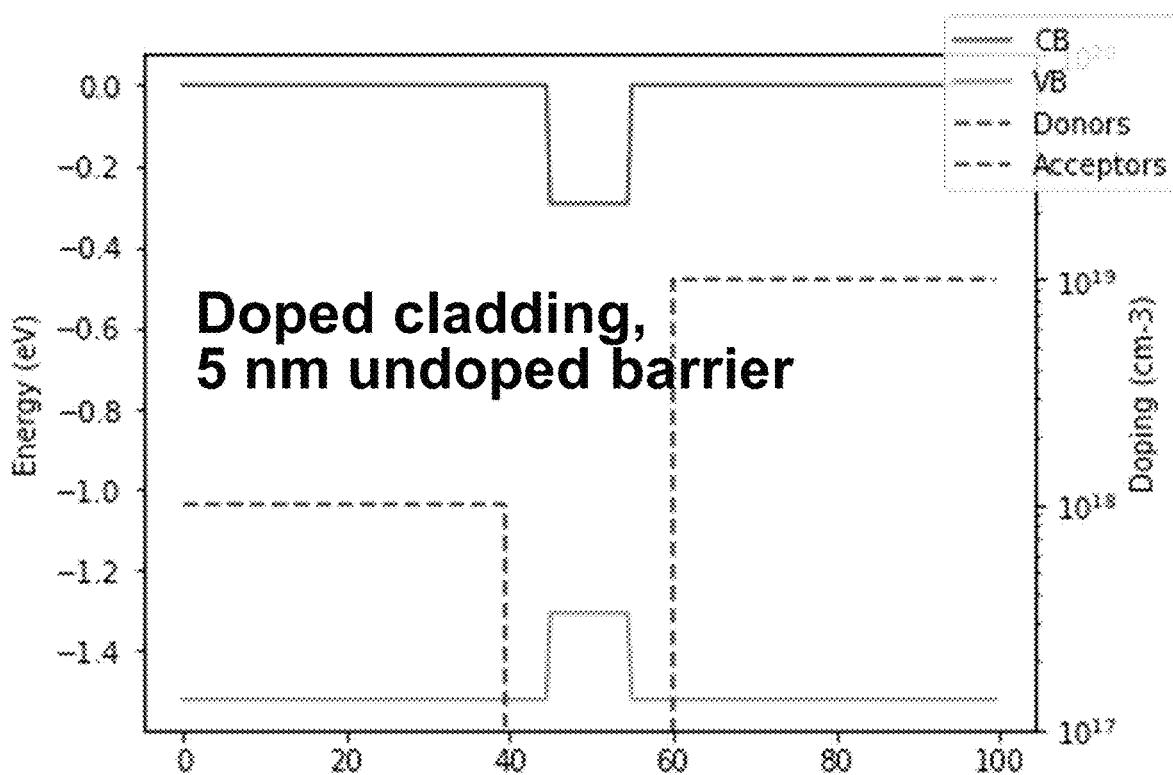
Figure 22D:
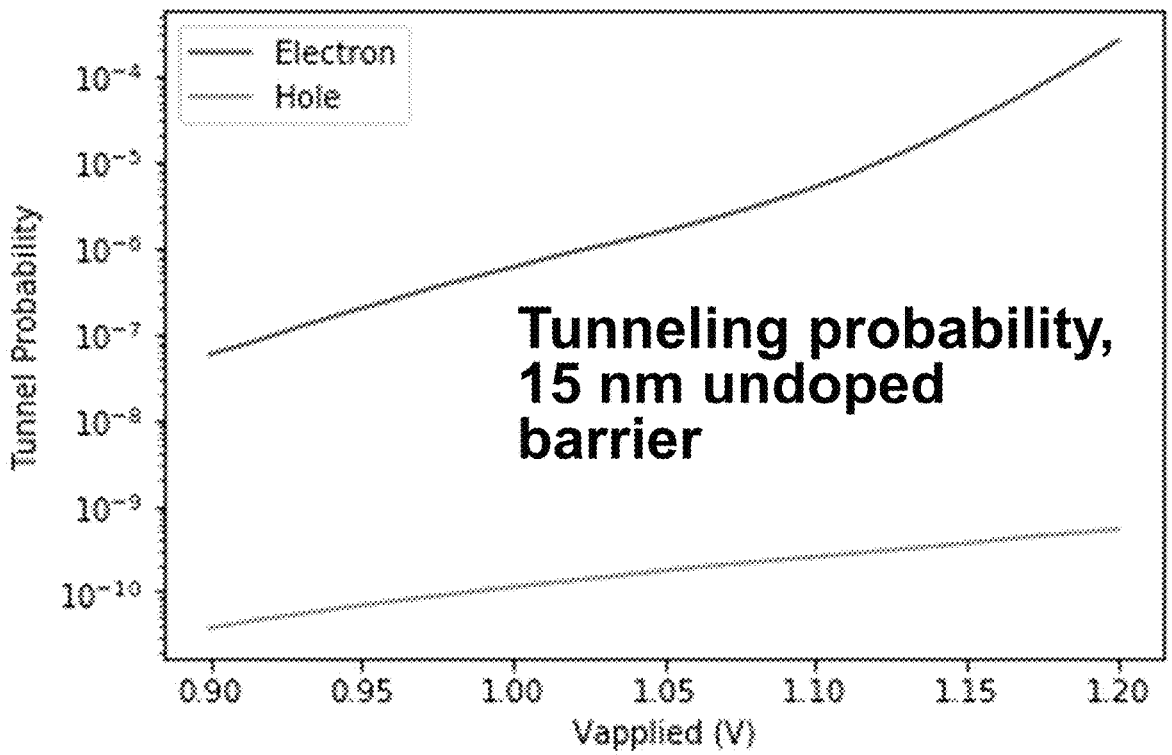
Figure 22E:
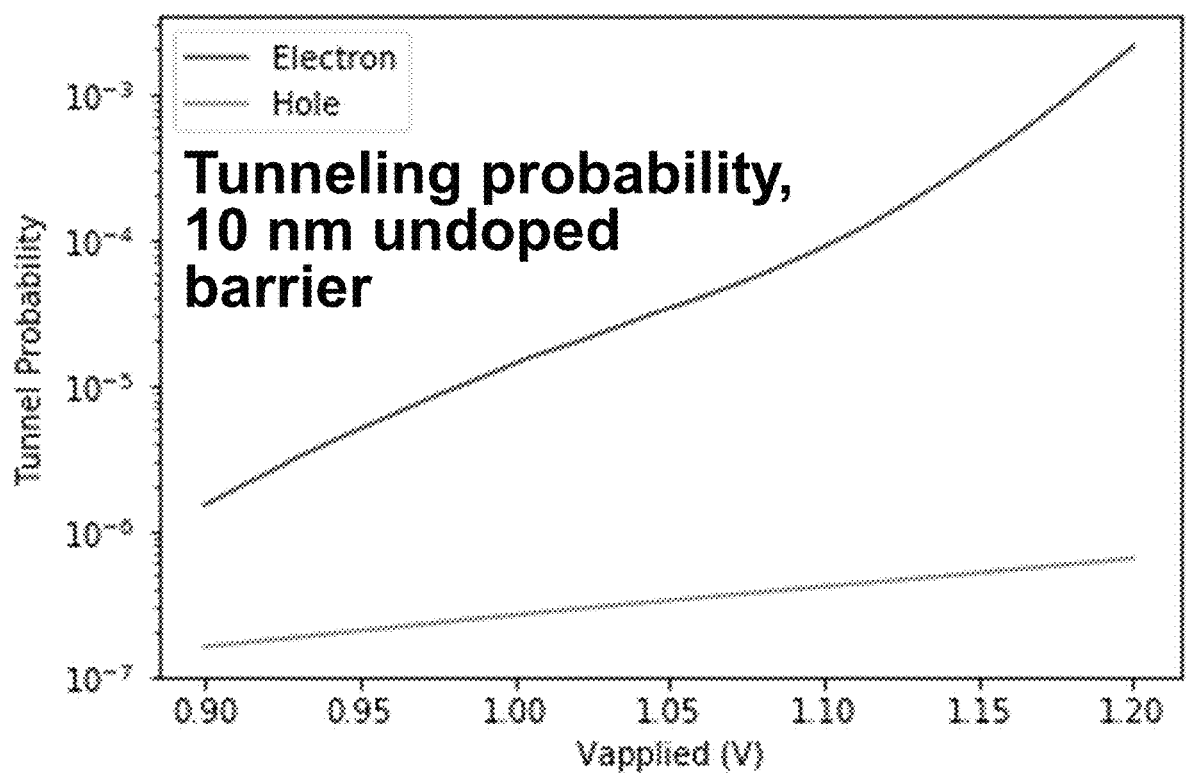
Figure 22F:
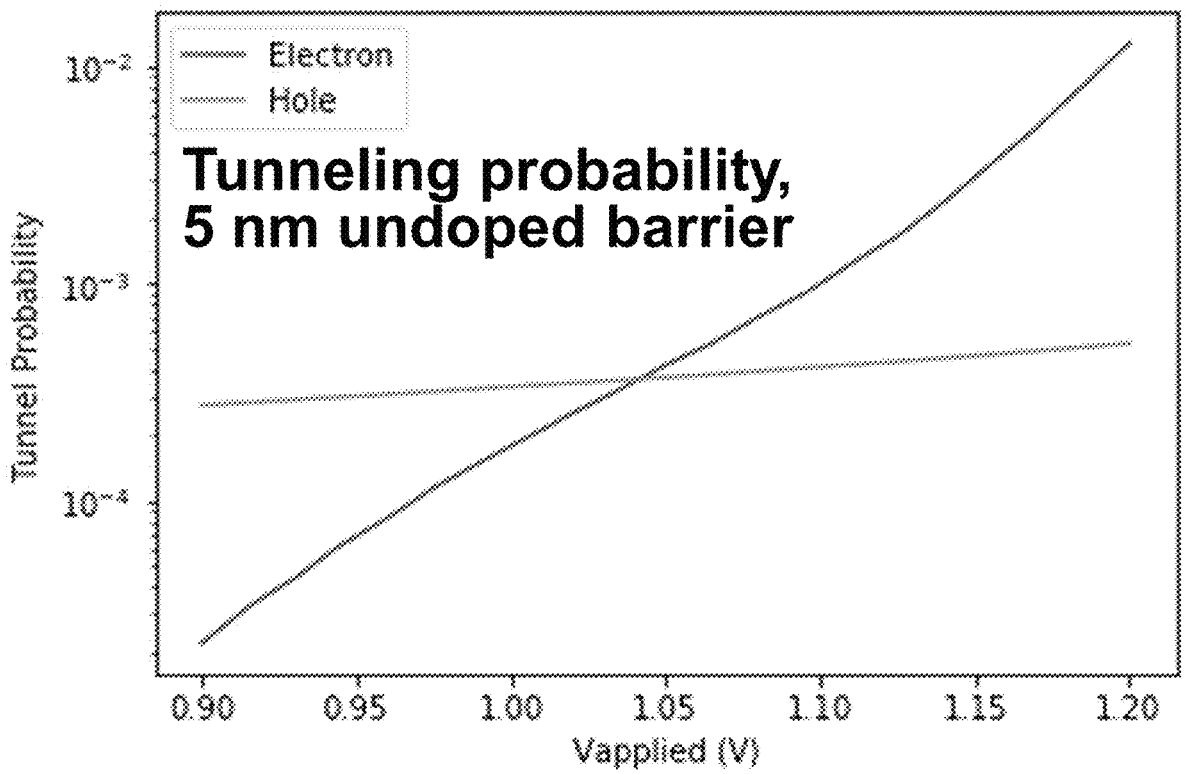

To further illustrate the constraints on the composition grading profile and the doping profile in the barrier layers, simplified laser core-region structures were analyzed for which the diffusion current is ignored and also any recombination of the holes and electrons is ignored. FIGS. 22A-22F compare three different designs of barrier layers that are undoped (or whose doping level is much lighter than the doping level of the lateral-current conducting layers or the spacer adjacent to them. For the simulations performed, the change in the doping levels (indicated by the dashed lines) is more than two orders of magnitude, but this is just one example). These designs have different widths for their N-type and P-type barrier layers. The results show that the two undoped (or lightly doped) barrier layers abutting the quantum well present energy barriers to the transport of electrons and holes into the quantum well. As the width of those barrier layers is reduced (from 20 nm to 10 nm and again to 5 nm), the probabilities of having the electrons and holes tunnel through those energy barriers increase. For these specific examples, with the P-side barrier layer having the same width as the N-side barrier layer, the tunneling probability for the electrons is much higher than the tunneling probability for the holes. The tunneling probability for the holes (the heavy holes are considered in these cases because the InGaAs quantum well is compressively strained) is lower because the effective mass of those heavy holes is much larger than the effective mass of the electrons. Although the hole concentration in the heavily P-doped region adjacent to the P-type barrier layer is an order of magnitude higher than the electron concentration in the heavily N-doped region adjacent to the N-type barrier layer, that difference in doping levels and carrier concentrations is not sufficient to make the tunneling probabilities for the electrons and holes equal unless the barrier layer is very thin (e.g., 5 nm thickness as illustrated in FIG. 22F). Changes in the applied voltage produce a much greater change in the electron tunneling probability than in the hole tunneling probability, because the effective mass of the electrons is much smaller than the effective mass of the heavy holes, both of which are the main contributors to the light emission in the compressively strained quantum well.

Figure 23A:
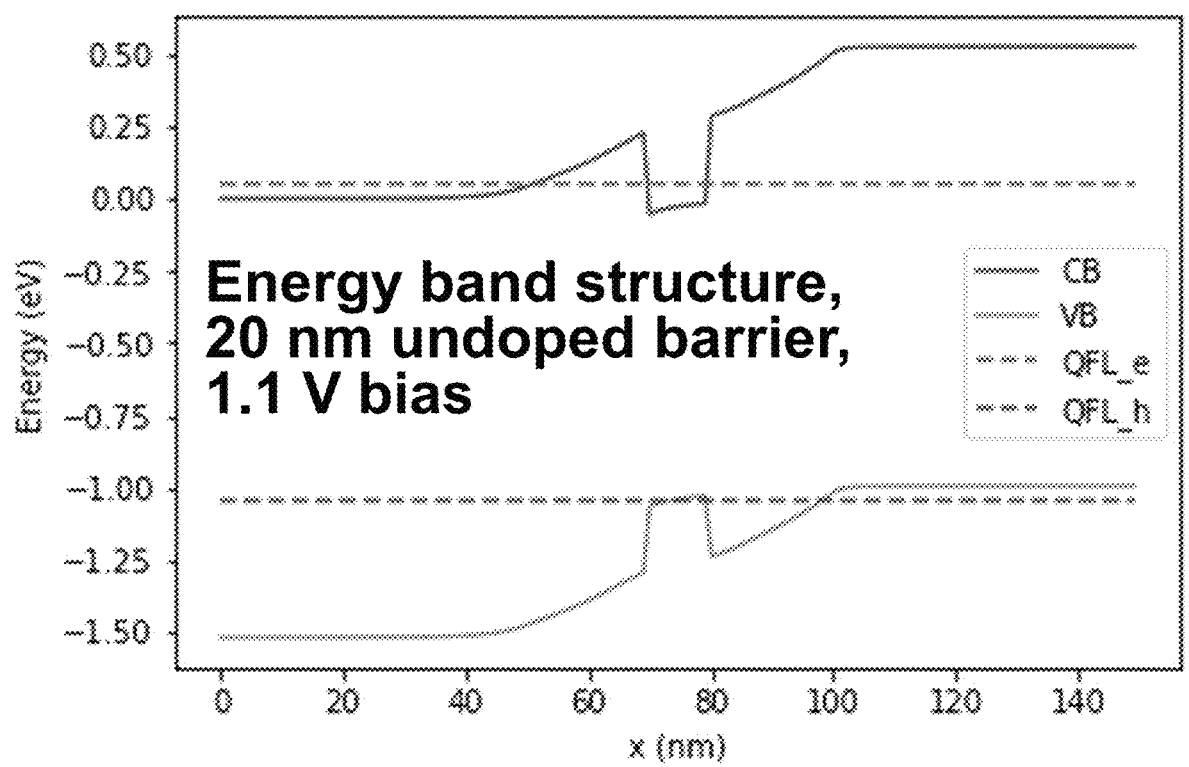
FIGS. 23A, 23B, 23C, 23D, 23E and 23F show energy band diagrams and carrier concentration profiles of exemplary quantum-well structures with lightly doped barrier layers and assuming zero diffusion of the carriers as well as zero recombination in accordance with the present disclosure.
Figure 23B:
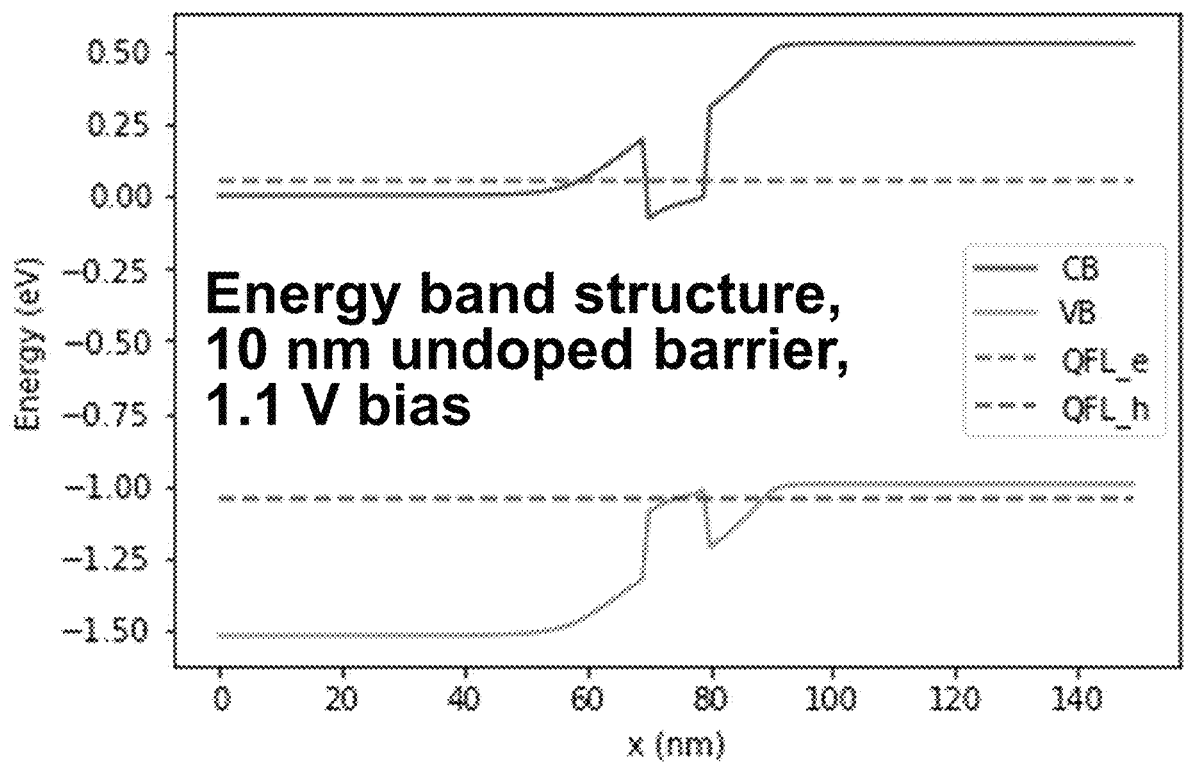
Figure 23C:
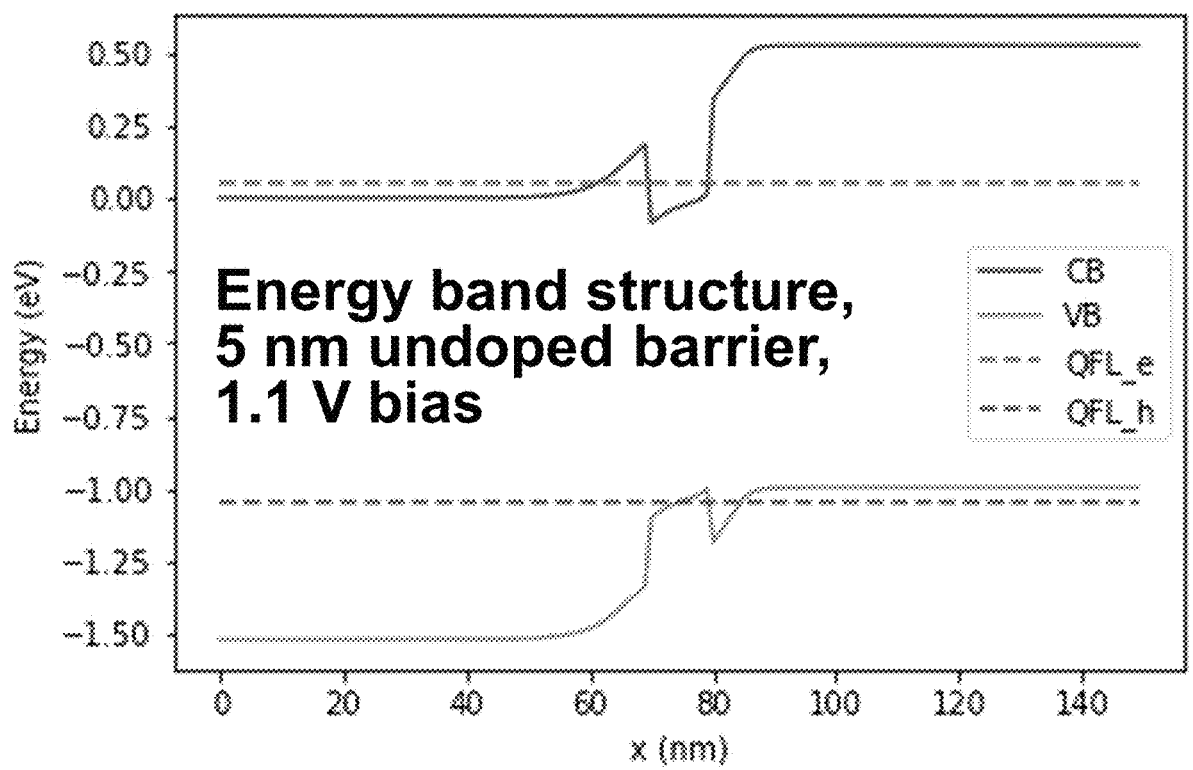
Figure 23D:
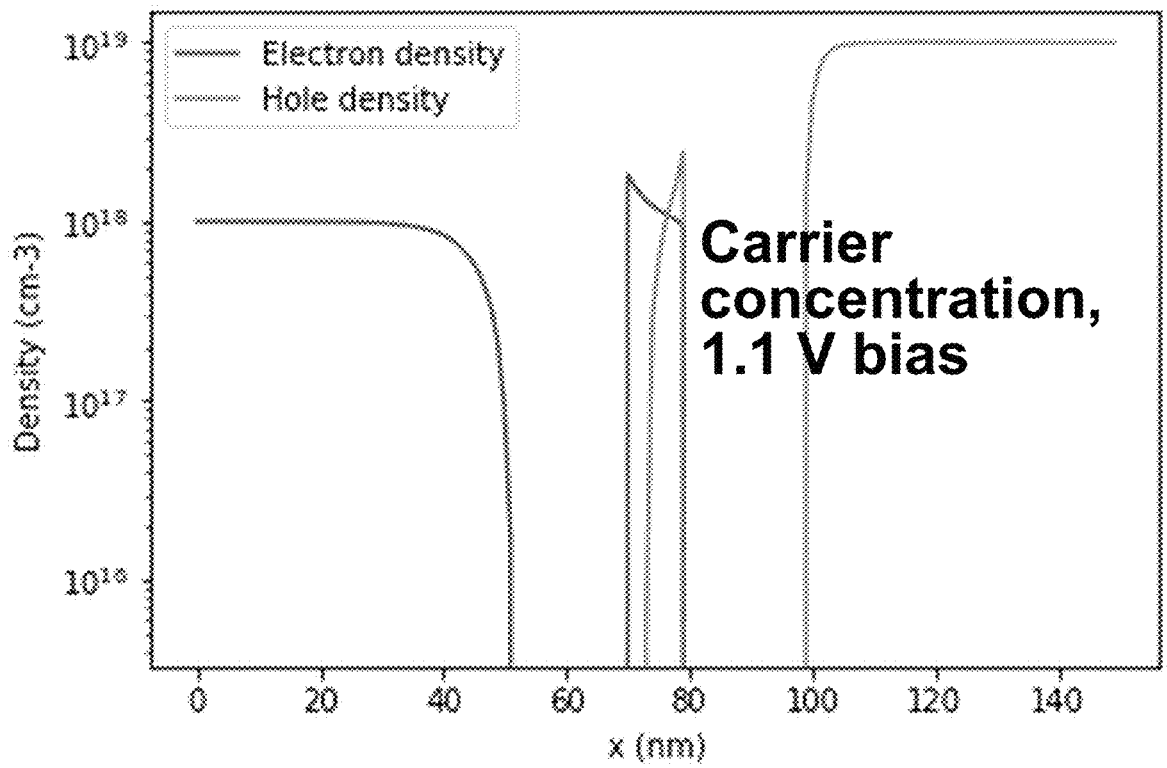
Figure 23E:
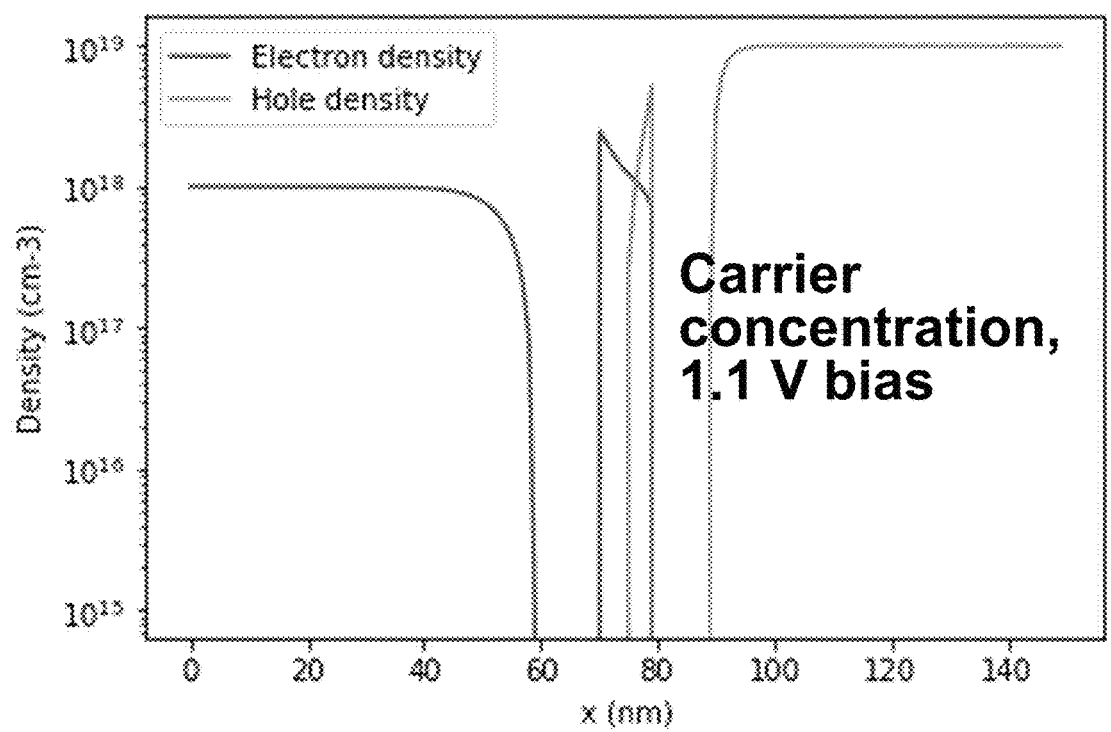
Figure 23F:
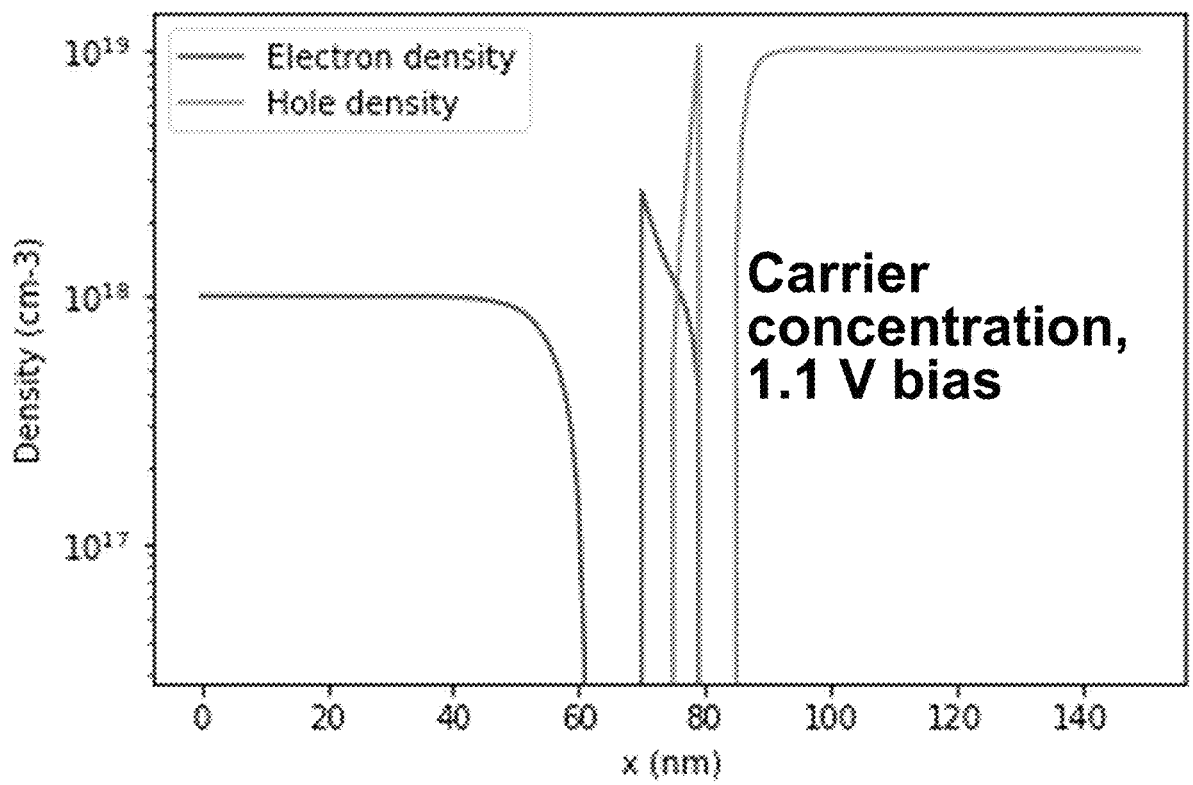
Figure 24A:
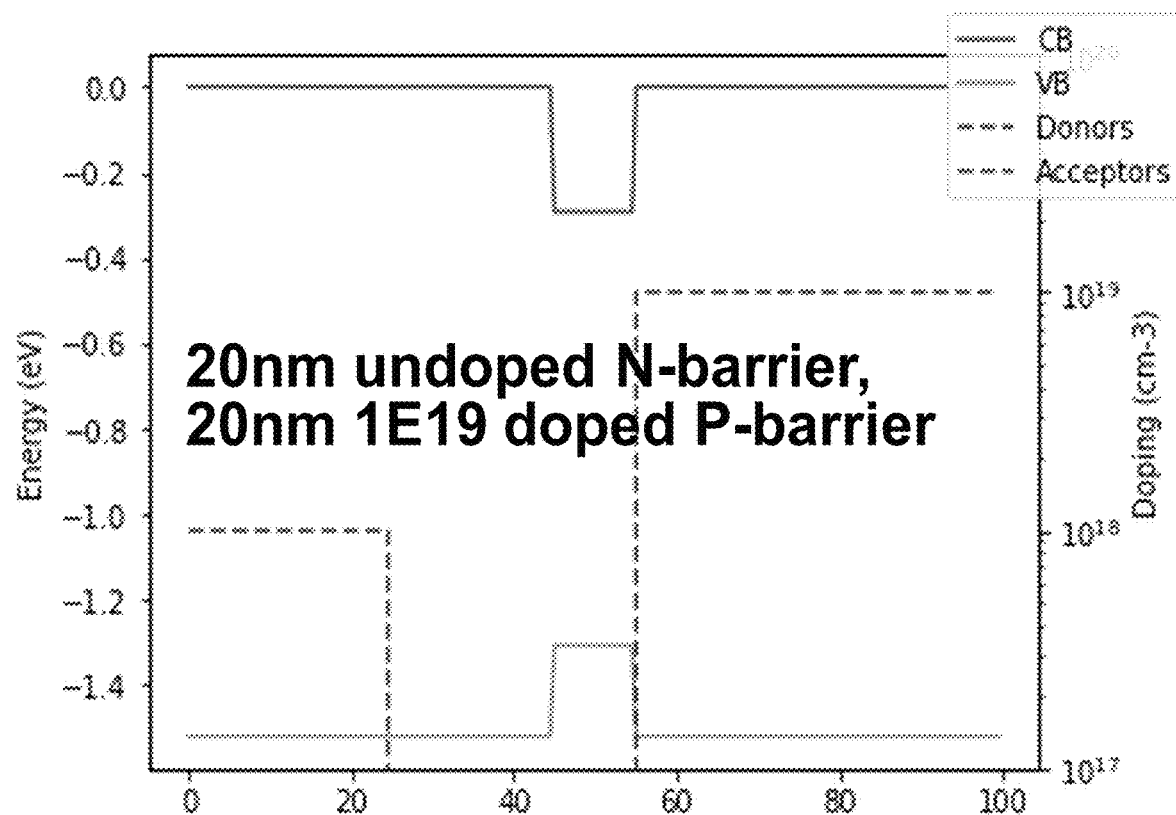
FIGS. 24A, 24B, 24C, 24D, 24E, 24F, 24G, 24H and 24I show carrier doping profiles, carrier-tunneling probabilities and their dependence on applied voltage, and energy band diagrams of exemplary quantum-well structures with heavily doped P-type barrier layer and lightly doped N-type barrier layer, assuming zero diffusion of the carriers as well as zero recombination in accordance with the present disclosure.
Figure 24B:
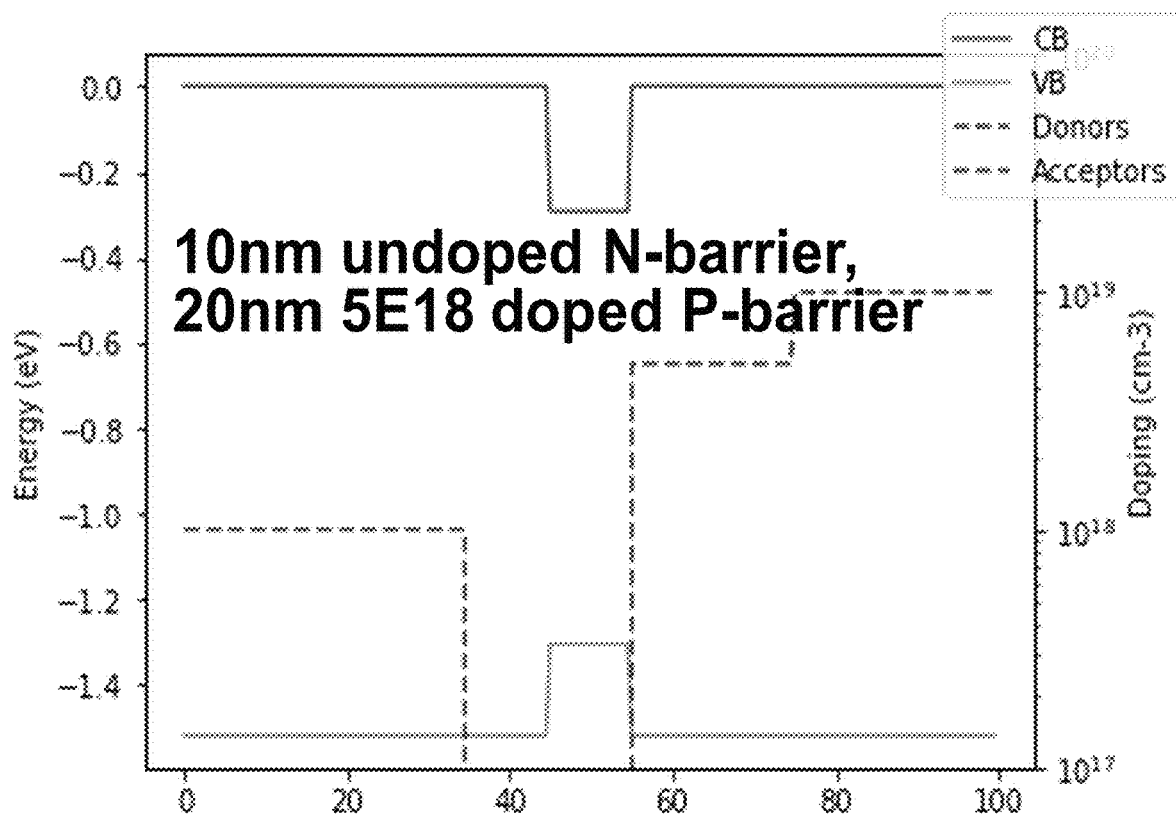
Figure 24C:
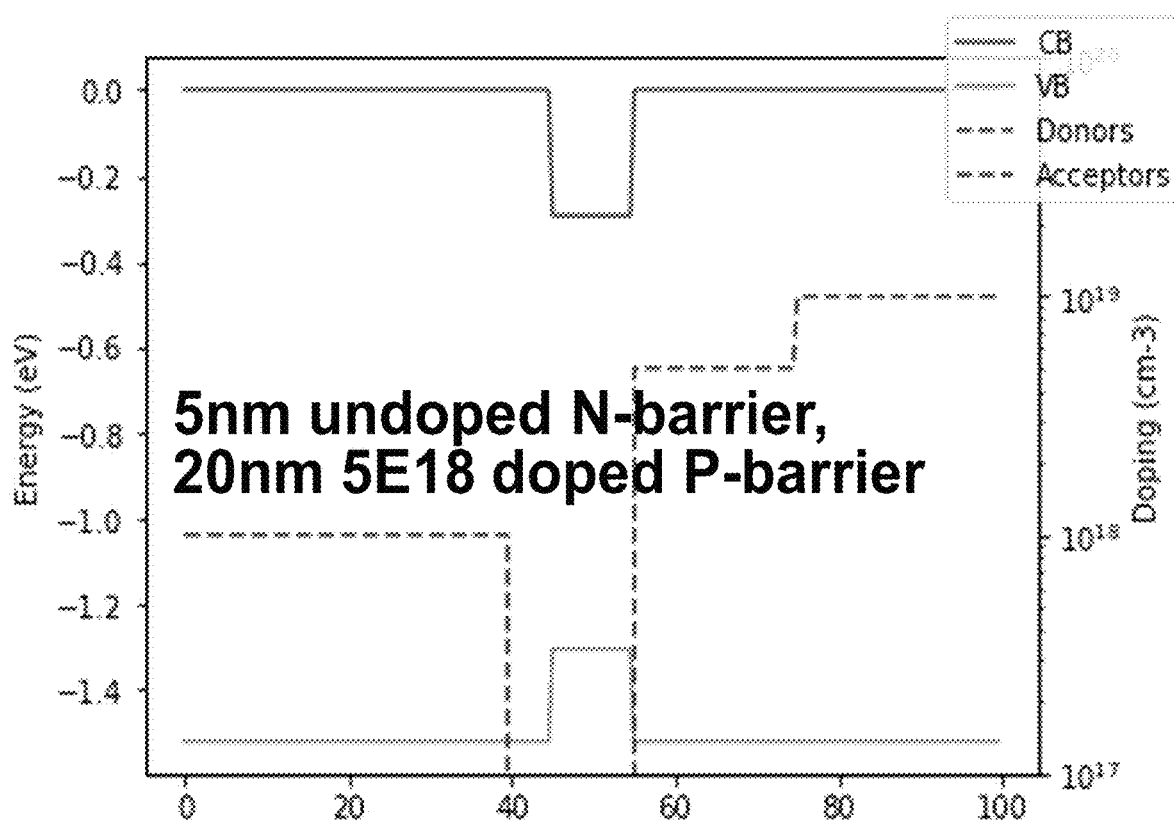
Figure 24D:
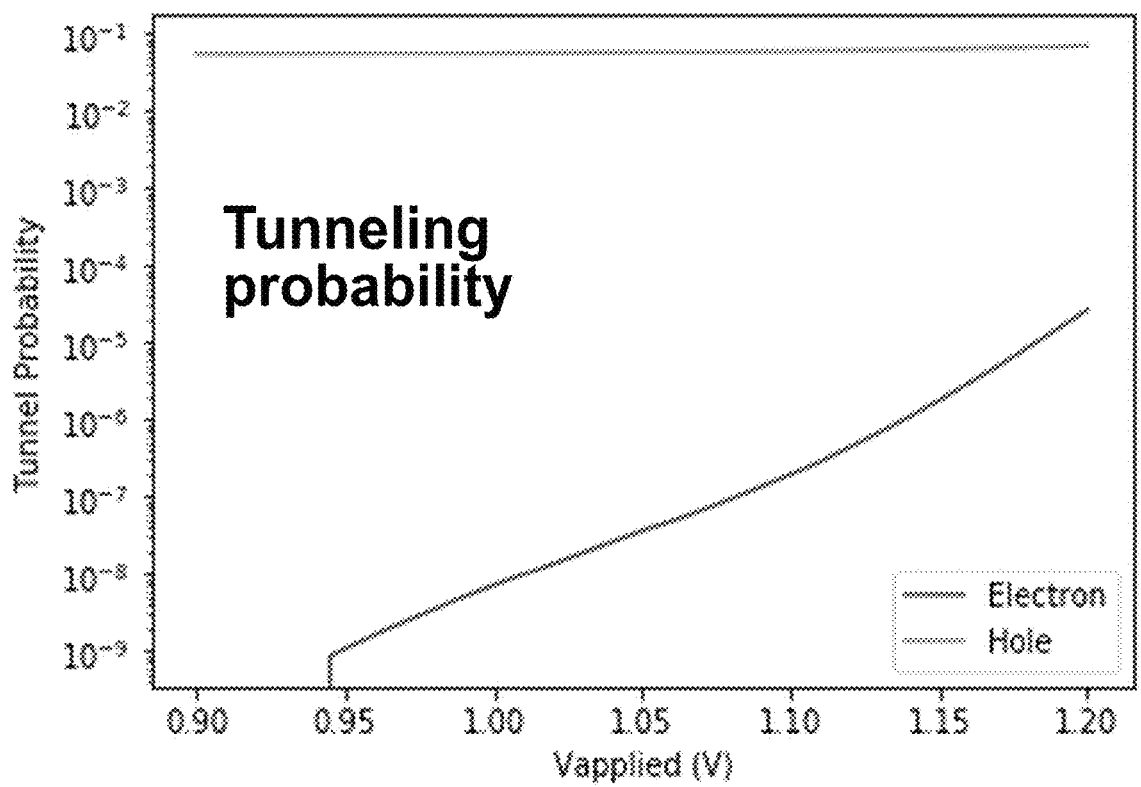
Figure 24E:
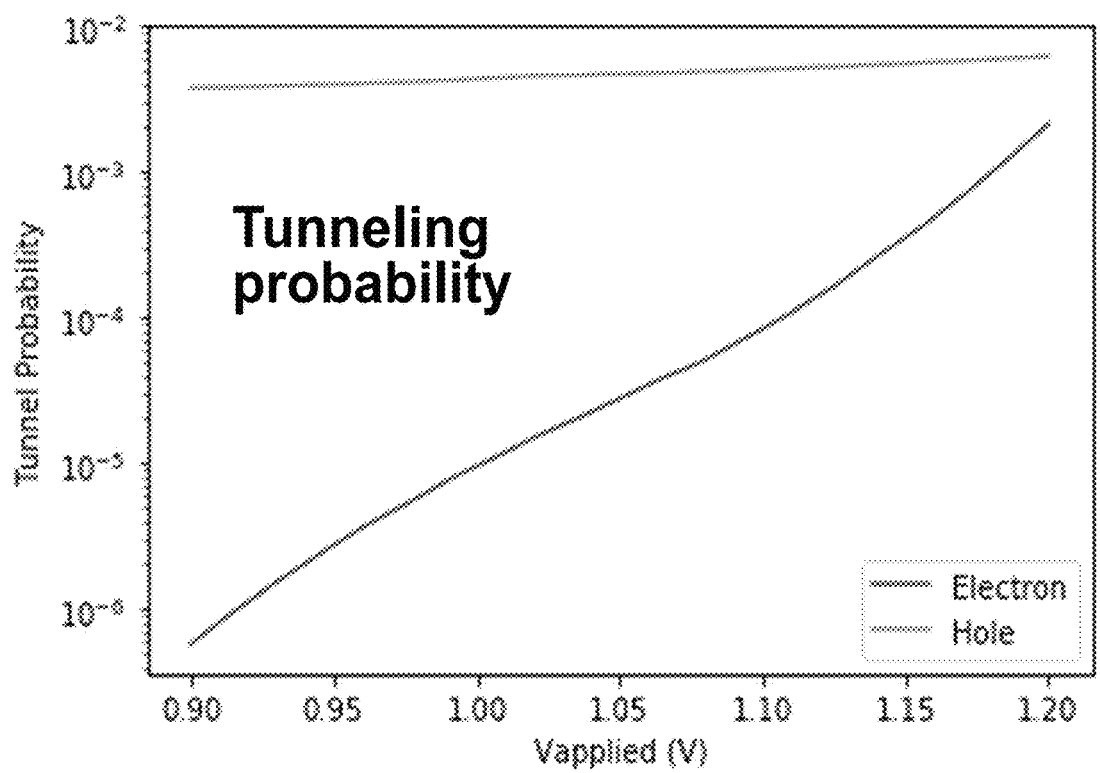
Figure 24F:
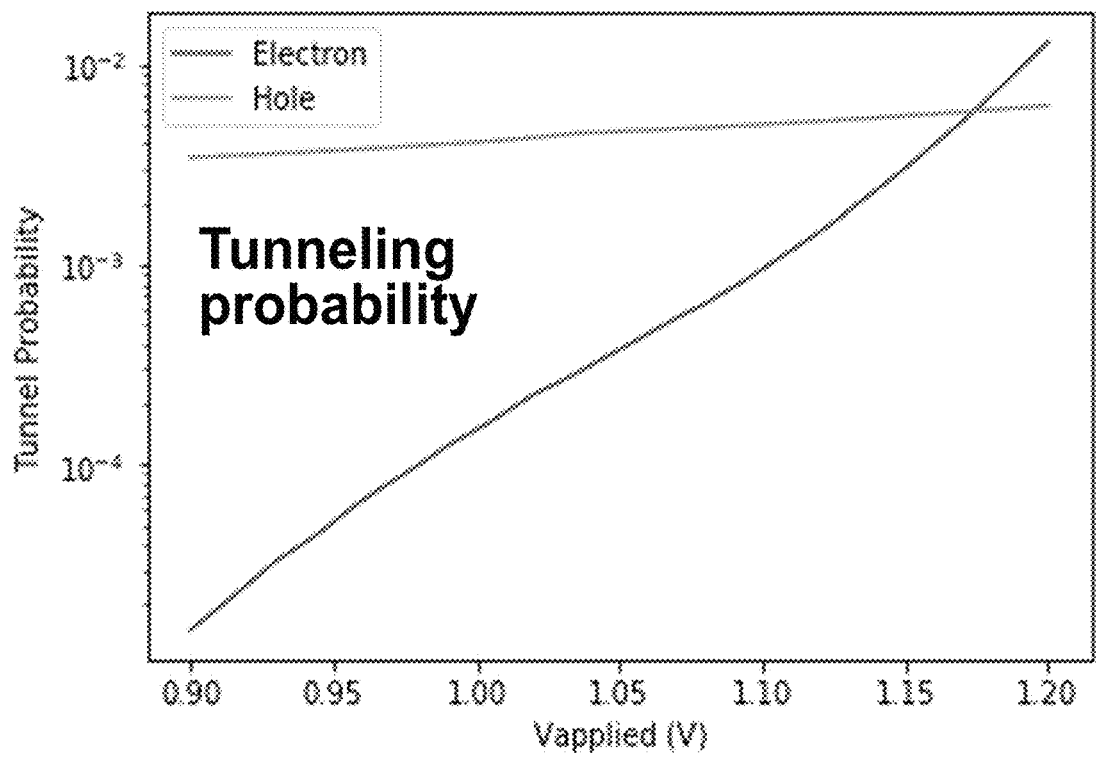
Figure 24G:
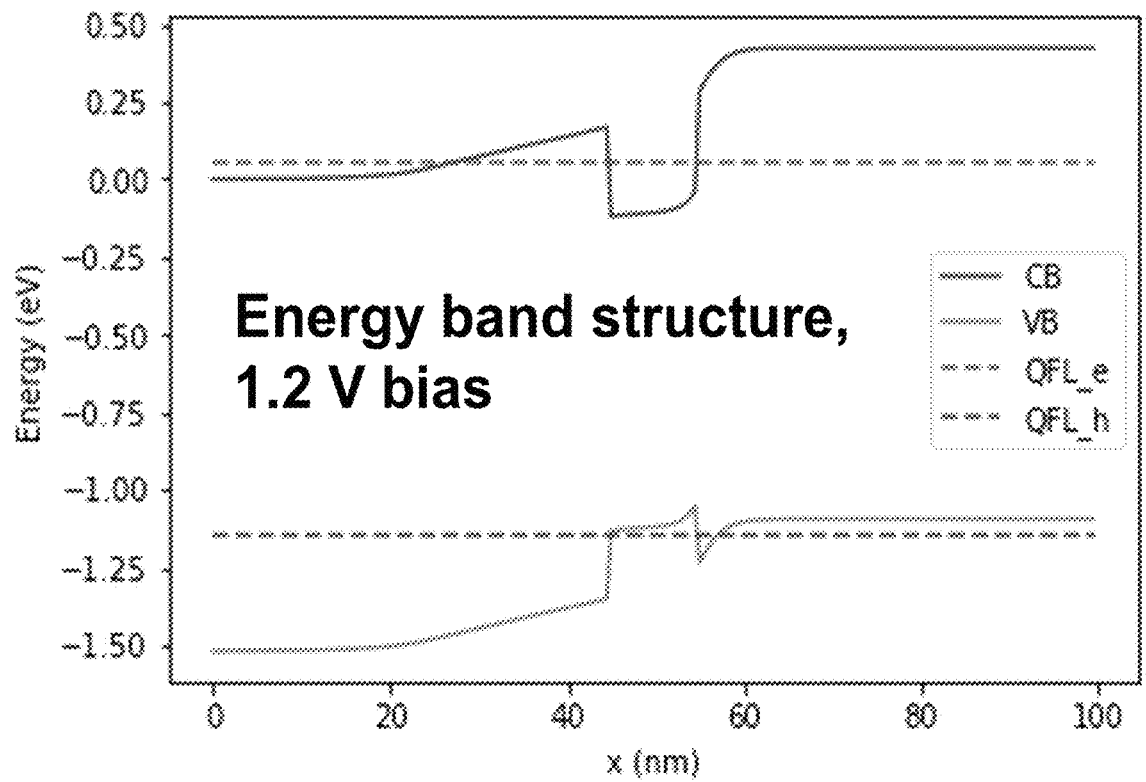
Figure 24H:
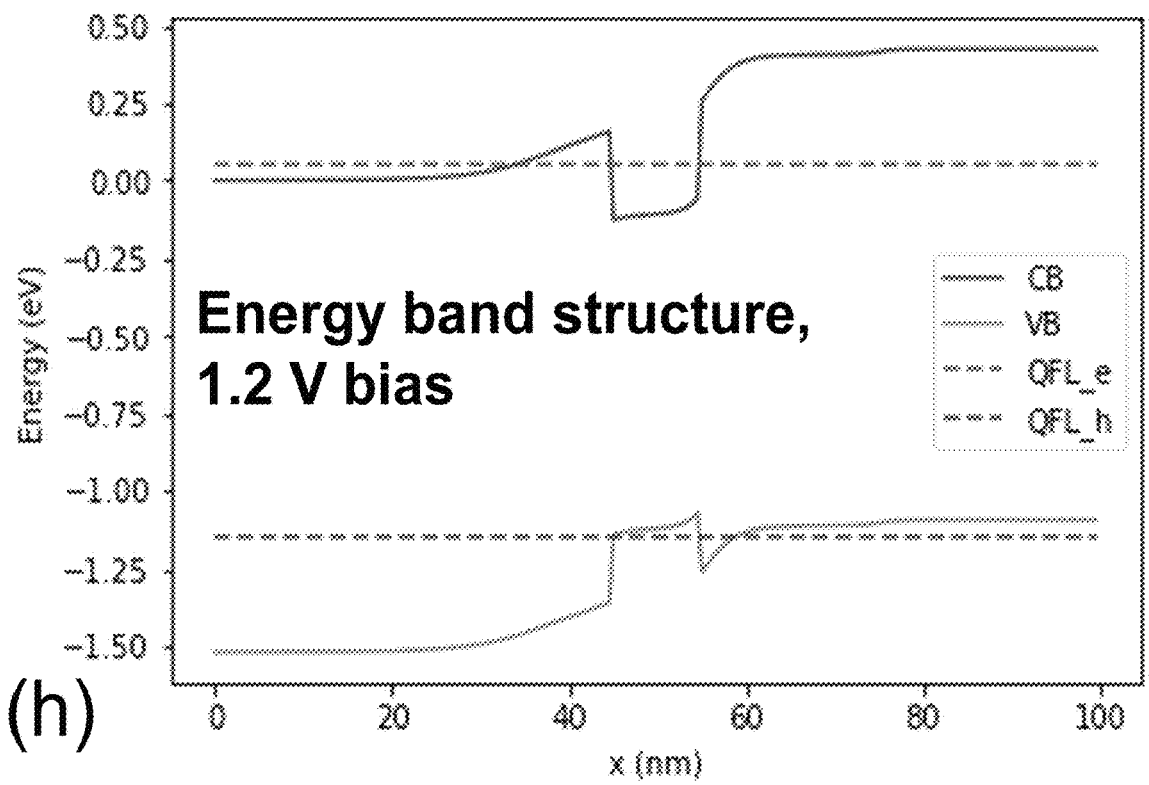
Figure 24I:
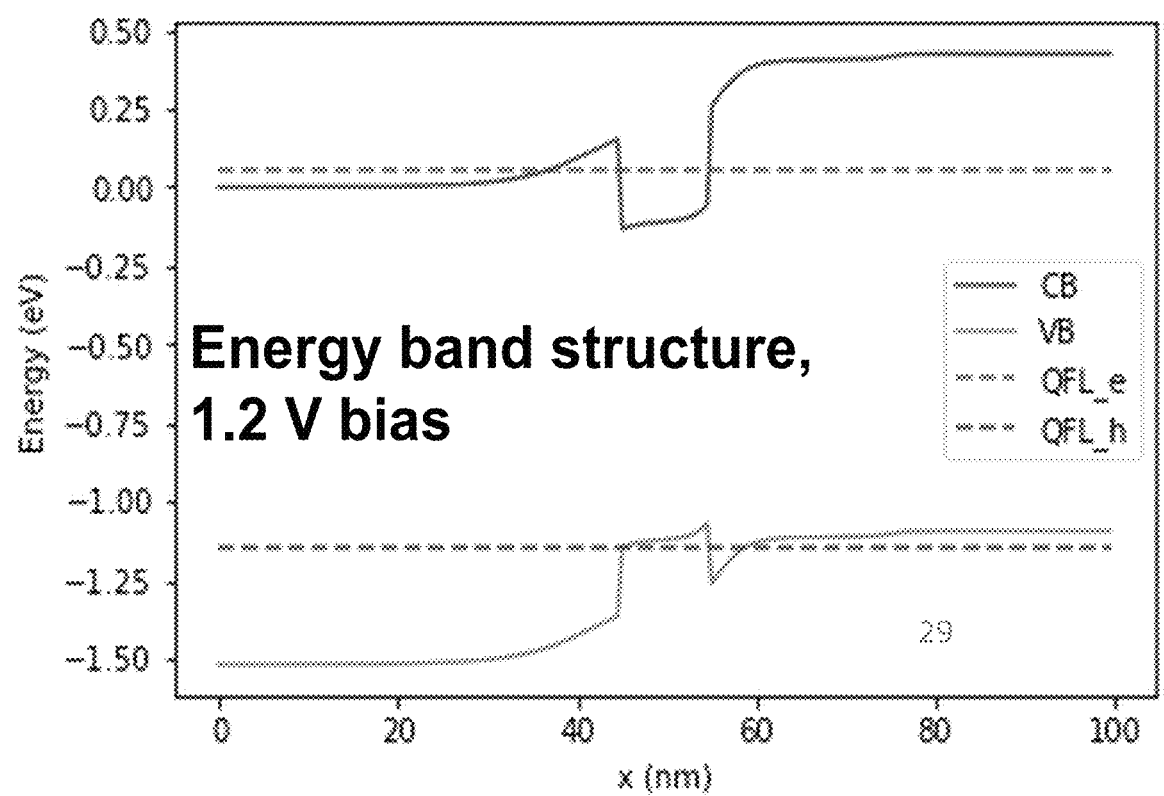

FIGS. 23A-23F show examples of the energy-band diagrams and carrier concentration distributions obtained at a specific forward bias voltage (e.g., 1.1 volts) applied to three diode structures with different barrier-layer widths. The width of the tunneling barriers for the electrons and the holes is equal to the width of the undoped (or lightly doped) barrier layers of these examples. That there is some tunneling through these energy barriers is evident from the significant accumulation of both electrons and holes in the quantum well. (This particular analysis assumed there is negligible recombination of the electrons and holes in the quantum well). The accumulated electrons fill the entire width of the quantum well whereas the accumulated holes occupy a portion of the quantum well width. The hole-tunneling probability is improved greatly by making the P-side barrier layer thinner, as is evident by comparing FIGS. 22D-22F. This is supported by the significantly higher hole concentration accumulated in the quantum well for the thinner P-side barrier layer, as shown in FIGS. 23D-23F). The electron-tunneling also is improved by making the N-side barrier layer thinner, but not to as great a degree as the improvement in the hole tunneling.

FIGS. 24A-24I compare three other examples of designs for the barrier layers abutting the quantum well. In these examples, the P-type barrier layer is heavily doped while the N-type barrier layer has light doping. The heavy doping of the P-type barrier layer greatly increases the tunneling probability for the holes into the quantum well. It is preferable to have the tunneling probabilities for the holes and electrons to be equal. For typical operation of a laser, the bias voltage in the portion of the core region near the quantum well will increase, as the externally applied bias voltage is increased, until the tunneling rates of those two electrical carriers match the carrier recombination rate in the quantum well that leads to the generation of the laser light. For a given bias voltage, increasing the tunneling probability increases the current flow into the quantum well and thus also the emission of light by the laser, or the LED. These figures show that the hole-tunneling probability is increased when the carrier concentration of the holes in the P-doped barrier layer is higher, which may be seen by comparing FIGS. 24D and 24E. Also, the electron-tunneling probability is increased by making the lightly-doped N-side barrier layer thinner, as can be seen by comparing FIGS. 24D-24F. Changing the doping level in a more heavily-doped barrier layer changes the position of the quasi-Fermi level relative to the band edge at the interface between the quantum well and the adjacent barrier layer, which may be seen by comparing hole quasi-Fermi levels shown in FIGS. 24G and 24H. Changing the width of a lightly-doped barrier layer changes the width of the energy barrier through which the carriers must tunnel, as can be seen by comparing the electron barriers shown in FIGS. 24G-24I. Thus, both increasing the doping level in the barrier layer and reducing the width of the barrier layer are helpful for increasing the probability of having the carrier tunnel through any depletion region and into the quantum well.

Figure 25A:
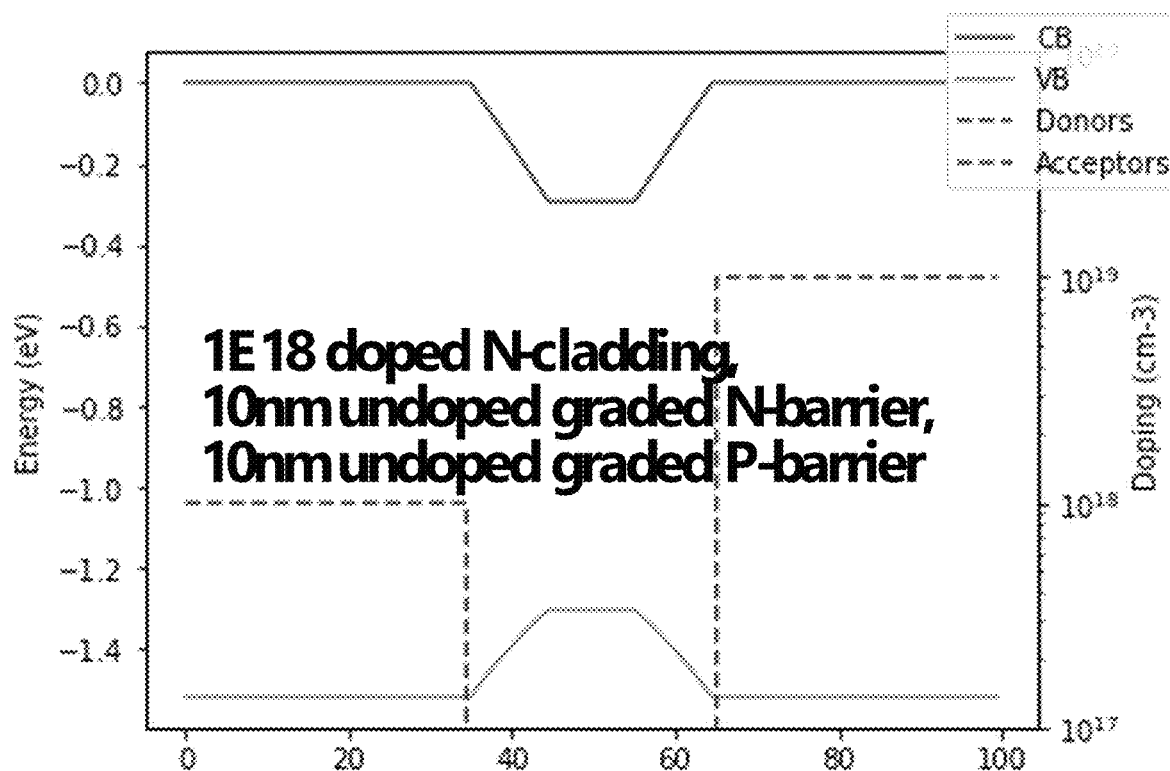
FIGS. 25A, 25B, 25C, 25D, 25E, 25F, 25G, 25H and 25I show carrier doping profiles, carrier-tunneling probabilities and their dependence on applied voltage, and energy band diagrams and carrier densities of exemplary quantum-well structures with composition graded and lightly doped barrier layers abutting a single quantum well.
Figure 25B:
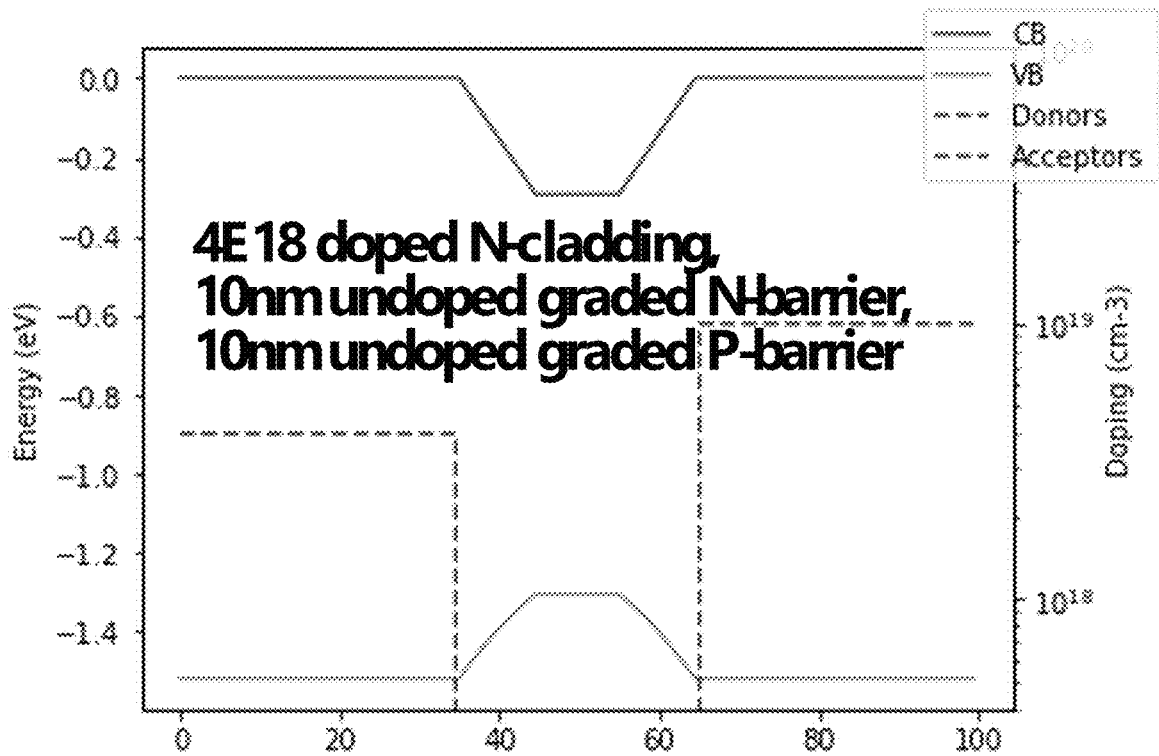
Figure 25C:
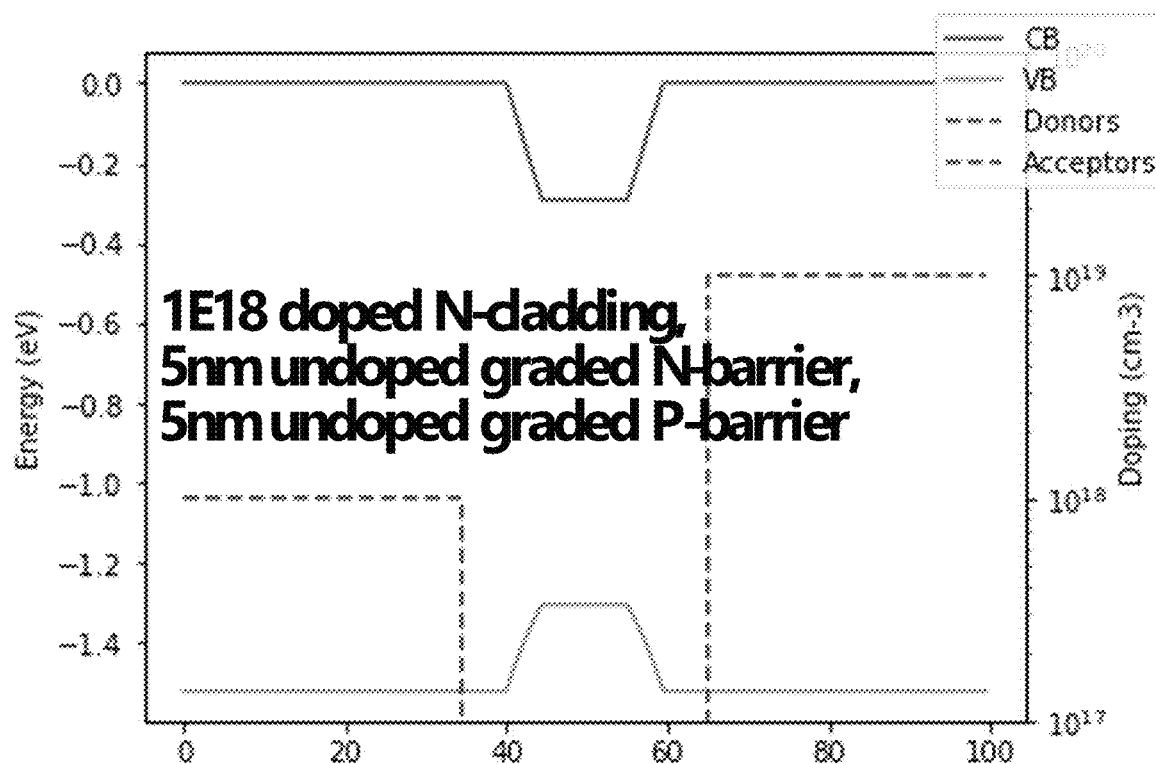
Figure 25D:
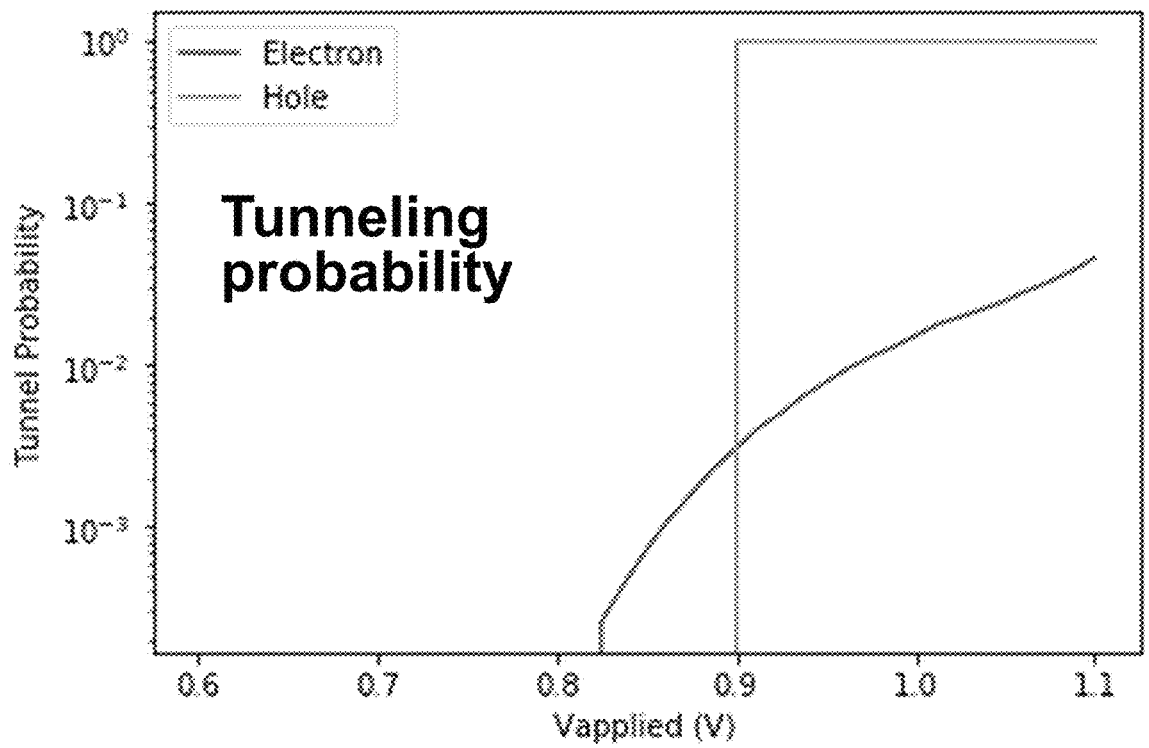
Figure 25E:
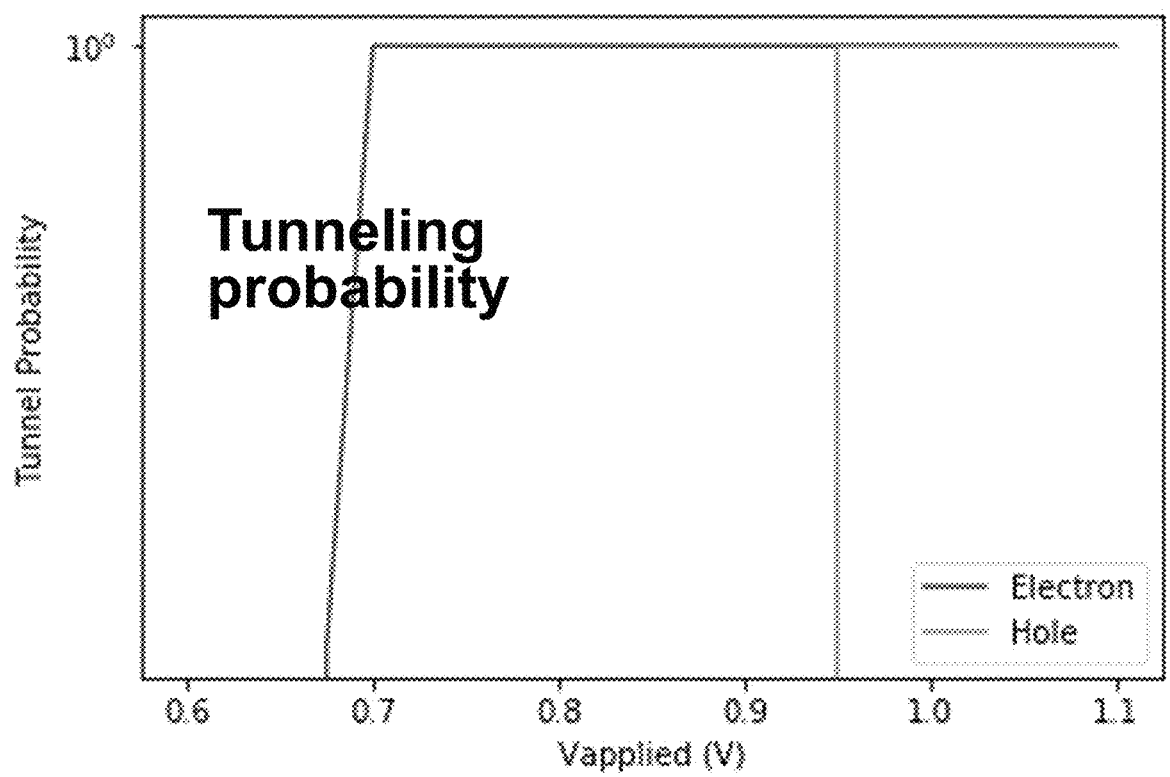
Figure 25F:
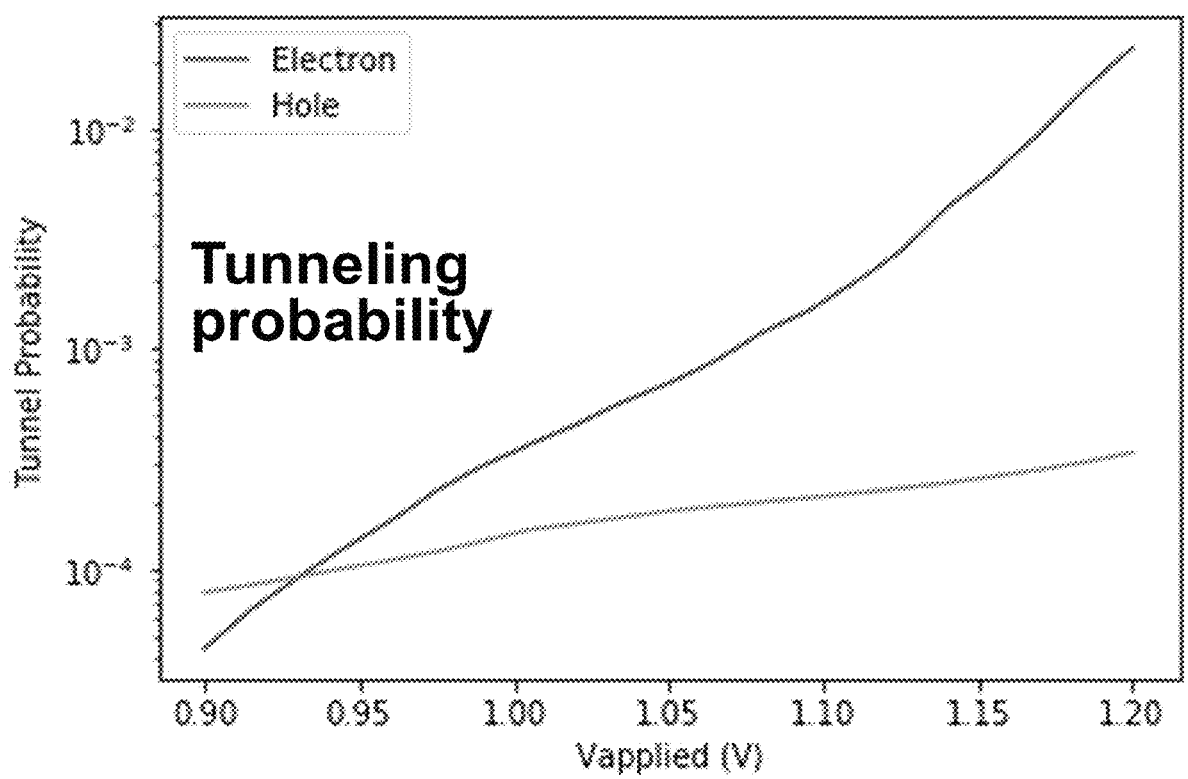
Figure 25G:
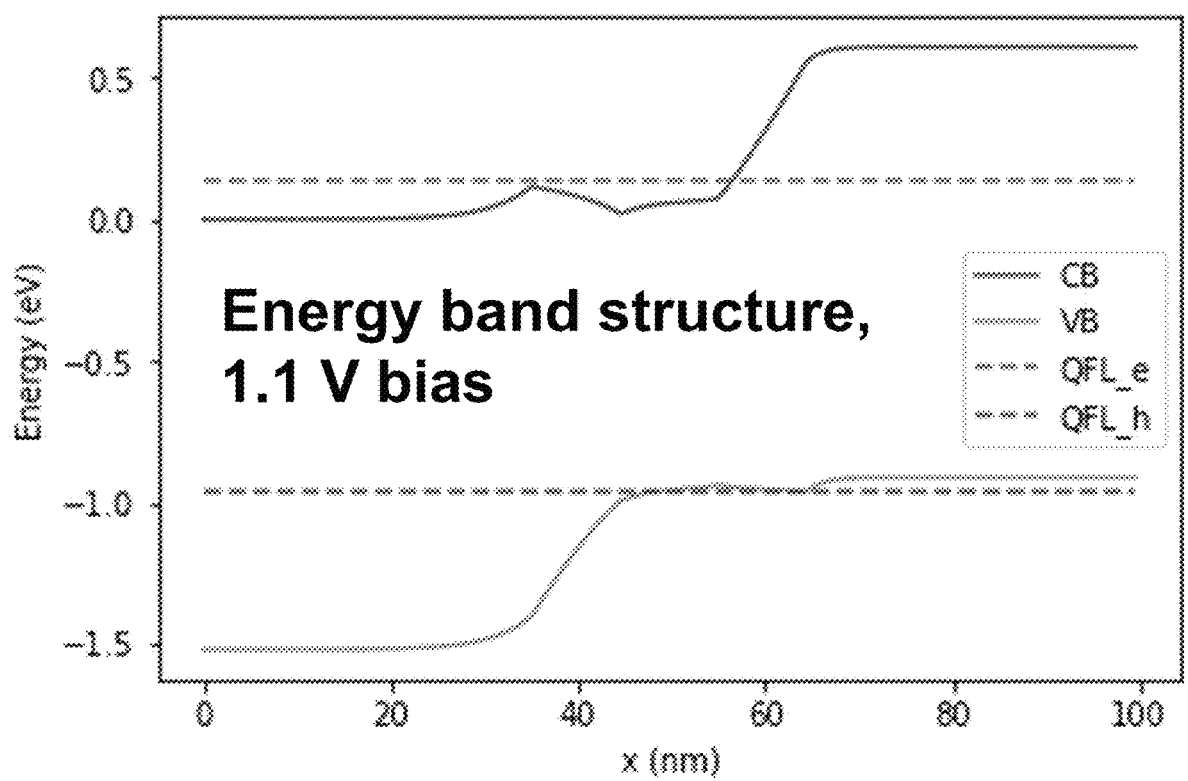
Figure 25H:
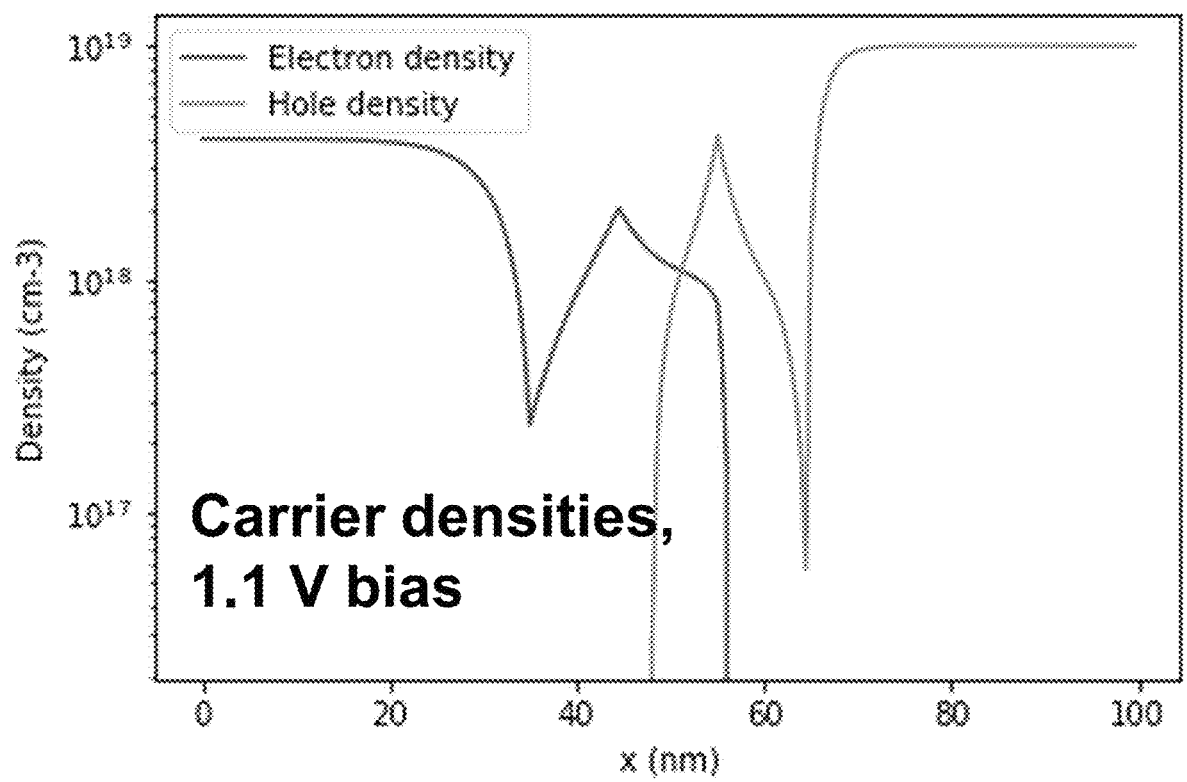
Figure 25I:
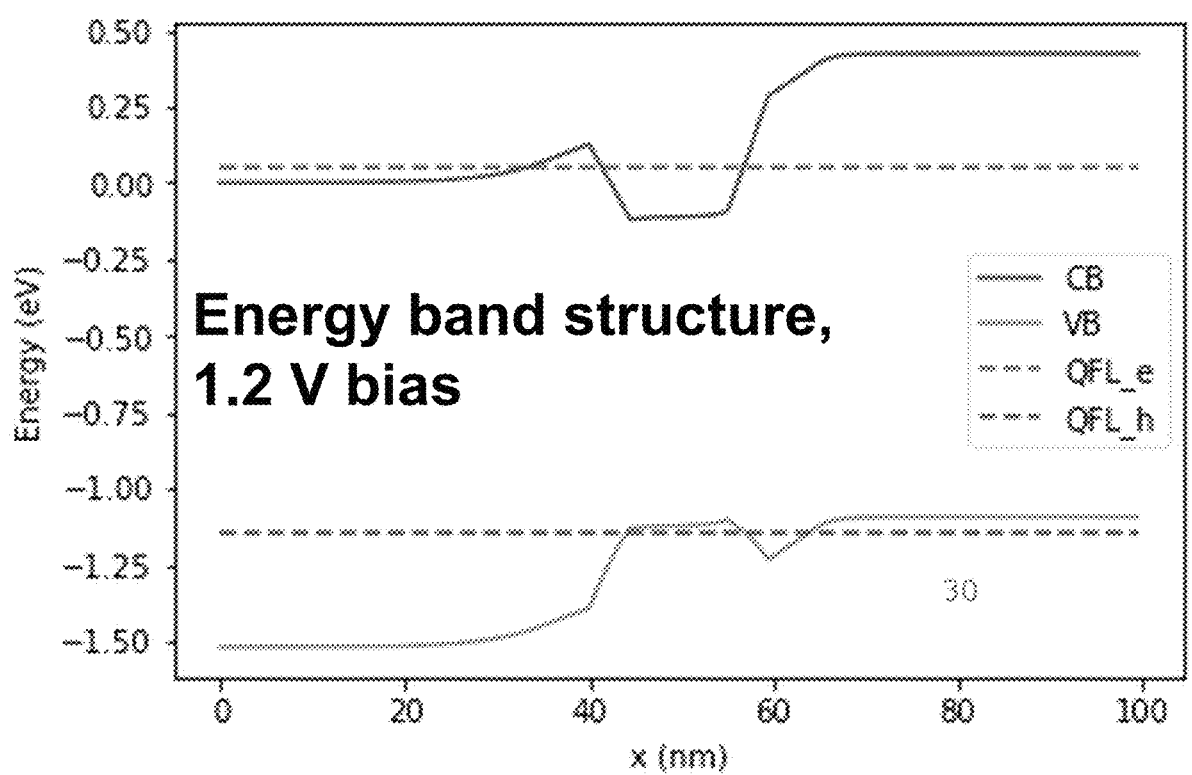

FIGS. 25A-25I and FIGS. 26A-26I illustrate the effect of composition-graded barrier layers. For the examples chosen, a P-side hole concentration of 1e19 $cm^{-3}$ in the heavily doped region adjacent to the lightly doped but composition-graded barrier layer produces approximately complete tunneling of the holes into the quantum well when the applied voltage is large enough that the quasi-Fermi level of those holes becomes equal to the heavy-hole energy level in the quantum well. In the plots shown on these figures, the N-side is at the left of the quantum well and the P-side is at the right of the quantum well. An N-side electron concentration of 1e18 cm$^{-3}$ in the heavily doped region (i.e., designated in those figures as the N-cladding), which is the lateral-current conducting layer that is adjacent to the barrier layer, as shown in FIG. 11, adjacent to the lightly-doped composition-graded barrier layer is not high enough to produce complete tunneling of electrons into the quantum well. However an N-side electron concentration of 4e18 cm$^{-3}$ is high enough, as can be seen by comparing FIGS. 25D and 25E. Thus, the N-side electron concentration can be lower than the P-side hole concentration and yet achieve high tunneling probability (e.g. close to unity and generally >0.9) for both electrons and holes. When the tunneling probability is approximately unity, the undoped (or lightly doped) graded barrier layers also are occupied by carriers, as shown by FIG. 25H, which are tunneling through them to the quantum well. Note that it is preferable for the heavily doped region to extend at least to the edge of the lightly-doped, composition-graded barrier layer. If some portion of lightly-doped barrier layer that is not graded exists between the heavily doped region and the composition-graded portion, the tunneling barrier and the carrier-depleted region will be present and the tunneling probability will be reduced, as shown in FIGS. 25C, 25F and 25I. Note that FIGS. 25A, 25D and 25G are graphical representations for the same structure. Likewise, FIGS. 25B, 25E and 25H are graphical representations for the same structure. And FIGS. 25C, 25F, and 25I are graphical representations for the same structure.

Figure 26A:
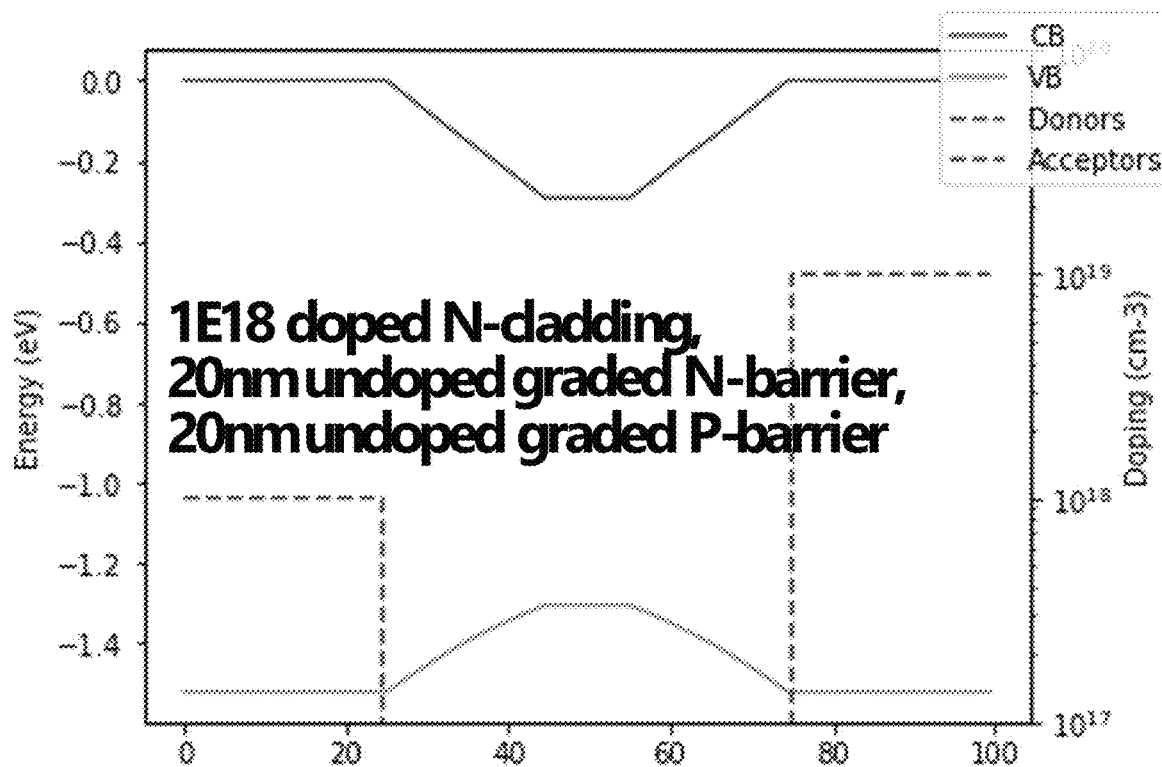
FIGS. 26A, 26B, 26C, 26D, 26E, 26F, 26G, 26H and 26I show carrier doping profiles, carrier-tunneling probabilities and their dependence on applied voltage, and carrier densities of exemplary quantum-well structures with composition graded and lightly doped or heavily doped barrier layers.
Figure 26B:
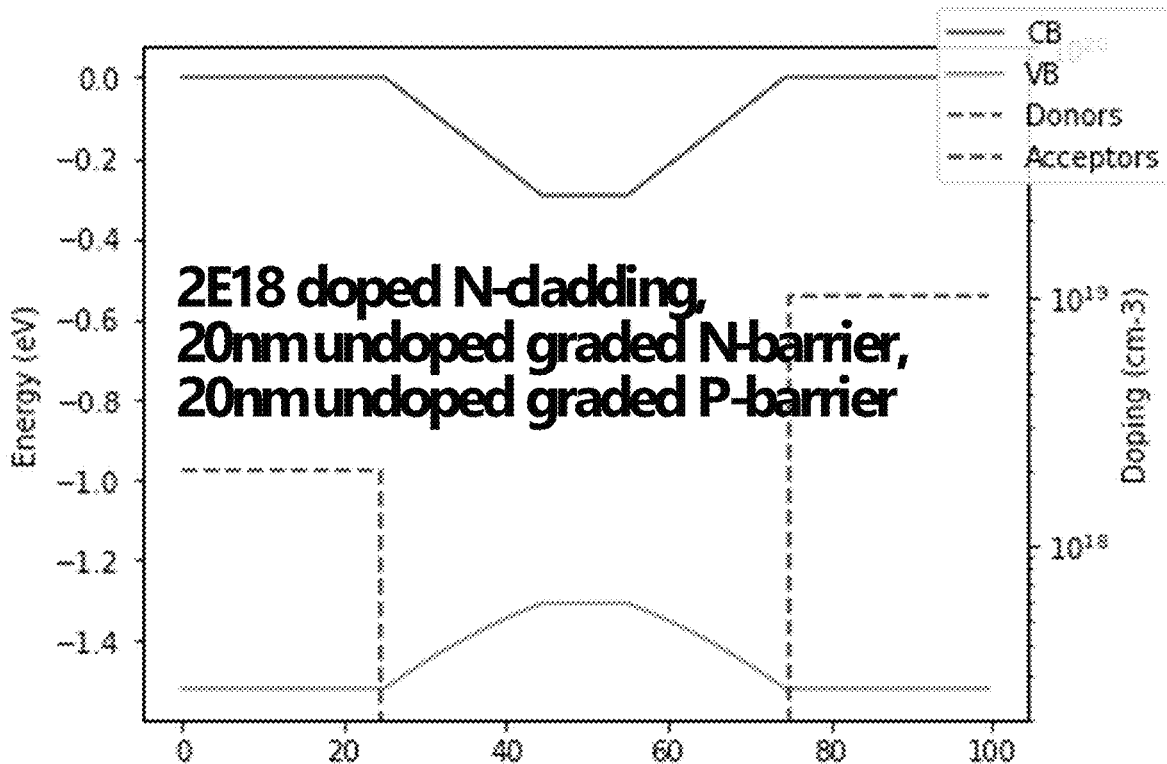

The examples shown in FIGS. 25A-25I are for barrier layers of 10 nm or 5 nm width. The examples shown in FIGS. 26A-26I are for barrier layers of 20 nm width. A comparison of FIGS. 25D and 26D shows that when the composition grade is more gentle (rather than abrupt) from the barrier layer being wider (or thicker), the tunneling probability is higher (for electrons in this case). This result is consistent with the results shown in FIGS. 15 and 18. Also, for the more gentle composition grade, the carrier concentration in the heavily doped layer abutting the lightly-doped graded barrier layer can be lower and still achieve approximately unity tunneling probability, as can be seen by comparing FIGS. 25D and 26D. However, a more abrupt composition grade can be beneficial, if the doping is sufficiently high, since the applied voltage above which near unity tunneling probability is achieved is lower when the composition grade is more abrupt, as can be seen by comparing FIGS. 25E and 26E.

Figure 26C:
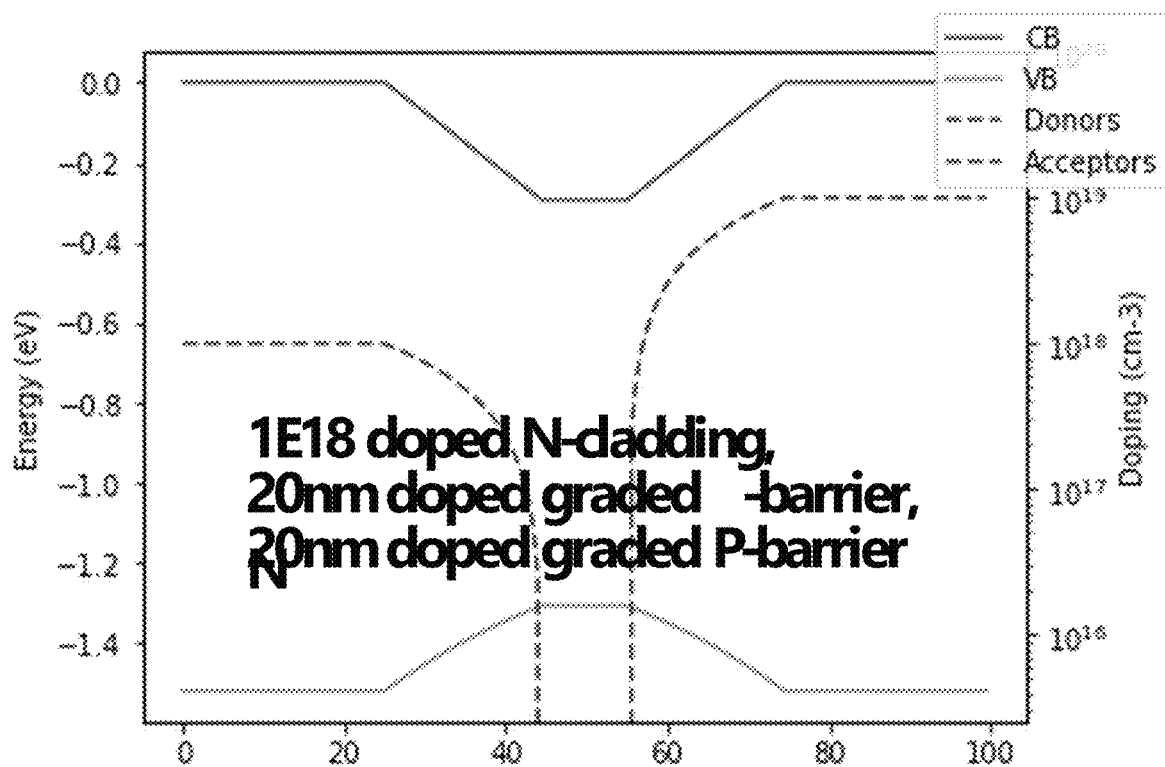
Figure 26D:
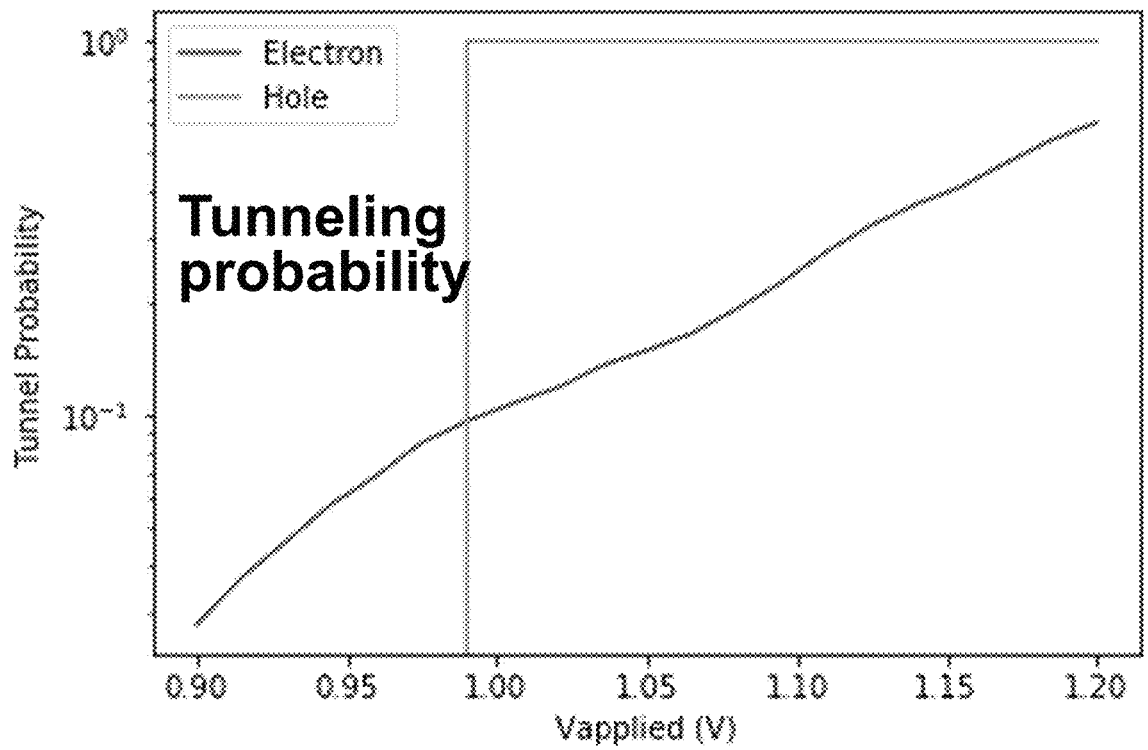
Figure 26E:
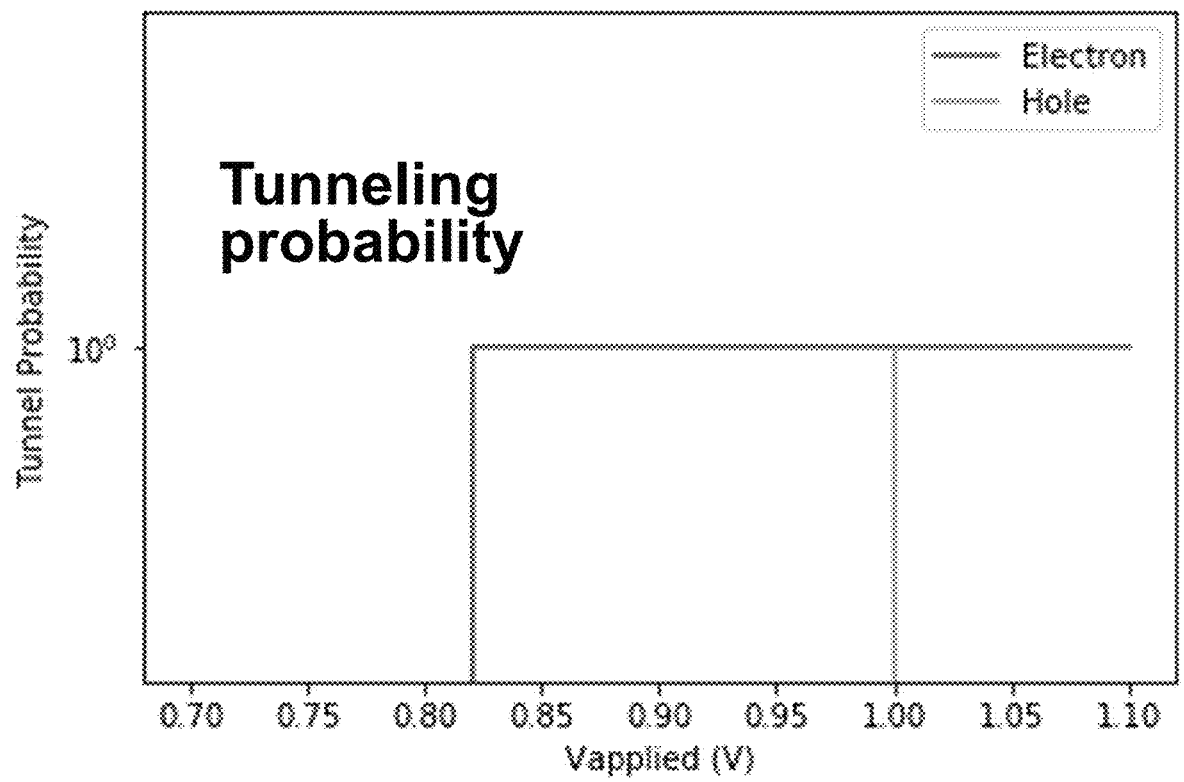
Figure 26F:
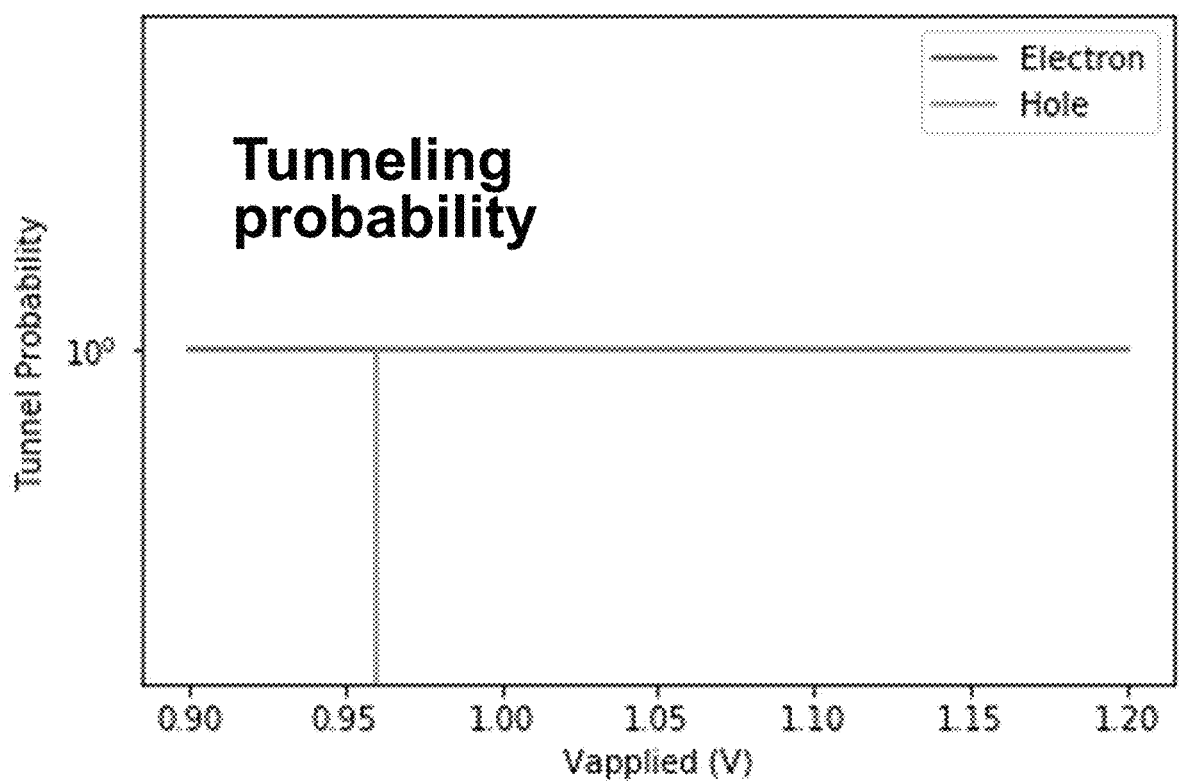
Figure 26G:
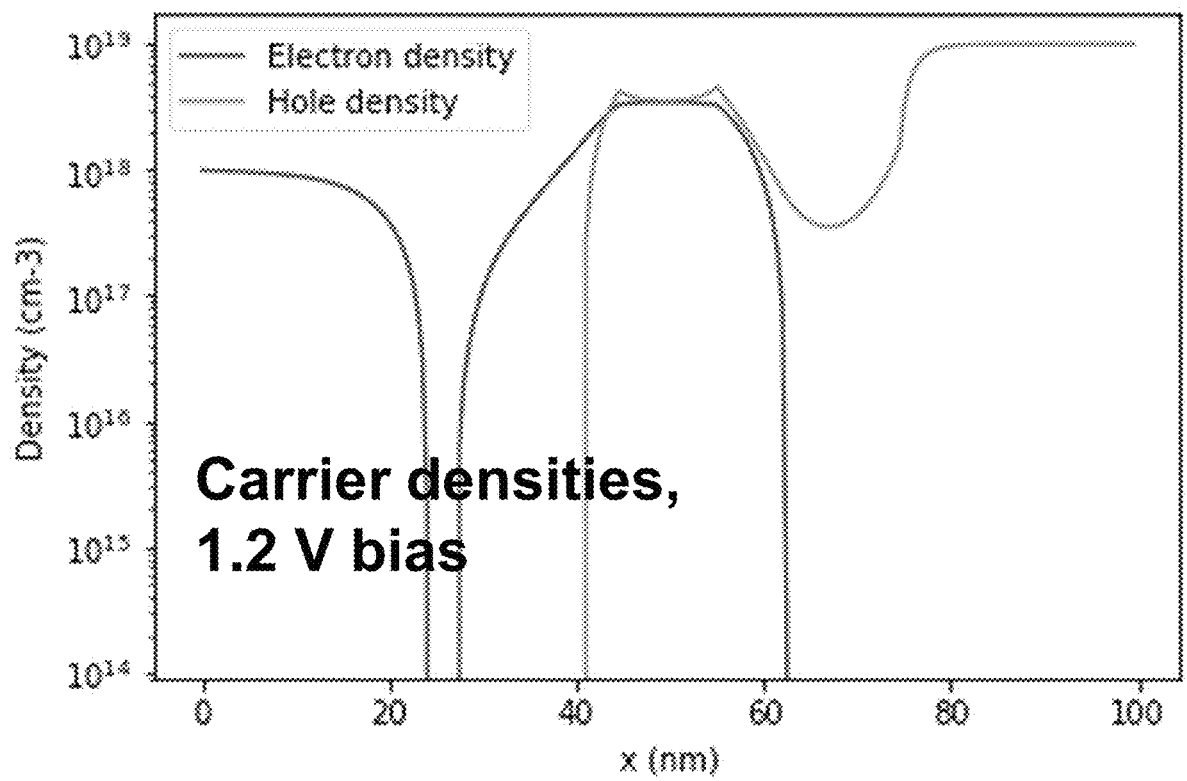
Figure 26H:
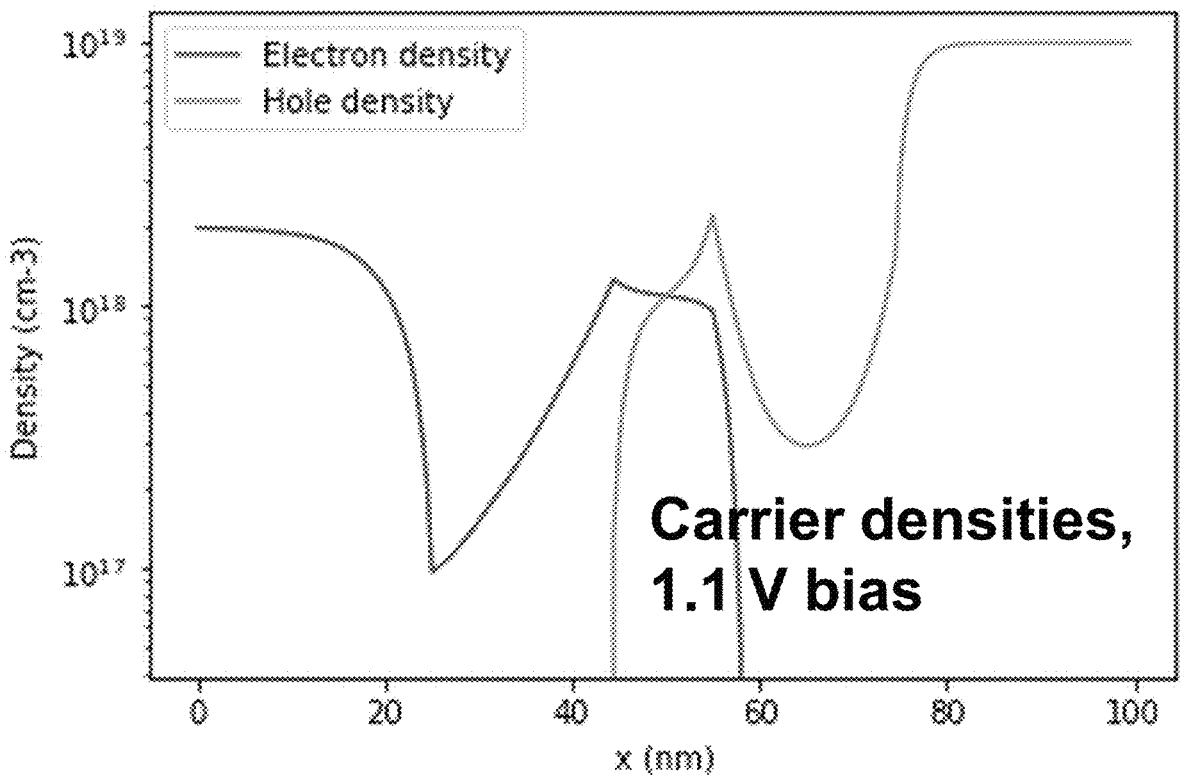
Figure 26I:
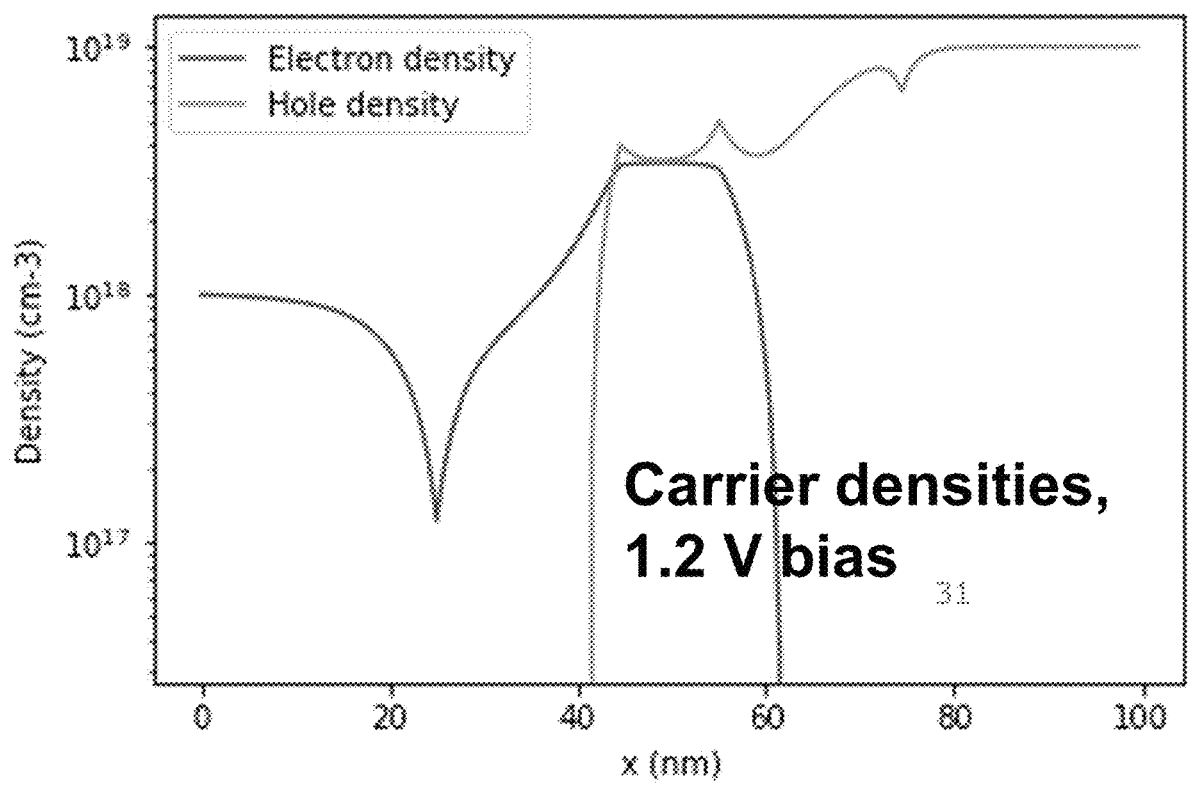

FIGS. 26C, 26F and 26J illustrate an example in which the composition-graded barrier layers also are doped more heavily. For this example, the doping in the barrier layers has a graded profile and is highest immediately adjacent to the heavily doped layer on the side of the barrier away from quantum well and is lowest immediately adjacent to the quantum well (see dashed lines in FIG. 26C). Doping the graded barrier layers further reduces the applied voltage value above which the tunneling probability reaches near unity, as can be seen by comparing the electron-tunneling probability curves shown in FIGS. 26E and 26F. Doping of the composition-graded barrier layer also allows high tunneling probability to be obtained at a lower carrier concentration in the heavily doped layer on the side of the barrier away from the quantum well. Thus, both composition grade and doping of the barrier layers are beneficial for reducing the applied voltage required to achieve a desired average current through the diode structure.

Comparison of the carrier density distributions plotted in FIGS. 25A-25I and 26A-26I can provide additional insight into the design of the barrier layers. When the tunneling probability is well below unity at a given applied voltage, there is some spatial region that remains depleted of carriers (see FIG. 26G). This carrier depleted region tends to be located closer to where there is an abrupt or steep change in the doping level, which for the example shown in FIG. 26A is at the interface between the heavily doped N-cladding (or lateral current transport) layer and the N-side barrier layer. Increasing the doping level (and the ionized electron concentration) in the N-cladding layer (as labelled on these plots), such as from 1e18 cm$^{-3}$ to 2e18 cm$^{-3}$ for this example in FIGS. 26A-26I, shifts the electron quasi-Fermi level enough to overcome the energy barrier in the conduction band. A similar energy barrier in the conduction band is shown in the energy band structure plotted in FIG. 25G for that example. The result is that the carrier depleted region is reduced so current flow is not as impeded (see FIG. 26H). Comparison of the carrier density distributions shown in FIGS. 26G, 26H and 26I indicates that the lateral extent of the electron density and of the hole density into the quantum-well and, for these examples which ignore recombination of the carriers in the quantum well, even going beyond the quantum well to the barrier layer on the opposite side of the quantum well is dependent on the applied voltage. Higher applied voltage increases the lateral extent of the carrier density distribution.

The simplified, and somewhat idealized, graded-barrier-layer structures analyzed, whose results are shown in FIGS. 25A-25I and 26A-26I, have the composition grade of the barrier start at the material of the heavily doped cladding layer (assumed to be GaAs) and end at an InGaAs material whose valence band energy equals the energy level of the heavy holes in the quantum well and whose conduction band energy equals the energy level of the electrons in the quantum well. In a practical diode structure for a laser, the conduction band energy at the end of the graded barrier layer would be greater than the electron energy in the quantum well and the valence band energy at the end of the graded barrier layer would be farther from mid-gap than the heavy hole energy in the quantum well, so that there is quantum confinement of the carriers in the quantum well. Nevertheless, the design constraints that have been identified by these analyses also should apply for the practical diode structures.

For operation at the low cryogenic temperatures, it is preferable to have the doping levels in the intentionally doped regions of the diode structure (and also in the overall laser structure) be sufficiently high to have those materials be above the metal-to-insulator transition point. For N-type GaAs, a doping level above 8.8e16 cm$^{-3}$ was identified as being sufficiently above the metal-to-insulator transition point, as described in Reference [14], which is incorporated herein by reference. When the material is above this transition point, the conduction band is populated even at very low temperatures due to the hybridization of the impurity and conduction bands. Thus, all electrons are delocalized, the Fermi level is well in the conduction band even at low temperatures, and ionized impurity scattering is the main electron-scattering mechanism, which affects the carrier mobility, as described in Reference [14]. It is expected that the doping level associated with the metal-to-insulator transition point for P-type GaAs likely would not be higher than the 3e18 cm$^{-3}$ level for boron doping in silicon at the metal-to-insulator transition point, as described in Reference [15], which is incorporated herein by reference. Note that the metal-to-insulator transition point for N-type silicon is generally considered to be above 1e19 cm$^{-3}$ doping level, which is much higher than the doping level at which that metal-to-insulator transition occurs for N-type GaAs, as described in Reference [16], which is incorporated herein by reference.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A laser or light emitter comprising:
a single quantum well layer;
an n-type barrier layer directly on a first surface of the single quantum well layer; and
a p-type barrier layer directly on a second surface of the single quantum well layer opposite the first surface of the single quantum well layer;
wherein the single quantum well layer is between the p-type barrier layer and the n-type barrier layer; and
wherein the n-type barrier layer has a graded composition.

2. The laser or light emitter of claim 1:
wherein the p-type barrier layer has a first surface directly abutting the second surface of the single quantum well layer; and
wherein the p-type barrier layer has a graded composition.

3. The laser or light emitter of claim 1 further comprising:
a tunnel junction structure comprising:
a heavily p-doped layer; and
a heavily n-doped layer on the heavily p-doped layer;
wherein the p-type barrier layer has a first surface directly abutting the second surface of the single quantum well layer;
wherein the heavily p-doped layer is adjacent to a second surface of the p-type barrier layer that is opposite from the first surface of the p-type barrier layer; and
wherein the heavily doped p-type layer is closer to the p-type barrier layer than the heavily n-doped layer.

4. The laser or light emitter of claim 3:
wherein the heavily p-doped layer of the tunnel junction structure directly abuts the second surface of the p-type barrier layer.

5. The laser or light emitter of claim 3 further comprising:
a p-doped spacer layer;
wherein the p-doped spacer layer is between the heavily p-doped layer and the second surface of the p-type barrier layer.

6. The laser or light emitter of claim 1 further comprising:
a heavily n-doped layer on the p-type barrier layer.

7. The laser or light emitter of claim 1:
wherein the p-type barrier layer is doped with a dopant concentration sufficiently high to achieve greater than 10% ionization of the dopants at an operating temperature of the laser or light emitter below 80 Kelvin.

8. The laser or light emitter of claim 1:
wherein the n-type barrier layer is doped with a dopant concentration sufficiently high to achieve greater than 10% ionization of the dopants at the operating temperature of the laser or light emitter below 80 Kelvin.

9. The laser or light emitter of claim 1 further comprising:
a core region, wherein a tunnel junction structure is located within the core region; and
a lateral-current conducting region abutting the core region and abutting the tunnel junction structure on a side of the core region.

10. The laser or light emitter of claim 9 further comprising:
a first lateral-current transporting layer for transporting holes adjacent the p-type barrier layer; and
a first ohmic contact coupled to the first lateral-current transporting layer on a top surface of the first lateral-current transporting layer for transporting holes;
wherein a valence band edge of the p-type barrier layer is closer in energy to that of the quantum well material than the valence band edge of the first lateral-current transporting layer for transporting holes.

11. The laser or light emitter of claim 10 further comprising:
a current blocking region in the lateral-current conducting region for impeding a flow of carriers from the first lateral-current transporting layer for transporting holes in a vertical direction through the single quantum well layer in that lateral-current conduction region and promoting a lateral flow of carriers in that lateral-current conducting region.

12. The laser or light emitter of claim 11:
wherein the current blocking region comprises AlGaAs; or
wherein the current blocking region comprises AlInAs.

13. The laser or light emitter of claim 11:
wherein the current blocking region is lightly n-doped; or
wherein the current blocking region has an n-doping of 1E+17 cm-3.

14. The laser or light emitter of claim 10 further comprising:
  a second lateral-current transporting layer adjacent the n-type barrier layer; and
  a second ohmic contact coupled to the second lateral-current transporting layer;
  wherein a conduction band edge of the n-type barrier layer is lower in energy than a conduction band edge of the second lateral-current transporting layer; and
  wherein the first ohmic contact is closer to the core region than the second ohmic contact.

15. The laser or light emitter of claim 1 further comprising:
  a first distributed Bragg reflecting mirror; and
  a second distributed Bragg reflecting mirror;
  wherein the single quantum well layer, the n-type barrier layer, and the p-type barrier layer are located between the first and second distributed Bragg reflecting mirrors.

16. The laser or light emitter of claim 1 wherein:
  the single quantum well layer comprises InGaAs;
  the p-type barrier layer comprises InGaAs; and
  the n-type barrier layer comprises InGaAs; or
  the single quantum well layer comprises GaInAs;
  the p-type barrier layer comprises GaInAlAs; and
  the n-type barrier layer comprises GaInAlAs.

17. The laser or light emitter of claim 3 wherein:
  the heavily p-doped layer of the tunnel junction structure comprises GaAs; and
  the heavily N-doped layer of the tunnel junction structure comprises InGaAs; or
  the heavily p-doped layer of the tunnel junction structure comprises GaAsSb; and
  the heavily N-doped layer of the tunnel junction structure comprises GaInAs.

18. A method of providing a laser or light emitter comprising:
  providing a single quantum well layer;
  providing an n-type barrier layer directly on a first surface of the single quantum well layer; and
  providing a p-type barrier layer directly on a second surface of the single quantum well layer opposite the first surface of the single quantum well layer;
  wherein the single quantum well layer is between the p-type barrier layer and the n-type barrier layer; and
  wherein the n-type barrier layer has a graded composition.

19. The method of claim 18:
  wherein the p-type barrier layer has a first surface directly abutting the second surface of the single quantum well layer; and
  wherein the p-type barrier layer has a graded composition.

20. The method of claim 18 further comprising:
  providing a tunnel junction structure comprising:
    a heavily p-doped layer; and
    a heavily n-doped layer on the heavily p-doped layer;
  wherein the heavily p-doped layer is adjacent to a second surface of the p-type barrier layer that is opposite from the first surface of the p-type barrier layer; and
  wherein the heavily doped p-type layer is closer to the p-type barrier layer than the heavily n-doped layer.

21. The method of claim 20:
  wherein the heavily p-doped layer of the tunnel junction structure directly abuts the second surface of the p-type barrier layer.

22. The method of claim 20 further comprising:
  providing a p-doped spacer layer;
  wherein the p-doped spacer layer is between the heavily p-doped layer and the second surface of the p-type barrier layer.

23. The method of claim 18 further comprising:
  a heavily n-doped layer on the p-type barrier layer.

24. The method of claim 18:
  wherein the p-type barrier layer is doped with a dopant concentration sufficiently high to achieve greater than 10% ionization of the dopants at an operating temperature of the laser or light emitter below 80 Kelvin.

25. The method of claim 18:
  wherein the n-type barrier layer is doped with a dopant concentration sufficiently high to achieve greater than 10% ionization of the dopants at the operating temperature of the laser or light emitter below 80 Kelvin.

26. The method of claim 18 further comprising:
  providing a core region, wherein a tunnel junction structure is located within the core region; and
  providing a lateral-current conducting region abutting the core region and abutting the tunnel junction structure on a side of the core region.

27. The method of claim 26 further comprising:
  providing a first lateral-current transporting layer for transporting holes adjacent the p-type barrier layer; and
  providing a first ohmic contact coupled to the first lateral-current transporting layer on a top surface of the first lateral-current transporting layer for transporting holes;
  wherein a valence band edge of the p-type barrier layer is closer in energy to that of the quantum well material than the valence band edge of the first lateral-current transporting layer for transporting holes.

28. The method of claim 27 further comprising:
  providing a current blocking region in the lateral-current conducting region for impeding a flow of carriers from the first lateral-current transporting layer for transporting holes in a vertical direction through the single quantum well layer in that lateral-current conduction region and promoting a lateral flow of carriers in that lateral-current conducting region.

29. The method of claim 28:
  wherein the current blocking region comprises AlGaAs; or
  wherein the current blocking region comprises AlInAs.

30. The method of claim 28:
  wherein the current blocking region is lightly n-doped.

31. The method of claim 27 further comprising:
  providing a second lateral-current transporting layer adjacent the n-type barrier layer; and
  providing a second ohmic contact coupled to the second lateral-current transporting layer;
  wherein the n-type barrier layer is lower in energy than a conduction band edge of the second lateral-current transporting layer; and
  wherein the first ohmic contact is closer to the core region than the second ohmic contact.

32. The method of claim 18 further comprising:
  providing a first distributed Bragg reflecting mirror; and
  providing a second distributed Bragg reflecting mirror;
  wherein the single quantum well layer, the n-type barrier layer, and the p-type barrier layer are located between the first and second distributed Bragg reflecting mirrors.

33. The method of claim 18 wherein:
  the single quantum well layer comprises InGaAs;
  the p-type barrier layer comprises InGaAs; and the n-type barrier layer comprises InGaAs; or
the single quantum well layer comprises GaInAs;
the p-type barrier layer comprises GaInAlAs; and
the n-type barrier layer comprises GaInAlAs.

34. The method of claim 20 wherein:
the heavily p-doped layer of the tunnel junction structure comprises GaAs; and
the heavily N-doped layer of the tunnel junction structure comprises InGaAs; or
the heavily p-doped layer of the tunnel junction structure comprises GaAsSb; and
the heavily N-doped layer of the tunnel junction structure comprises GaInAs.

35. A method of providing laser or light emitter comprising:
providing a substrate;
forming a distributed Bragg reflecting mirror on the substrate;
forming an n-type lateral-current conducting layer on the distributed Bragg reflecting mirror;
forming an n-type graded composition barrier layer on the n-type GaAs lateral-current conducting layer
forming a single quantum well layer on the n-type graded composition barrier layer; and
forming a p-type barrier layer on the single quantum well layer.

36. The method of claim 35 wherein:
the substrate comprises GaAs;
the distributed Bragg reflector mirror comprises layers comprising GaAs and layers comprising AlGaAs;
the n-type lateral-current conducting layer comprises GaAs;
the n-type graded composition barrier layer comprises InGaAs;
the single quantum well layer comprises InGaAs; and
the p-type barrier layer comprises InGaAs;
or
the substrate comprises InP;
the distributed Bragg reflector mirror comprises layers comprising GaAsSb and layers comprising AlAsSb;
the n-type lateral-current conducting layer comprises InP;
the n-type graded composition barrier layer comprises GaInAlAs;
the single quantum well layer comprises GaInAs; and
the p-type barrier layer comprises GaInAlAs.

37. A laser or light emitter comprising:
a single quantum well layer;
an n-type barrier layer directly on a first surface of the single quantum well layer; and
a p-type barrier layer directly on a second surface of the single quantum well layer opposite the first surface of the single quantum well layer;
wherein the single quantum well layer is between the p-type barrier layer and the n-type barrier layer;
wherein the p-type barrier layer has a graded composition; and
wherein the p-type barrier layer has a first surface directly abutting the second surface of the single quantum well layer.

38. The laser or light emitter of claim 37:
wherein the n-type barrier layer has a graded composition.

39. The laser or light emitter of claim 37 further comprising:
a tunnel junction structure comprising:
a heavily p-doped layer; and
a heavily n-doped layer on the heavily p-doped layer;
wherein the heavily p-doped layer is adjacent to a second surface of the p-type barrier layer that is opposite from the first surface of the p-type barrier layer; and
wherein the heavily p-doped p-type layer is closer to the p-type barrier layer than the heavily n-doped layer.

40. The laser or light emitter of claim 39:
wherein the heavily p-doped layer of the tunnel junction structure directly abuts the second surface of the p-type barrier layer.

41. The laser or light emitter of claim 39 further comprising:
a p-doped spacer layer;
wherein the p-doped spacer layer is between the heavily p-doped layer and the second surface of the p-type barrier layer.

42. The laser or light emitter of claim 37 further comprising:
a heavily n-doped layer on the p-type barrier layer.

43. The laser or light emitter of claim 37:
wherein the p-type barrier layer is doped with a dopant concentration sufficiently high to achieve greater than 10% ionization of the dopants at an operating temperature of the laser or light emitter below 80 Kelvin.

44. The laser or light emitter of claim 37:
wherein the n-type barrier layer is doped with a dopant concentration sufficiently high to achieve greater than 10% ionization of the dopants at the operating temperature of the laser or light emitter below 80 Kelvin.

45. The laser or light emitter of claim 37 further comprising:
a core region, wherein a tunnel junction structure is located within the core region; and
a lateral-current conducting region abutting the core region and abutting the tunnel junction structure on a side of the core region.

46. The laser or light emitter of claim 45 further comprising:
a first lateral-current transporting layer for transporting holes adjacent the p-type barrier layer; and
a first ohmic contact coupled to the first lateral-current transporting layer on a top surface of the first lateral-current transporting layer for transporting holes;
wherein a valence band edge of the p-type barrier layer is closer in energy to that of the quantum well material than the valence band edge of the first lateral-current transporting layer for transporting holes.

47. The laser or light emitter of claim 46 further comprising:
a current blocking region in the lateral-current conducting region for impeding a flow of carriers from the first lateral-current transporting layer for transporting holes in a vertical direction through the single quantum well layer in that lateral-current conduction region and promoting a lateral flow of carriers in that lateral-current conducting region.

48. The laser or light emitter of claim 47:
wherein the current blocking region comprises AlGaAs; or
wherein the current blocking region comprises AlInAs.

49. The laser or light emitter of claim 47:
wherein the current blocking region is lightly n-doped.

50. The laser or light emitter of claim 46 further comprising:
a second lateral-current transporting layer adjacent the n-type barrier layer; and
a second ohmic contact coupled to the second lateral-current transporting layer;

wherein the n-type barrier layer is lower in energy than a conduction band edge of the second lateral-current transporting layer; and wherein the first ohmic contact is closer to the core region than the second ohmic contact.

51. The laser or light emitter of claim 37 further comprising:

a first distributed Bragg reflecting mirror; and a second distributed Bragg reflecting mirror;

wherein the single quantum well layer, the n-type barrier layer, and the p-type barrier layer are located between the first and second distributed Bragg reflecting mirrors.

52. The laser or light emitter of claim 37 wherein:

the single quantum well layer comprises InGaAs;

the p-type barrier layer comprises InGaAs; and the n-type barrier layer comprises InGaAs; or the single quantum well layer comprises GaInAs;

the p-type barrier layer comprises GaInAlAs; and the n-type barrier layer comprises GaInAlAs.

53. The laser or light emitter of claim 39 wherein:

the heavily p-doped layer of the tunnel junction structure comprises GaAs; and the heavily N-doped layer of the tunnel junction structure comprises InGaAs; or the heavily p-doped layer of the tunnel junction structure comprises GaAsSb; and the heavily N-doped layer of the tunnel junction structure comprises GaInAs.

* * * * *